US012719149B2

(12) United States Patent
Youn et al.

(10) Patent No.: US 12,719,149 B2
(45) Date of Patent: Aug. 25, 2026

(54) WIDEBAND ANTENNA OPERABLE FOR MULTIPLE TELECOMMUNICATIONS STANDARDS ARRANGED ON VEHICLE

(71) Applicant: LG ELECTRONICS INC., Seoul (KR)

(72) Inventors: Yeomin Youn, Seoul (KR); Changil Kim, Seoul (KR); Changwon Yun, Seoul (KR); Yongkon Kim, Seoul (KR); Cheolsoo Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 64 days.

(21) Appl. No.: 18/726,689

(22) PCT Filed: Jan. 5, 2022

(86) PCT No.: PCT/KR2022/000147

§ 371 (c)(1),
(2) Date: Jul. 3, 2024

(87) PCT Pub. No.: WO2023/132382

PCT Pub. Date: Jul. 13, 2023

(65) Prior Publication Data

US 2025/0087867 A1 Mar. 13, 2025

(51) Int. Cl.
*H01Q 1/12* (2006.01)
*H01Q 1/32* (2006.01)
(Continued)

(52) U.S. Cl.
CPC ........... *H01Q 1/1271* (2013.01); *H01Q 1/325* (2013.01); *H01Q 1/38* (2013.01); *H05K 1/0243* (2013.01); *H05K 2201/10098* (2013.01)

(58) Field of Classification Search
CPC ........ H01Q 1/1271; H01Q 1/325; H01Q 1/38; H01Q 1/3275; H01Q 1/362; H01Q 5/321;
(Continued)

(56) References Cited

U.S. PATENT DOCUMENTS

2012/0154236 A1* 6/2012 Apostolos ................ H01Q 1/32 333/204
2016/0064807 A1 3/2016 Reed et al.
(Continued)

FOREIGN PATENT DOCUMENTS

KR 10-2021-0109034 A 9/2021

*Primary Examiner* — Dimary S Lopez Cruz
*Assistant Examiner* — Anna N Hamadyk
(74) *Attorney, Agent, or Firm* — Birch, Stewart, Kolasch & Birch, LLP

(57) ABSTRACT

An antenna module mounted on a vehicle, and including a first radiator structure including a top conductive pattern and first and second side conductive patterns extending from both end portions of the top conductive pattern; a second radiator structure connected to the top conductive pattern, including a plurality of connected conductive patterns and forming a helical structure having first to fourth side surfaces, and configured to operate in a second frequency band and a third frequency band that are higher than a first frequency band; and a third radiator structure including a conductive pattern spaced from the second radiator with a dielectric substrate disposed between the second radiator structure and the third radiator structure and configured to operate in a fourth frequency band higher than the third frequency band; and a feeder including a first feed line feeding a first signal to the first and second radiator structures, and including a second feed line feeding a second signal to the third radiator structure. Further, in the first frequency band, the first structure generates a first electric field distribution from the top conductive pattern and first and second side conductive patterns, and the second radiator (Continued)

structure generates a second electric field distribution from the conductive patterns of the helical structure formed on the second side surface of the second radiator structure to generate the first frequency band, and in the second frequency band, the second radiator structure generates third electric field distributions of the conductive patterns of the helical structure formed on the first side surface and the third side surface of the second radiator structure to generate the second frequency band.

10 Claims, 35 Drawing Sheets

(51) Int. Cl.
*H01Q 1/38* (2006.01)
*H05K 1/02* (2006.01)

(58) Field of Classification Search
CPC ............ H01Q 5/335; H01Q 5/50; H01Q 9/36; H01Q 21/28; H01Q 21/30; H01Q 1/32; H01Q 1/36; H01Q 5/20; H05K 1/0243; H05K 2201/10098
See application file for complete search history.

(56) References Cited

U.S. PATENT DOCUMENTS

2017/0294714 A1 10/2017 Lindenmeier et al.
2023/0178881 A1* 6/2023 Lee ........................ H01Q 1/362

* cited by examiner (a)

(b)

(a)

(a)

(b)

(a)

(b)

(a)

(b)

(a)

(b)

| V2X | Front zone | Rear zone | Side zone R | Side zone L |
|---|---|---|---|---|
| Target | -6.0 | -6.0 | -9.0 | -9.0 |
| 760 MHz | -3.73 | -3.60 | -4.55 | -5.18 |
| 2.55 GHz | -5.21 | -0.92 | -4.87 | -3.72 |
| 5.98 GHz | 0.51 | -0.32 | -0.19 | 0.94 |
| 7.05 GHz | -2.54 | -2.28 | -5.10 | -4.02 |

WIDEBAND ANTENNA OPERABLE FOR MULTIPLE TELECOMMUNICATIONS STANDARDS ARRANGED ON VEHICLE

CROSS-REFERENCE TO RELATED APPLICATIONS

This application is the National Stage filing under 35 U.S.C. § 371 of International Application No. PCT/KR2022/000147, filed on Jan. 5, 2022, which is hereby expressly incorporated by reference into the present application.

TECHNICAL FIELD

This specification relates to a broadband antenna disposed on a vehicle. One particular implementation relates to an antenna module having a broadband antenna that is capable of operating in various communication systems, and to a vehicle having the same.

BACKGROUND ART

A vehicle may perform wireless communication services with other vehicles or nearby objects, infrastructures, or a base station. In this regard, various communication services may be provided using Long Term Evolution (LTE) communication, 5G communication, or WiFi communication technology.

In order to provide these various wireless communication services in a vehicle, an antenna may be disposed on a glass of the vehicle, above or below a roof of the vehicle. When the antenna is disposed on the glass of the vehicle, it may be implemented with a transparent antenna material. Meanwhile, when the antenna is disposed above or below the roof of the vehicle, an effect on a vehicle body and the roof of the vehicle may cause a change in antenna performance.

However, there is a problem in that a vehicle body and a vehicle roof are formed of a metallic material that can block radio waves. Accordingly, a separate antenna structure may be disposed on a top of the vehicle body or the vehicle roof. Or, when the antenna structure is disposed on a bottom of the vehicle body or roof, a portion of the vehicle body or roof corresponding to a region where the antenna structure is disposed may be formed of a non-metallic material.

Meanwhile, in order to provide V2X communication services in a vehicle, a V2X communication antenna needs to be provided in the vehicle. In relation to these V2X communication services, the vehicle V2X antenna needs to be configured to operate in a 5.9 GHz band and a 7 GHz band in addition to a 760 GHz band. Existing antenna elements are implemented as resonance antenna elements with a limited bandwidth, so there is a problem in that bandwidth characteristics are limited.

In addition, a vehicle antenna needs to form an antenna beam within a predetermined angle range in a horizontal direction rather than a vertical direction. The antenna beam pattern formed within a predetermined angle range in the horizontal direction can be referred to as a low elevation beam pattern. However, there is a problem in that no specific structure for configuring the antenna element has been proposed to implement such a low elevation beam pattern.

SUMMARY

Accordingly, one aspect of the present disclosure is directed to solving the aforementioned problems and other draw backs.

Another aspect of the present disclosure is to provide a broadband antenna element that is disposed on a vehicle and is capable of operating as a broadband antenna.

Still another aspect of the present disclosure is to provide a broadband antenna element that is disposed on a vehicle and is capable of providing a broadband V2X communication service.

Another aspect of the present disclosure is to provide an antenna module for a vehicle, supporting NR V2X, which supports a high data transmission rate with a wide bandwidth in 3GPP Release 16.

Another aspect of the present disclosure is to provide an antenna module for a vehicle, supporting NR V2X, which can cover up to a frequency band that can be considered in 3GPP Release 17.

Another aspect of the present disclosure is to provide an antenna structure that is disposed on a vehicle and is capable of implementing a low elevation beam pattern.

Another aspect of the present disclosure is to provide broadband V2X antennas for a vehicle that transmit and receive data to and from everything around the vehicle so as to provide various services such as accident suppression, improved driving convenience, and increased fuel efficiency.

Another aspect of the present disclosure is to maintain a low elevation beam pattern while securing a certain level of antenna performance even in the case where the exterior of a vehicle body or roof is made of a metallic material.

Another aspect of the present disclosure is to improve antenna performance of an antenna system while maintaining a height of the antenna system at a certain level or less and securing a low elevation beam pattern.

Another aspect of the present disclosure is to provide a structure for mounting an antenna system, which is capable of operating in a wide frequency band to support various communication systems, to a vehicle.

To achieve these and other advantages and in accordance with the purpose of this specification, as embodied and broadly described herein, there is provided an antenna module mounted on a vehicle. The antenna module may include: a first radiator structure that includes a top conductive pattern and first and second side conductive patterns extending from both end portions of the top conductive pattern; and a second radiator structure that is connected to the top conductive pattern, has a plurality of conductive patterns connected to one another to form first to fourth side surfaces, and operates in a second frequency band and a third frequency band higher than a first frequency band, wherein the second radiator structure has helical lines disposed on first to fourth side surfaces of a dielectric structure.

In an embodiment, the antenna module may further include a third radiator structure that includes a conductive pattern connected to a feeder through a via hole and is configured to operate in a fourth frequency band higher than the third frequency band. The first radiator structure and the second radiator structure may be configured to operate in the first frequency band by the helical lines.

In an embodiment, the second radiator structure may include an upper branch connected to one end portion of the top conductive pattern and a lower branch connected to the feeder. The second radiator structure may operate as a helical radiator formed on the first to fourth side surfaces by the upper branch, the conductive patterns disposed between the upper branch and the lower branch, and the lower branch.

In an embodiment, the antenna module may further include a dielectric structure that is configured to support the top conductive pattern and the first and second side patterns of the first radiator structure and to support the plurality of conductive patterns of the second radiator structure.

In an embodiment, the second radiator structure may include: a first conductive pattern that is connected to one end portion of the top conductive pattern and forms the upper branch; a second conductive pattern that has one end portion connected to the first conductive pattern and another end portion bent; and a third conductive pattern that has one end portion connected to the another end portion of the second conductive pattern, and another end portion connected to one end portion of the lower branch. The second radiator structure may further include a fourth conductive pattern that has one end portion connected to the another end portion of the third conductive pattern, and another end portion bent and disposed on a dielectric substrate, and a fifth conductive pattern that extends from a point on one side of the fourth conductive pattern.

In an embodiment, a portion of the second conductive pattern, a portion of the third conductive pattern, and a portion of the fifth conductive pattern may be disposed on the first side surface to face the first conductive pattern.

In an embodiment, a gap between a bottom of the third conductive pattern and a top of the fifth conductive pattern disposed on the first side surface may be set to 1.0 mm or less, such that the second radiator structure operates in the second frequency band.

In an embodiment, a bottom of the third conductive pattern and a top of the fifth conductive pattern disposed on the first side surface may form an interdigital structure in which a concave structure and a convex structure are complementarily disposed, such that the second radiator structure operates in the second frequency band.

In an embodiment, a bottom of the second conductive pattern and a top of the fifth conductive pattern disposed on the second side surface adjacent to the first side surface may form an interdigital structure in which a concave structure and a convex structure are complementarily disposed, such that the second radiator structure operates in the second frequency band.

In an embodiment, a first sub-pattern of the first conductive pattern and a second sub-pattern of the fourth conductive pattern may form the upper branch and the lower branch, respectively, on the second side surface adjacent to the first side surface. A second sub-pattern of the first conductive pattern, a second sub-pattern of the second conductive pattern, and a first sub-pattern of the fourth conductive pattern may be disposed in parallel on the second side surface. A third sub-pattern of the second conductive pattern and a first sub-pattern of the fifth conductive pattern may be disposed in parallel in an interdigital structure in which a concave structure and a convex structure are disposed complementarily on the second side surface.

In an embodiment, the first frequency band may be a 760 MHz band, the second frequency band may be a 2.6 GHz band, which is an n38 band, the third frequency band may be a 5.9 GHz band, which is an n47 band, and the fourth frequency band may be a 7 GHz band. A first antenna module by the first radiator structure to the third radiator structure may operate as a first antenna for V2X communication. The first antenna may be configured to receive and transmit signals of the first to fourth frequency bands.

In an embodiment, the antenna module may further include a second antenna module that has the first to third radiator structures and is configured to perform the V2X communication, and the second antenna module may operate as a second antenna for the V2X communication. The first antenna module may be disposed on a top region of one side of a PCB mounted on the vehicle, and the second antenna module is disposed on a bottom region of another side of the PCB.

In an embodiment, the antenna module may further include: a first dielectric substrate on which an end portion of the second radiator structure constituting a lower branch is disposed; and a second dielectric substrate that is disposed below the first dielectric substrate, and configured such that the conductive pattern disposed on a rear surface thereof is connected to the feeder disposed on a front surface through the via hole.

In an embodiment, the conductive patterns of the third radiator structure may include: a first conductive pattern that has a first width and a first length; and a second conductive pattern that is formed perpendicular to the first conductive pattern and has a second width and a second length. The conductive pattern constituted by the first conductive pattern and the second conductive pattern may operate as a radiator in a 7 GHz band, which is the fourth frequency band.

In an embodiment, the antenna module may further include an impedance matching part that is disposed between one end portion of the first conductive pattern and a via pad connected to the via hole. The impedance matching part may include a resistor, an inductor, a capacitor, or a combination thereof.

In an embodiment, feed lines of the feeder may include: a first feed line that feeds a first signal to an end portion of a lower branch of the second radiator structure; and a second feed line that feeds a second signal to the conductive pattern of the third radiator structure.

In an embodiment, the first antenna and the second antenna may form low elevation beam patterns at a certain angle in a vertical direction relative to a horizontal plane in the first to fourth frequency bands. The first antenna and the second antenna may form omni-directional beam patterns in a horizontal direction when both the first antenna and the second antenna operate.

A vehicle having an antenna module according to another aspect of the present disclosure may include: an antenna module that is disposed below a roof of the vehicle; and a processor that is disposed inside or outside the antenna module, and configured to communicate with at least one of an adjacent vehicle, a road side unit (RSU), and a base station. The antenna module may include: a first radiator structure that has a top conductive pattern and first and second side conductive patterns extending from both end portions of the top conductive pattern; and a second radiator structure that is connected to the top conductive pattern, has a plurality of conductive patterns connected to one another to form first to fourth side surfaces, and operates in a second frequency band and a third frequency band higher than a first frequency band, wherein the second radiator structure has helical lines disposed on first to fourth side surfaces of a dielectric structure.

In an embodiment, the antenna module may include: a first antenna that is disposed on a top region of one side of a PCB mounted on the vehicle and has the first to third radiator structures; and a second antenna that is disposed on a bottom region of another side of the PCB and has the first to third radiator structures.

In an embodiment, the vehicle or the antenna module may further include a processor that controls a diversity operation for V2X communication to be performed in the first frequency band through the first antenna and the second antenna. The processor may control a diversity operation for V2X communication to be performed in the second frequency band or the third frequency band higher than the first frequency band through the first antenna and the second antenna.

Advantageous Effects of Invention

The technical effects of an antenna module having a broadband antenna element mounted on a vehicle and a vehicle equipped with the antenna module will be described as follows.

According to the present disclosure, a broadband antenna structure having a plurality of radiator structures in top, side, and bottom regions can be provided that is mounted on a vehicle and can operate as a broadband antenna.

According to the present disclosure, a broadband antenna structure that has helical lines and is disposed in a vehicle can be proposed to provide a broadband V2X communication service in the vehicle.

According to the present disclosure, an antenna module for a vehicle can be provided, which supports NR V2X supporting n38 and n47 having a high data transmission rate with a wide bandwidth in 3GPP Release 16.

According to the present disclosure, an antenna module for a vehicle can be provided that supports NR V2X with a frequency coverage up to a 7 GHz band that can be considered in 3GPP Release 17.

According to the present disclosure, an antenna structure for a vehicle, in which a ground pattern is disposed in a bottom region of an antenna pattern to implement a low elevation beam pattern, can be provided.

According to the present disclosure, a broadband antenna element can be provided that has a high antenna gain while operating as a broadband antenna, by implementing antenna elements on a PCB and a separate antenna substrate, which is capable of optimizing antenna performance.

According to the present disclosure, a low elevation beam pattern can be maintained while securing a certain level of antenna performance even in the case where the exterior of a vehicle body or roof is made of a metallic material.

According to the present disclosure, a diversity operation can be implemented and simultaneously isolation between antennas can be improved through broadband V2X antennas for a vehicle for suppressing accidents, improving driving convenience, and improving fuel efficiency.

According to the present disclosure, a structure for mounting an antenna system capable of operating in a wide band on a vehicle to support various communication systems can be provided.

Further scope of applicability of the present disclosure will become apparent from the foregoing detailed description. It should be understood, however, that the detailed description and specific examples, such as the preferred embodiment of the present disclosure, are given by way of illustration only, since various modifications and alternations within the spirit and scope of the disclosure will be apparent to those skilled in the art.

DETAILED DESCRIPTION

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. A suffix "module" or "unit" used for elements disclosed in the following description is merely intended for easy description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another. It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

An antenna system described herein may be mounted on a vehicle. Configurations and operations according to implementations may also be applied to a communication system, namely, antenna system mounted on a vehicle. In this regard, the antenna system mounted in the vehicle may include a plurality of antennas, and a transceiver circuit and a processor that control the plurality of antennas.

Figure 1A:
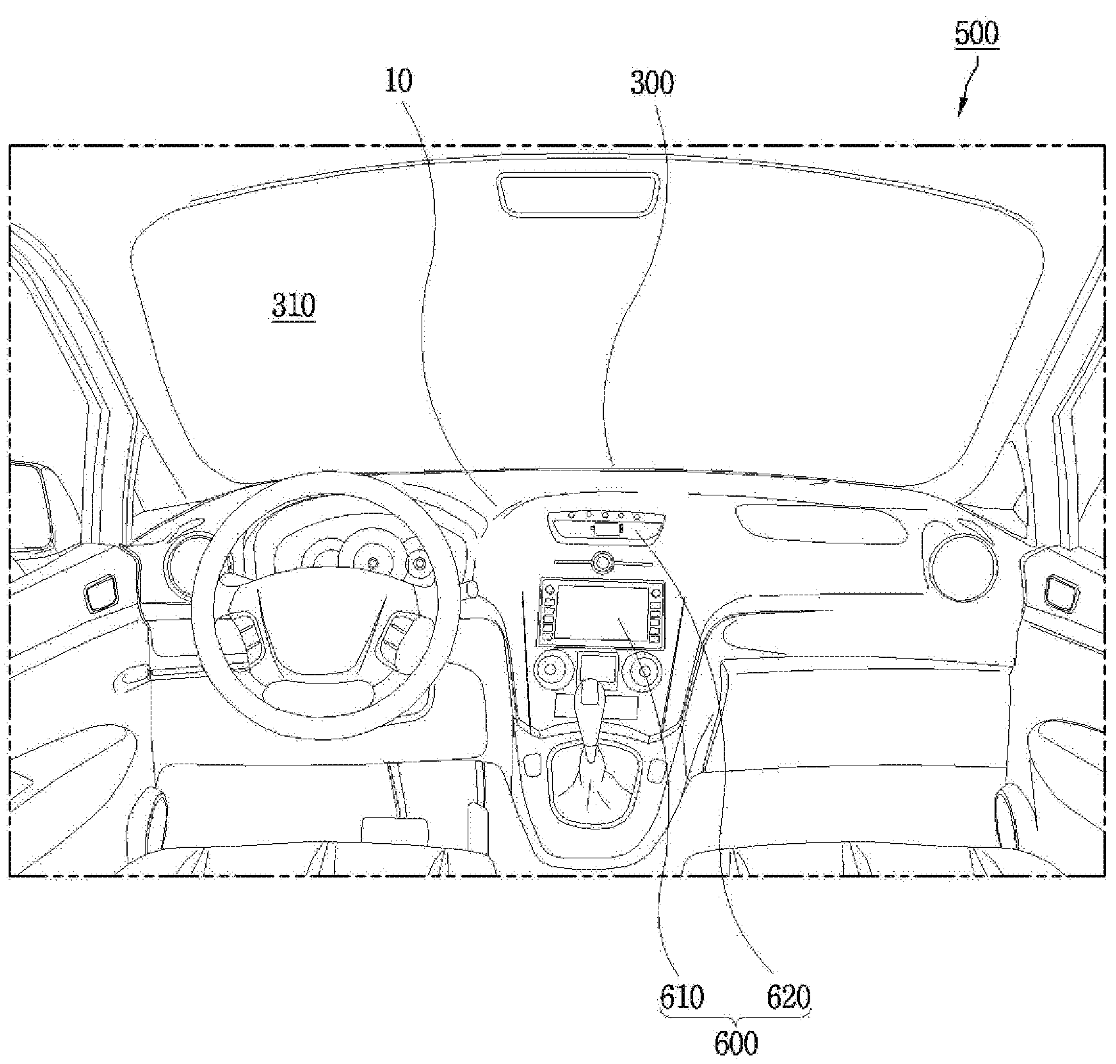
FIG. 1A is a diagram illustrating an internal configuration of a vehicle in accordance with one example.
Figure 1B:
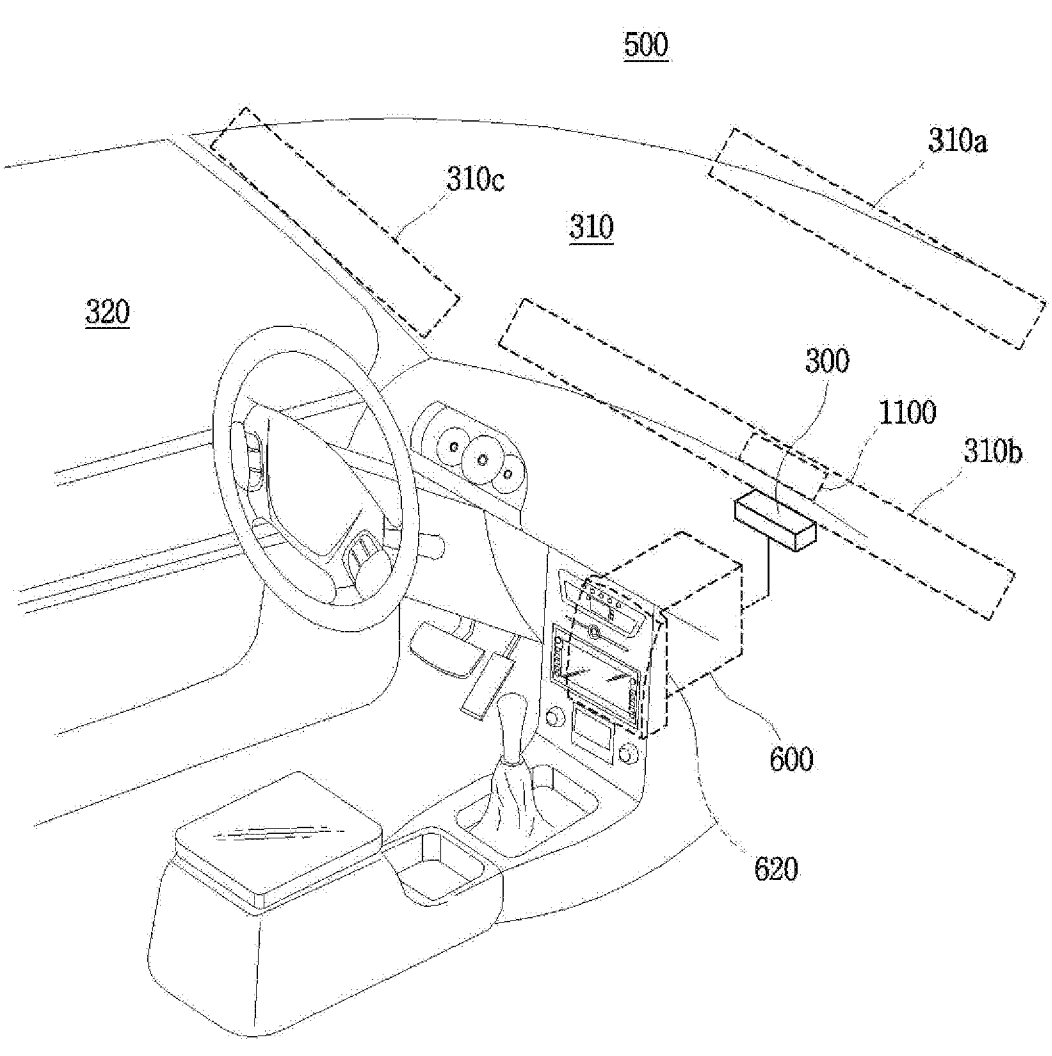
FIG. 1B is a lateral view illustrating the vehicle interior in accordance with the one example.

FIG. 1A is a diagram illustrating a vehicle interior in accordance with one example, and FIG. 1B is a lateral view illustrating the vehicle interior in accordance with the one example. As illustrated in FIGS. 1A and 1B, the present disclosure describes an antenna unit (i.e., an internal antenna system) 1000 capable of transmitting and receiving signals through GPS, 4G wireless communication, 5G wireless communication, Bluetooth, or wireless LAN. Therefore, the antenna unit (i.e., the antenna system) 1000 capable of supporting these various communication protocols may be referred to as an integrated antenna module 1000. The antenna system 1000 may include a telematics control unit (TCU) 300 and an antenna assembly 1100. For example, the antenna assembly 1100 may be disposed on a window of a vehicle.

The present disclosure also describes a vehicle 500 having the antenna system 1000. The vehicle 500 may include a dashboard and a housing 10 including the telematics control unit (TCU) 300, and the like. In addition, the vehicle 500 may include a mounting bracket for mounting the telematics control unit (TCU) 300.

The vehicle 500 may include the telematics control unit (TCU) 300 and an infotainment unit 600 configured to be connected to the telematics control unit 300. A portion of a front pattern of the infotainment unit 600 may be implemented in the form of a dashboard of the vehicle. A display 610 and an audio unit 620 may be included in the dashboard of the vehicle.

The antenna assembly 1100, namely, the antenna module 1100 in the form of a transparent antenna may be disposed at at least one of an upper region 310*a*, a lower region 310*b*, and a side region 310*c* of a front window 310. The antenna assembly 1100 may also be disposed at a side window 320, which is disposed at a side surface of the vehicle, in addition to the front window 310.

As illustrated in FIG. 1B, when the antenna assembly 1100 is disposed at the lower region 310*b* of the front window 310, it may be operably coupled to a TCU 300 disposed inside the vehicle. When the antenna assembly 1100 is disposed at the upper region 310*a* or the side region 310*c* of the front window 310, it may be operably coupled to a TCU disposed outside the vehicle. However, the present disclosure may not be limited to the TCU coupling configuration inside or outside the vehicle.

V2X (Vehicle-to-Everything)

V2X communication may include communications between a vehicle and all entities, such as V2V (Vehicle-to-Vehicle) which refers to communication between vehicles, V2I (Vehicle-to-Infrastructure) which refers to communication between a vehicle and an eNB or RSU (Road Side Unit), V2P (Vehicle-to-Pedestrian) which refers to communication between a vehicle and a terminal possessed by a person (pedestrian, cyclist, vehicle driver, or passenger), V2N (vehicle-to-network), and the like. V2X communication may have the same meaning as V2X sidelink or NR V2X or may have, in a broader sense, a meaning including V2X sidelink or NR V2X.

V2X communication can be applied to various services, for example, forward collision warning, an automatic parking assist system, cooperative adaptive cruise control (CACC), control-loss warning, traffic queuing warning, safety warning, traffic vulnerable-area safety warning, emergency vehicle warning, curved-road driving speed warning, and traffic flow control.

V2X communication may be provided through a PC5 interface and/or a Uu interface. In this case, specific network entities for supporting communications between a vehicle and all entities may exist in a wireless communication system supporting V2X communication. For example, the network entity may include a base station (eNB), a Road Side Unit (RSU), a terminal, or an application server (e.g., a traffic safety server).

In addition, a terminal performing V2X communication may refer to not only a general handheld UE but also a vehicle (V-UE), a pedestrian UE, an RSU of an eNB type, an RSU of a UE type, a robot equipped with a communication module, and the like. V2X communication may be performed directly between terminals or may be performed through the network entity (entities). V2X operation modes may be classified according to a method of performing such V2X communication.

Terms used in V2X communication may be defined as follows.

A Road Side Unit (RSU) is a V2X service enabled device that can transmit and receive data to and from a moving vehicle using V2I service. The RSU also serves as a stationary infrastructure entity that supports V2X application programs, and may exchange messages with other entities that support V2X application programs. The RSU is a term frequently used in existing ITS specifications, and the reason for introducing this term to the 3GPP specifications is to make the documents easier to read for the ITS industry. The RSU is a logical entity that combines a V2X application logic with the functionality of an eNB (referred to as an eNB-type RSU) or a UE (referred to as a UE-type RSU).

V2I Service is a type of V2X service, where one party is a vehicle whereas the other party is an entity belonging to infrastructure. A V2P Service is a type of V2X service, where one party is a vehicle whereas the other party is an entity belonging to an infrastructure. A V2X Service is a type of 3GPP communication service that involves a transmitting or receiving device on a vehicle. The V2X service may further be divided into a V2V service, a V2I service, and a V2P service according to which partner is involved in communication for the V2X service.

V2X enabled UE is a UE that supports V2X service. The V2V Service is a type of V2X service, where both parties involved in communication are vehicles. V2V communication range is a direct communication range between two vehicles involved in the V2V service.

Figure 2A:
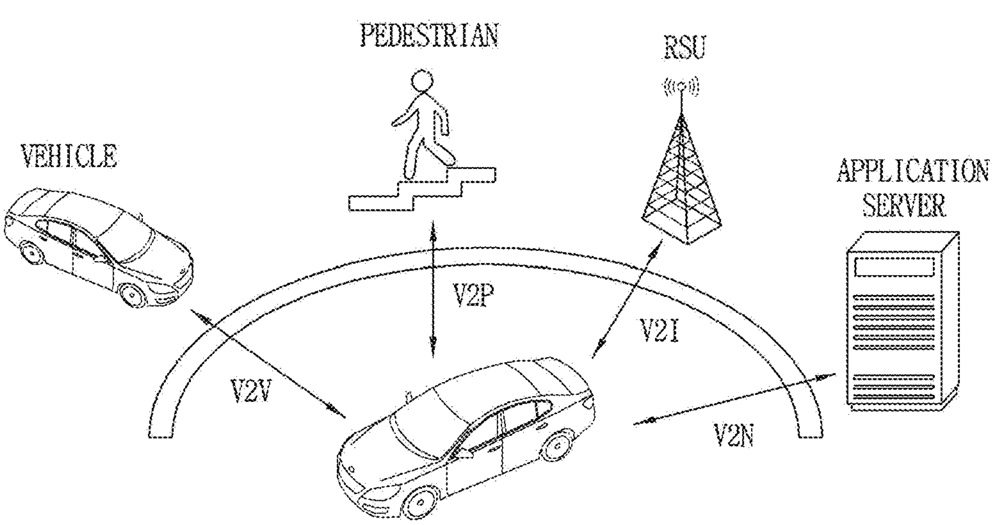
FIG. 2A illustrates types of V2X applications.

Four types of V2X applications called Vehicle-to-Everything (V2X), as described above, include (1) vehicle-to-vehicle (V2V), (2) vehicle-to-infrastructure (V2I), (3) vehicle-to-network (V2N), (4) vehicle-to-pedestrian (V2P). FIG. 2A illustrates types of V2X applications. Referring to FIG. 2A, the four types of V2X applications may use "cooperative awareness" to provide more intelligent services for end-users.

This means that, in order to provide more intelligent information, such as cooperative collision warning or autonomous traveling, entities, such as vehicles, roadside-based facilities, application servers and pedestrians, may collect knowledge of involved local environments (e.g., information received from nearby vehicles or sensor equipment) to process and share the corresponding knowledge.

NR V2X

In 3GPP Releases 14 and 15, support of the V2V and V2X services in LTE has been introduced in order to extend the 3GPP platform to the automotive industry.

Requirements for support of enhanced V2X use cases are largely organized into four use case groups.

(1) Vehicles Platooning enables the vehicles to dynamically form a platoon traveling together. All the vehicles in the platoon obtain information from the leading vehicle to manage this platoon. These information allow the vehicles to drive closer than normal in a coordinated manner, going to the same direction and traveling together.

(2) Extended Sensors enable the exchange of raw or processed data gathered through local sensors or live video images among vehicles, road site units, devices of pedestrians and V2X application servers. The vehicle can recognize an environment much more than through detection by its sensor and can recognize a local situation as a whole in a more extensive manner. A high data transmission rate is one of primarily features of the extended sensor.

(3) Advanced Driving enables semi-automatic or fully-automatic driving. The advanced driving enables each vehicle and/or each RSU to share self-recognition data obtained from a local sensor with a nearby vehicle and to synchronize and adjust a trajectory or a maneuver. Each vehicle shares its intention to drive with a nearby vehicle.

(4) Remote driving serves to enable a remote driver or a V2X application program to drive a remotely-located vehicle in a dangerous environment by him/herself or itself or instead of an occupant who cannot drive the remotely-located vehicle. In a case where a traffic environment is limitedly changed and a vehicle driving path is predictable such as in public transportation, driving based on cloud computing may be available. High reliability and low latency are main requirements for the remote driving.

A description to be given below may be applicable to all of NR SL (sidelink) and LTE SL, and when no radio access technology (RAT) is indicated, the NR SL is meant. Six operational scenarios considered in NR V2X may be considered as follows. In this regard, FIG. 2B illustrates a standalone scenario supporting V2X SL communication and an MR-DC scenario supporting V2X SL communication.

In particular, 1) in Scenario 1, gNB provides control/configuration for UE's V2X communication in both LTE SL and NR SL. 2) In Scenario 2, ng-eNB provides control/configuration for UE's V2X communication in both LTE SL and NR SL. 3) In Scenario 3, eNB provides control/configuration for UE's V2X communication in both LTE SL and NR SL. On the other hand, 4) in Scenario 4, the UE's V2X communication in the LTE SL and the NR SL is controlled/configured by Uu while the UE is configured with EN-DC. 5) In Scenario 5, the UE's V2X communication in the LTE SL and the NR SL is controlled/configured by Uu while the UE is configured in NE-DC. 6) In Scenario 6, the UE's V2X communication in the LTE SL and the NR SL is controlled/configured by Uu while the UE is configured in NGEN-DC.

Figure 2B:
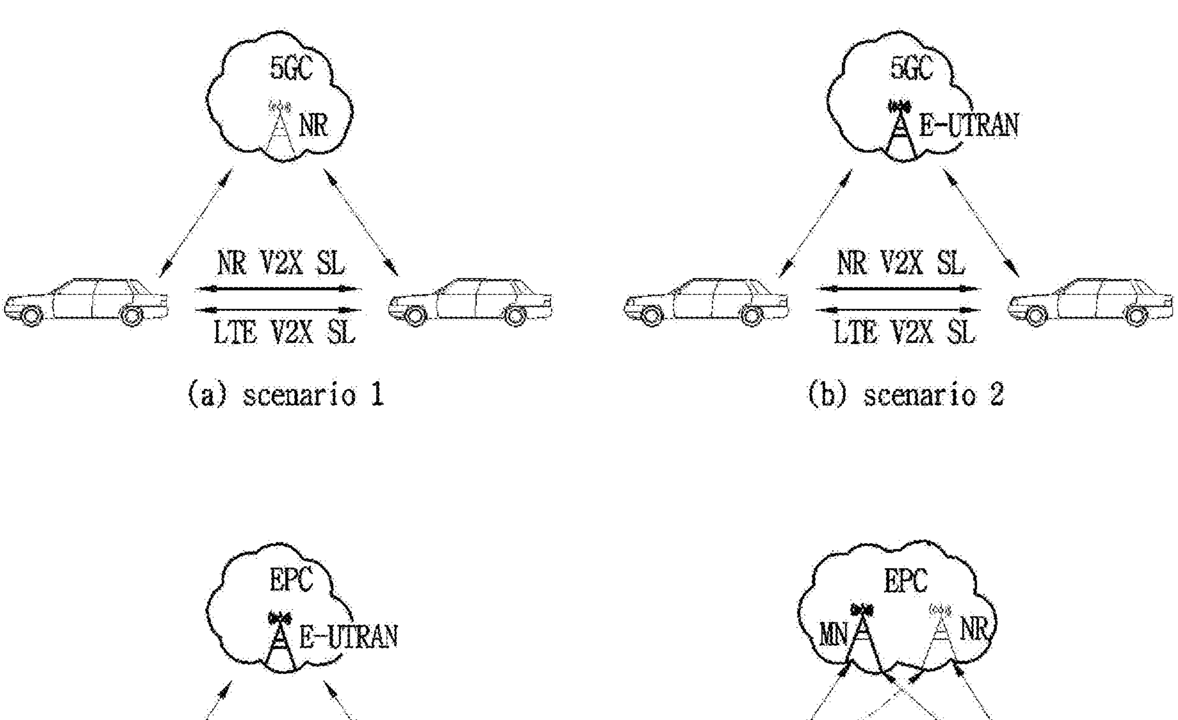
FIG. 2B illustrates a standalone scenario supporting V2X SL communication and an MR-DC scenario supporting V2X SL communication.
Figure 2B:
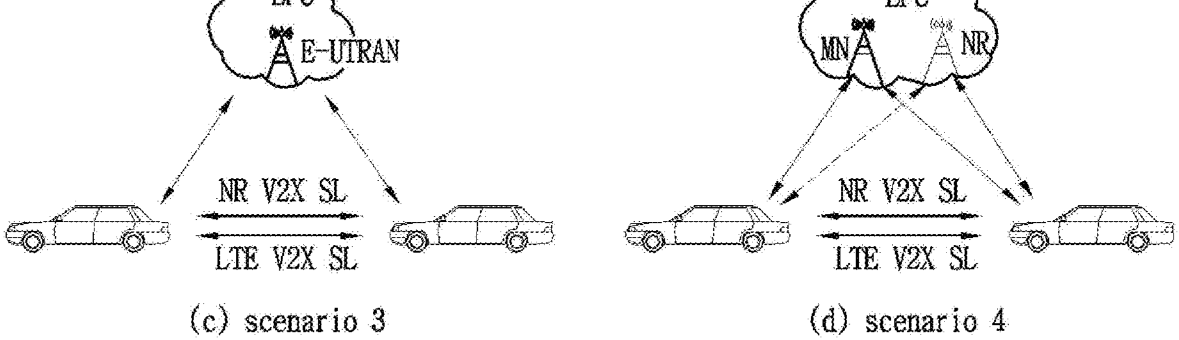
Figure 2B:
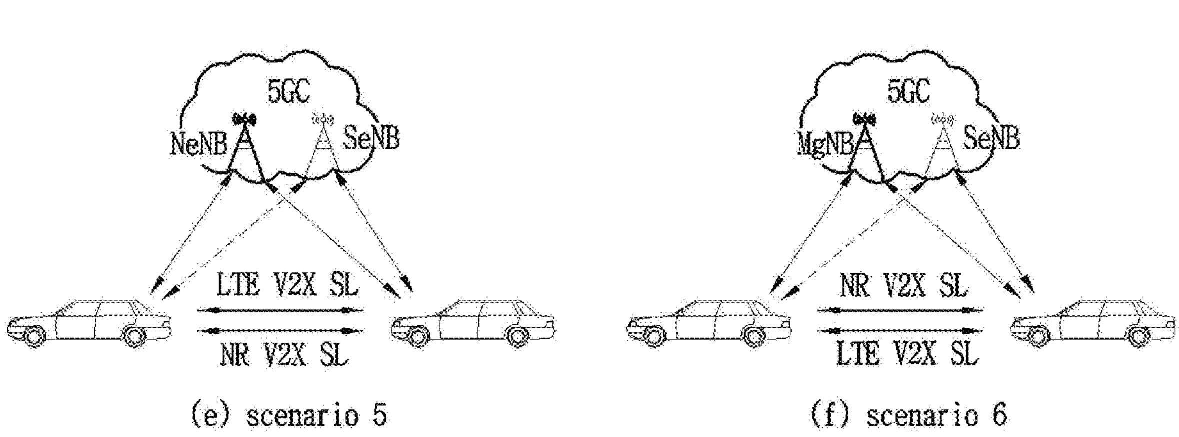

In order to support the V2X communication, as illustrated in FIGS. 2A and 2B, the vehicle may perform wireless communication with eNB and/or gNB through an antenna system. The antenna system may be configured as an internal antenna system as illustrated in FIGS. 1A and 1B. The antenna system may alternatively be implemented as an external antenna system and/or an internal antenna system as illustrated in FIGS. 3A to 3C.

Figure 3A:
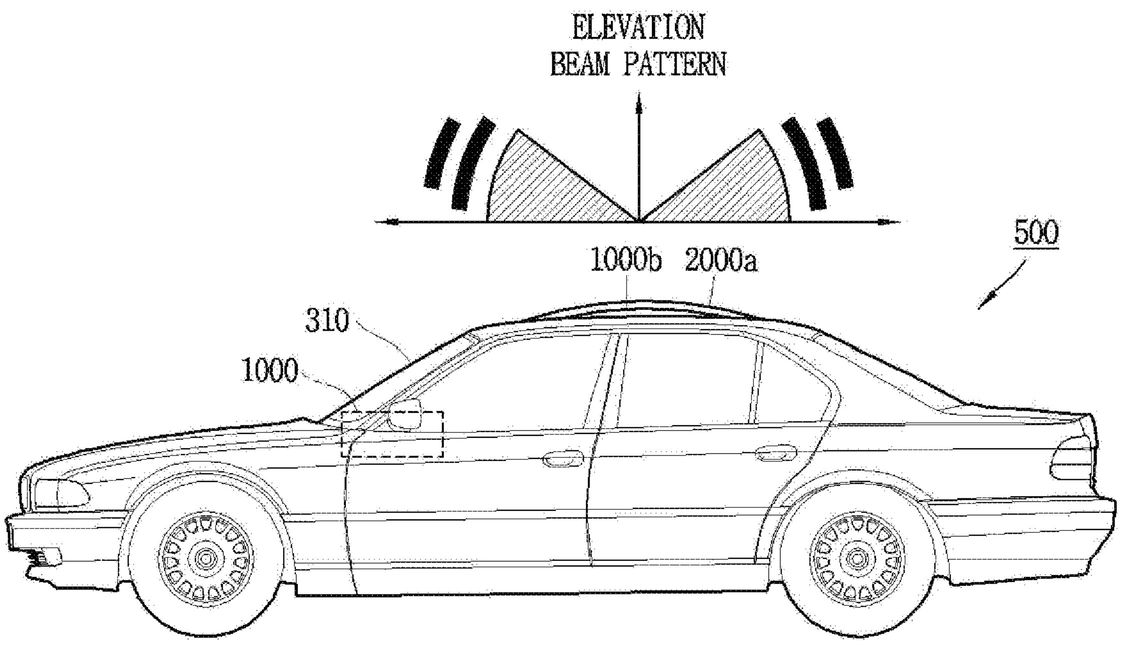
FIGS. 3A to 3C are views illustrating a structure for mounting an antenna system in a vehicle, to which the antenna system is mounted.
Figure 3B:
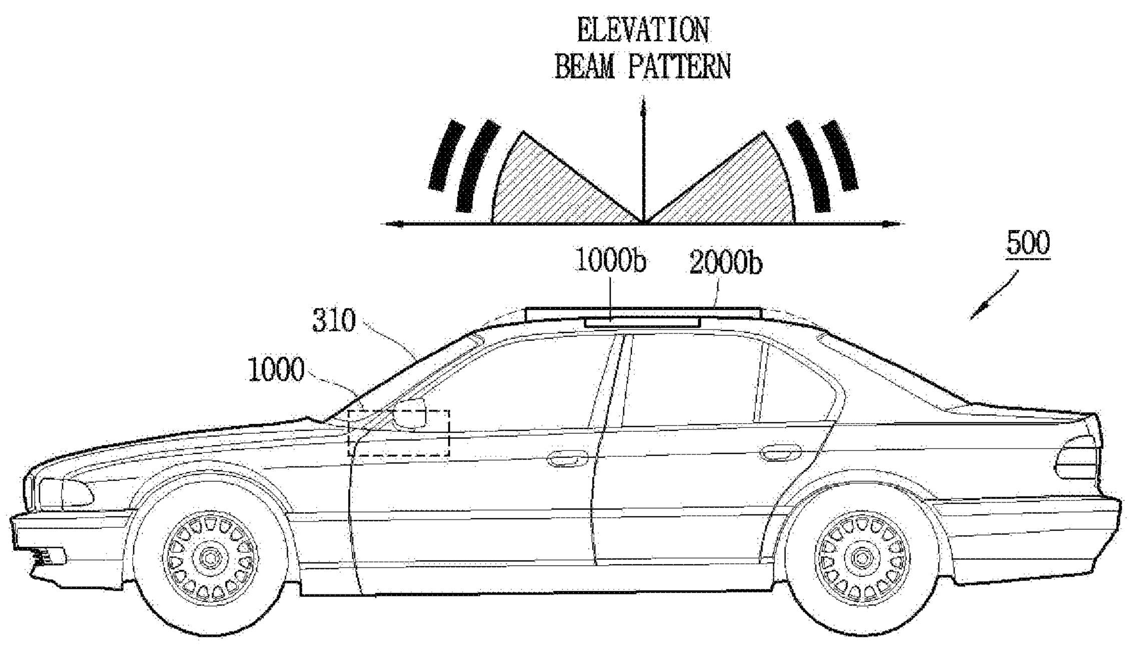
Figure 3C:
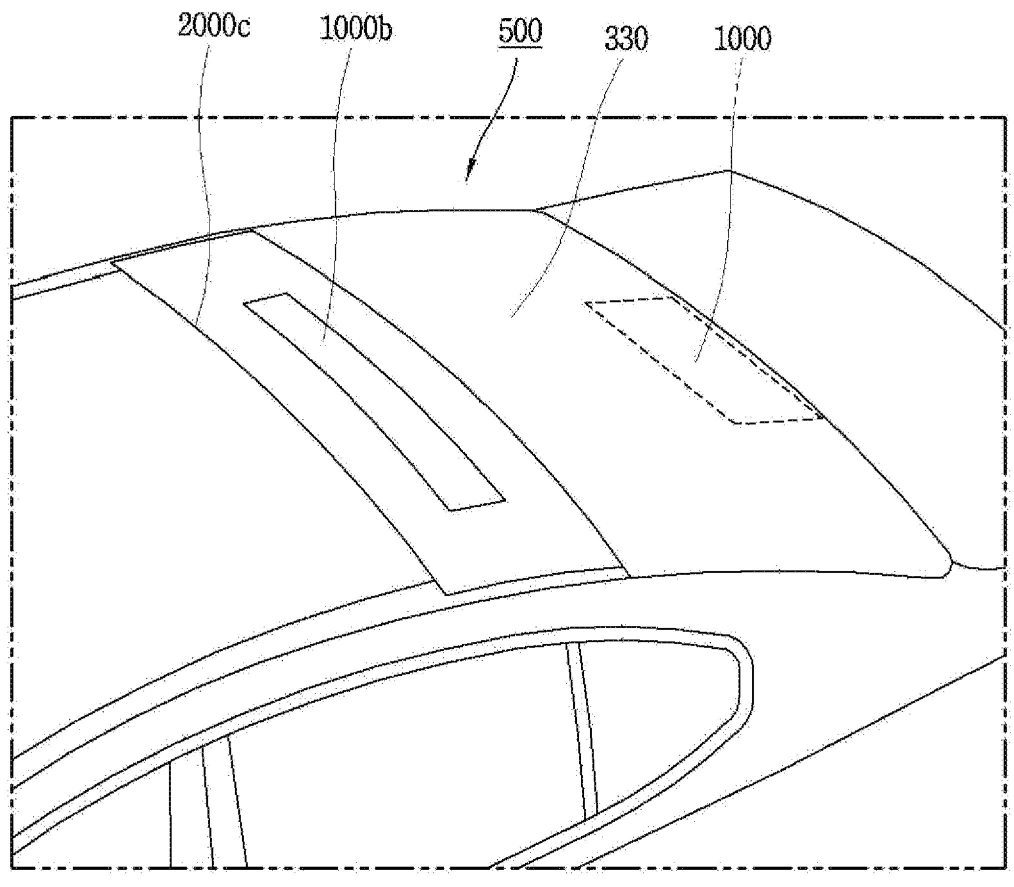

FIGS. 3A to 3C are views illustrating an example of a structure for mounting an antenna system on a vehicle, which includes the antenna system mounted on the vehicle. In this regard, FIGS. 3A to 3C illustrate a configuration capable of performing wireless communication through a transparent antenna disposed on the front window 310 of the vehicle. An antenna system 1000 including a transparent antenna may be disposed on a front window of a vehicle and inside the vehicle. Wireless communication may also be performed through a transparent antenna disposed on a side glass of the vehicle, in addition to the front window.

The antenna system for the vehicle that includes the transparent antenna can be combined with other antennas. Referring to FIGS. 3A to 3C, in addition to the antenna system 1000 implemented as the transparent antenna, a separate antenna system 1000*b* may be further configured. FIGS. 3A and 3B illustrate a structure in which the antenna system 1000*b*, in addition to the antenna system 1000, is mounted on or in a roof of the vehicle. On the other hand, FIG. 3C illustrates a structure in which the separate antenna system 1000*b*, in addition to the antenna system 1000, is mounted in a roof frame of a roof and a rear mirror of the vehicle.

Referring to FIGS. 3A to 3C, in order to improve the appearance of the vehicle and to maintain a telematics performance at the time of collision, an existing shark fin antenna may be replaced with a flat antenna of a non-protruding shape. In addition, the present disclosure proposes an integrated antenna of an LTE antenna and a 5G antenna considering fifth generation (5G) communication while providing the existing mobile communication service (e.g., LTE).

Referring to FIG. 3A, the antenna system 1000 implemented as the transparent antenna may be disposed on the front window 310 of the vehicle and inside the vehicle. The second antenna system 1000*b* corresponding to an external antenna may be disposed on the roof of the vehicle. In FIG. 3A, a radome 2000*a* may cover the second antenna system 1000*b* to protect the second antenna system 1000*b* from an external environment and external impacts while the vehicle travels. The radome 2000*a* may be made of a dielectric material through which radio signals are transmitted/received between the second antenna system 1000*b* and a base station.

Referring to FIG. 3B, the antenna system 1000 implemented as the transparent antenna may be disposed on the front window 310 of the vehicle and inside the vehicle. One the other hand, the second antenna system 1000*b* corresponding to the external antenna may be disposed within a roof structure of the vehicle and at least part of the roof structure 2000*b* may be made of a non-metallic material. At this time, the roof structure 2000*b* of the vehicle except for the at least part made of the non-metallic material may be made of a dielectric material through which radio signals are transmitted/received between the antenna system 1000*b* and the base station.

Referring to FIG. 3C, the antenna system 1000 implemented as the transparent antenna may be disposed on the rear window 330 of the vehicle and inside the vehicle. The second antenna system 1000*b* corresponding to the external antenna may be disposed within the roof frame 2000*c* of the vehicle, and at least part of the roof frame 2000*c* may be made of a non-metallic material. At this time, the roof frame 2000*c* of the vehicle 500 except for the at least part made of the non-metallic material may be made of a dielectric material through which radio signals are transmitted/received between the second antenna system 1000*b* and the base station.

Referring to FIGS. 3A to 3C, antennas provided in the antenna system 1000 mounted on the vehicle may form a beam pattern in a direction perpendicular to the front window 310 or the rear window 330. Antenna provided in the second antenna system 1000 mounted on the vehicle may further define a beam coverage by a predetermined angle in a horizontal region with respect to the vehicle body. Meanwhile, the vehicle 500 may include only the antenna unit (i.e., the internal antenna system) 1000 corresponding to the internal antenna without the antenna system 1000*b* corresponding to the external antenna.

Figure 4:
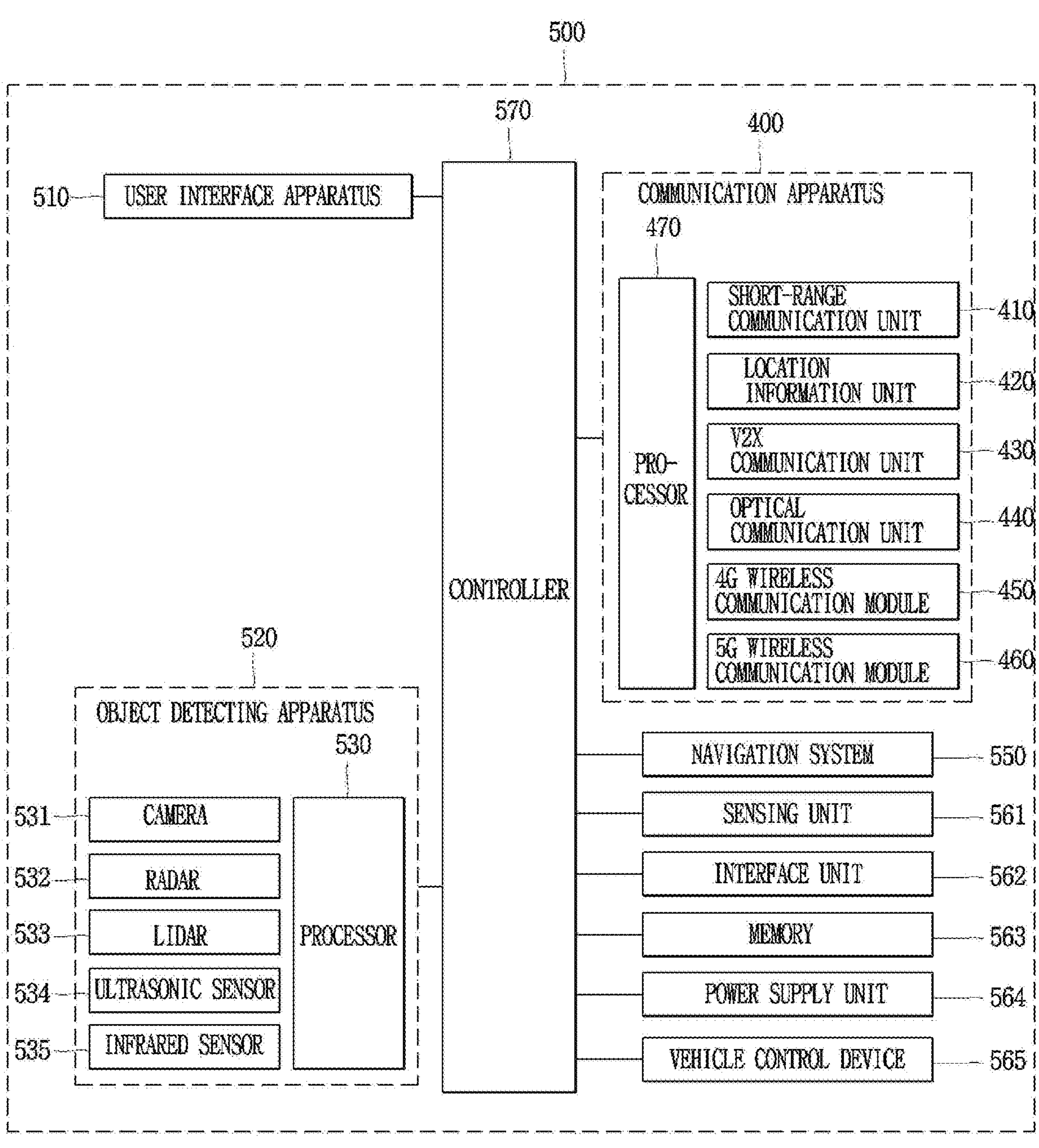
FIG. 4 is a block diagram illustrating a vehicle and an antenna system mounted to the vehicle in accordance with one example.

Meanwhile, FIG. 4 is a block diagram illustrating a vehicle and an antenna system mounted on the vehicle in accordance with an implementation. The vehicle 500 may be an autonomous (driving) vehicle. The vehicle 500 may be switched into an autonomous driving mode or a manual mode (a pseudo driving mode) based on a user input. For example, the vehicle 500 may be switched from the manual mode into the autonomous mode or from the autonomous mode into the manual mode based on a user input received through a user interface apparatus 510.

In relation to the manual mode and the autonomous driving mode, operations such as object detection, wireless communication, navigation, and operations of vehicle sensors and interfaces may be performed by the telematics control unit mounted on the vehicle 500. Specifically, the telematics control unit mounted on the vehicle 500 may perform the operations in cooperation with the antenna module 300, the object detecting apparatus 520, and other interfaces. In some examples, the communication apparatus 400 may be disposed in the telematics control unit separately from the antenna system 300 or may be disposed in the antenna system 300.

The vehicle 500 may be switched into the autonomous mode or the manual mode based on driving environment information. The driving environment information may be generated based on object information provided by the object detecting apparatus 520. For example, the vehicle 500 may be switched from the manual mode into the autonomous driving mode or from the autonomous driving mode into the manual mode based on driving environment information generated in the object detecting apparatus 520.

For example, the vehicle 500 may be switched from the manual mode into the autonomous driving mode or from the autonomous driving mode into the manual mode based on driving environment information received through the communication apparatus 400. The vehicle 500 may be switched from the manual mode into the autonomous mode or from the autonomous module into the manual mode based on information, data or signal provided from an external device.

When the vehicle 500 is driven in the autonomous driving mode, the autonomous vehicle 500 may be driven based on an operation system. For example, the autonomous vehicle 500 may travel based on information, data or signal generated in a driving system, a parking exit (parking-lot leaving system, and a parking system. When the vehicle 500 is driven in the manual mode, the autonomous vehicle 500 may receive a user input for driving through a driving control apparatus. The vehicle 500 may travel based on the user input received through the driving control apparatus.

The vehicle 500 may include a user interface apparatus 510, an object detecting apparatus 520, a navigation system 550, and a communication apparatus 400. The vehicle may further include a sensing unit 561, an interface unit 562, a memory 563, a power supply unit 564, and a vehicle control device 565 in addition to the aforementioned apparatuses and devices. In some implementations, the vehicle 500 may include more components in addition to components to be explained in this specification or may not include some of those components to be explained in this specification.

The user interface apparatus 510 may be an apparatus for communication between the vehicle 500 and a user. The user interface apparatus 510 may receive a user input and provide information generated in the vehicle 500 to the user. The vehicle 510 may implement user interfaces (UIs) or user experiences (UXs) through the user interface apparatus 200.

The object detecting apparatus 520 may be a device for detecting an object located at outside of the vehicle 500. The object may be a variety of things associated with driving (operation) of the vehicle 500. In some examples, objects may be classified into moving objects and fixed (stationary) objects. For example, the moving objects may include other vehicles and pedestrians. The fixed objects may conceptually include traffic signals, roads, and structures, for example. The object detecting apparatus 520 may include a camera 521, a radar 522, a LiDAR 523, an ultrasonic sensor 524, an infrared sensor 525, and a processor 530. According to an embodiment, the object detecting apparatus 520 may further include other components in addition to the components described, or may not include some of the components described.

The processor 530 may control an overall operation of each unit of the object detecting apparatus 520. The processor 530 may detect an object based on an acquired image, and track the object. The processor 530 may execute operations, such as computing of a distance to the object, computing of a relative speed with respect to the object and the like, through an image processing algorithm.

According to an embodiment, the object detecting apparatus 520 may include a plurality of processors 530 or may not include any processor 530. For example, each of the camera 521, the radar 522, the LiDAR 523, the ultrasonic sensor 524 and the infrared sensor 525 may include the processor in an individual manner.

When the processor 530 is not included in the object detecting apparatus 520, the object detecting apparatus 520 may operate according to the control of a processor of an apparatus within the vehicle 500 or the controller 570.

The navigation system 550 may provide location information related to the vehicle based on information obtained through the communication apparatus 400, in particular, a location information unit 420. Also, the navigation system 550 may provide a path (or route) guidance service to a destination based on current location information related to the vehicle. In addition, the navigation system 550 may provide guidance information related to surroundings of the vehicle based on information obtained through the object detecting apparatus 520 and/or a V2X communication unit 430. In some examples, guidance information, autonomous driving service, etc. may be provided based on V2V, V2I, and V2X information obtained through a wireless communication unit operating together with the antenna system 1000.

The communication apparatus 400 may be an apparatus for performing communication with an external device. Here, the external device may be another vehicle, a mobile terminal, or a server. The communication apparatus 400 may perform the communication by including at least one of a transmitting antenna, a receiving antenna, and radio frequency (RF) circuit and RF device for implementing various communication protocols. The communication apparatus 400 may include a short-range communication unit 410, a location information unit 420, a V2X communication unit 430, an optical communication unit 440, a 4G wireless communication module 450, and a processor 470. According to an embodiment, the communication apparatus 400 may further include other components in addition to the components described, or may not include some of the components described.

The short-range communication unit 410 is a unit for facilitating short-range communications. The short-range communication unit 410 may construct short-range wireless area networks to perform short-range communication between the vehicle 500 and at least one external device. The location information unit 420 may be a unit for acquiring location information related to the vehicle 500. For example, the location information unit 420 may include a Global Positioning System (GPS) module or a Differential Global Positioning System (DGPS) module.

The V2X communication unit 430 may be a unit for performing wireless communication with a server (Vehicle to Infrastructure; V2I), another vehicle (Vehicle to Vehicle; V2V), or a pedestrian (Vehicle to Pedestrian; V2P). The V2X communication unit 430 may include an RF circuit in which protocols for communication with an infrastructure (V2I), communication between vehicles (V2V), and communication with a pedestrian (V2P) are executable. The optical communication unit 440 may be a unit for performing communication with an external device through the medium of light. The optical communication unit 440 may include an optical transmission part for converting an electric signal into an optical signal and transmitting the optical signal to the outside, and an optical reception part for converting the received optical signal into the electric signal. According to an embodiment, the optical transmission part may be formed integrally with lamps provided on the vehicle 500.

The wireless communication unit 460 is a unit that performs wireless communication with one or more communication systems through one or more antenna systems. The wireless communication unit 460 may transmit and/or receive a signal to and/or from a device in a first communication system through a first antenna system. In addition, the wireless communication unit may transmit and/or receive a signal to and/or from a device in a second communication system through a second antenna system. For example, the first communication system and the second communication system may be an LTE communication system and a 5G communication system, respectively. However, the first communication system and the second communication system may not be limited thereto, and may be changed according to applications.

In some examples, the antenna module 300 disposed in the vehicle 500 may include a wireless communication unit. In this regard, the vehicle 500 may be an electric vehicle (EV) or a vehicle that can be connected to a communication system independently of an external electronic device. In this regard, the communication apparatus 400 may include at least one of the short-range communication unit 410, the location information unit 420, the V2X communication unit 430, the optical communication unit 440, a 4G wireless communication module 450, and a 5G wireless communication module 460.

The 4G wireless communication module 450 may perform transmission and reception of 4G signals with a 4G base station through a 4G mobile communication network. In this case, the 4G wireless communication module 450 may transmit at least one 4G transmission signal to the 4G base station. In addition, the 4G wireless communication module 450 may receive at least one 4G reception signal from the 4G base station. In this regard, Uplink (UL) Multi-input/Multi-output (MIMO) may be performed by a plurality of 4G transmission signals transmitted to the 4G base station. In addition, Downlink (DL) MIMO may be performed by a plurality of 4G reception signals received from the 4G base station.

The 5G wireless communication module 460 may perform transmission and reception of 5G signals with a 5G base station through a 5G mobile communication network. Here, the 4G base station and the 5G base station may have a Non-Stand-Alone (NSA) architecture. The 4G base station and the 5G base station may be disposed in the Non-Stand-Alone (NSA) architecture. Alternatively, the 5G base station may be disposed in a Stand-Alone (SA) architecture at a separate location from the 4G base station. The 5G wireless communication module 460 may perform transmission and reception of 5G signals with a 5G base station through a 5G mobile communication network. In this case, the 5G wireless communication module 460 may transmit at least one 5G transmission signal to the 5G base station. In addition, the 5G wireless communication module 460 may receive at least one 5G reception signal from the 5G base station. In this instance, a 5G frequency band that is the same as a 4G frequency band may be used, and this may be referred to as LTE re-farming. In some examples, a Sub6 frequency band, which is a range of 6 GHz, or less, may be used as the 5G frequency band. In contrast, a millimeter-wave (mmWave) band may be used as the 5G frequency band to perform broadband high-speed communication. When the mmWave band is used, the electronic device may perform beamforming for coverage expansion of an area where communication with a base station is possible.

On the other hand, regardless of the 5G frequency band, 5G communication systems can support a larger number of multi-input multi-output (MIMO) to improve a transmission rate. In this instance, UL MIMO may be performed by a plurality of 5G transmission signals transmitted to a 5G base station. In addition, DL MIMO may be performed by a plurality of 5G reception signals received from the 5G base station.

In some examples, the wireless communication unit 110 may be in a Dual Connectivity (DC) state with the 4G base station and the 5G base station through the 4G wireless communication module 450 and the 5G wireless communication module 460. As such, the dual connectivity with the 4G base station and the 5G base station may be referred to as EUTRAN NR DC (EN-DC). On the other hand, if the 4G base station and 5G base station are disposed in a co-located structure, throughput improvement can be achieved by inter-Carrier Aggregation (inter-CA). Accordingly, when the 4G base station and the 5G base station are disposed in the EN-DC state, the 4G reception signal and the 5G reception signal may be simultaneously received through the 4G wireless communication module 450 and the 5G wireless communication module 460, respectively. Short-range communication between electronic devices (e.g., vehicles) may be performed between electronic devices (e.g., vehicles) using the 4G wireless communication module 450 and the 5G wireless communication module 460. In one embodiment, after resources are allocated, vehicles may perform wireless communication in a V2V manner without a base station.

Meanwhile, for transmission rate improvement and communication system convergence, Carrier Aggregation (CA) may be carried out using at least one of the 4G wireless communication module 450 and the 5G wireless communication module 460 and a WiFi communication module. In this regard, 4G+WiFi carrier aggregation (CA) may be performed using the 4G wireless communication module 450 and the Wi-Fi communication module 113. Or, 5G+WiFi CA may be performed using the 5G wireless communication module 460 and the Wi-Fi communication module.

In some examples, the communication apparatus 400 may implement a display apparatus for a vehicle together with the user interface apparatus 510. In this instance, the display apparatus for the vehicle may be referred to as a telematics apparatus or an Audio Video Navigation (AVN) apparatus.

The processor 470 of the communication apparatus 400 may correspond to a modem. In this regard, the RFIC and the modem may be referred to as a first controller (or a first processor) and a second controller (a second processor), respectively. Meanwhile, the RFIC and the modem may be implemented as physically separate circuits. Alternatively, the RFIC and the modem may be logically or functionally separated from each other on one physical circuit. The modem may perform control and signal processing for signal transmission and reception through different communication systems using the RFID. The modem 1400 may acquire control information from a 4G base station and/or a 5G base station. Here, the control information may be received through a physical downlink control channel (PDCCH), but may not be limited thereto.

The modem may control the RFIC 1250 to transmit and/or receive signals through the first communication system and/or the second communication system for a specific time interval and from frequency resources. Accordingly, the vehicle can be allocated resources or maintain a connected state through the eNB or gNB. In addition, the vehicle may perform at least one of V2V communication, V2I communication, and V2P communication with other entities using the allocated resources.

Meanwhile, referring to FIGS. 1A to 4, the antenna module mounted on the vehicle may be disposed inside the vehicle, on the roof of the vehicle, inside the roof, or inside the roof frame. In this regard, the antenna system disclosed herein may be configured to operate in a low band (LB), mid band (MB), and high band (HB) of a 4G LTE system and a Sub6 band of a 5G NR system. Additionally, the antenna system disclosed herein may be configured to operate in a 760 MHz band, 5.9 GHz band, and 6.5 GHz band to provide NR V2X communication services.

Hereinafter, a broadband antenna element disposed in an antenna module disposed on a vehicle according to the present disclosure will be described. In this regard, with the recent advent of the smart car era, new 5G V2X standards and services are required for transmitting/receiving data with arbitrary entities around a vehicle. Through the antenna structure proposed in the present disclosure, it is possible to dominate the multi-band NR V2X antenna technology that can support not only the legacy V2X band but also the 3GPP Release 17 standard in the future.

To communicate with any entity around the vehicle through the antenna module disposed on or inside the roof of the vehicle, the antenna module is required to have isotropic radiation characteristics of 360 degrees. Regarding a frequency band, an antenna structure to support a single band of 5.9 GHz or 760 MHz band may be considered. However, in the present disclosure, the standardization work has recently been carried out for NR V2X supporting n38 band and n47 band, which has high data transmission rates with wide bandwidths, in 3GPP Release 16. In addition, there is a possibility that NR expansion up to 7 GHz band is made in Release 17 in the future.

In addition, legacy communication methods have limitations in achieving high data transmission rate and reliability in terms of performing data transmission/reception with arbitrary entities adjacent to a vehicle to provide various services such as accident suppression, improved driving convenience, increased fuel efficiency, and the like.

Therefore, the present disclosure provides a V2X integrated solution antenna structure that can support both n38 and n47 bands standardized in Release 16 and an NR band of 7 GHz, which is likely to be used in the future, in addition to the legacy V2X antenna band.

Figure 5A:
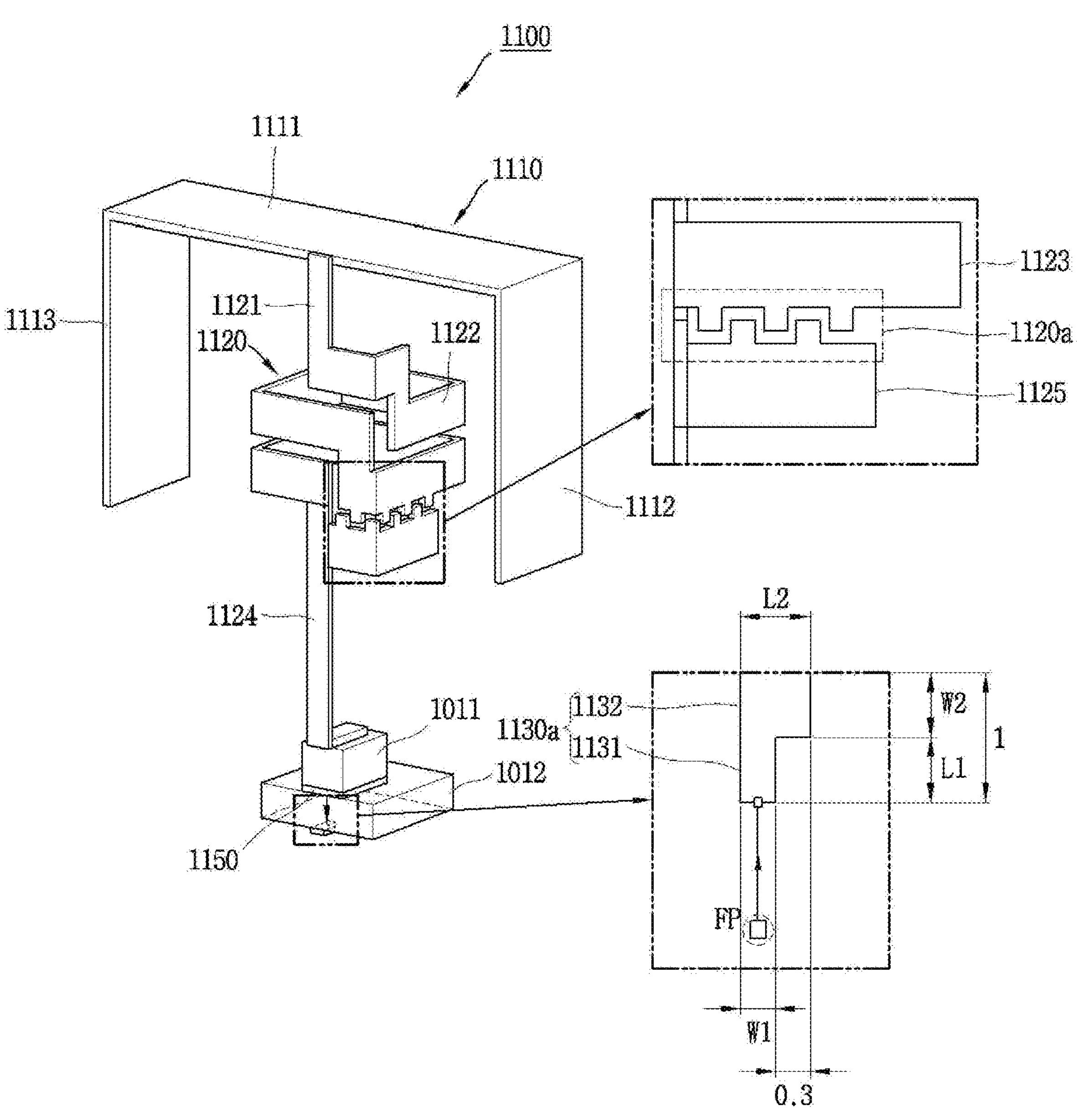
FIG. 5A is a block diagram of an antenna module that may be disposed on a vehicle according to the present disclosure, and is also an enlarged view of a partial region.
Figure 5B:
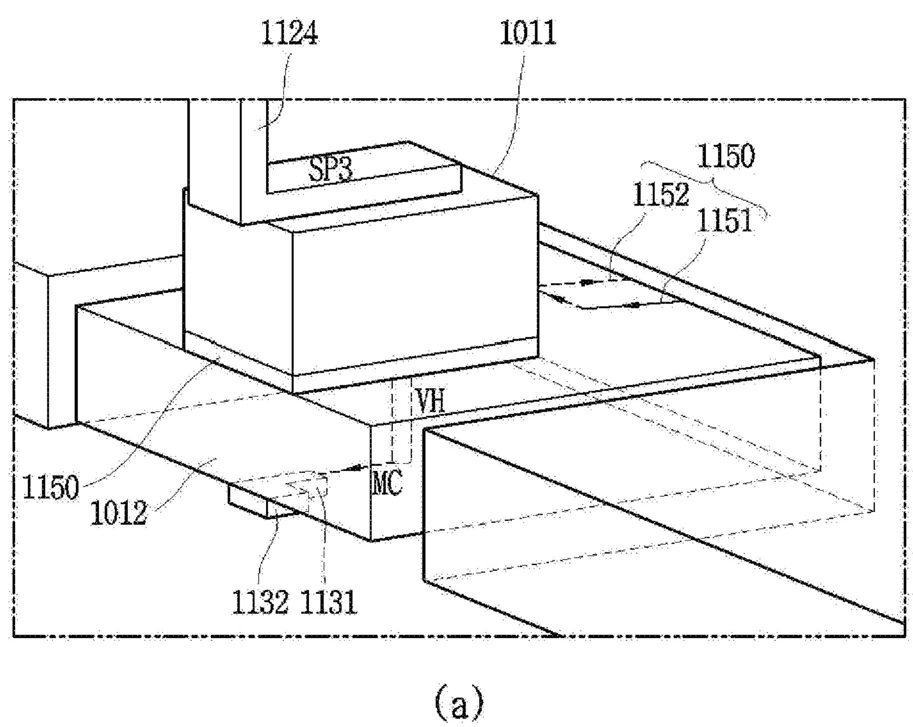
FIG. 5B is an enlarged view illustrating a feed structure of the antenna module of FIG. 5A.

FIG. 5A is a block diagram of an antenna module that may be disposed on a vehicle according to the present disclosure, and is also an enlarged view of a partial region. FIG. 5B is an enlarged view illustrating a feed structure of the antenna module of FIG. 5A. (a) of FIG. 5B is a lateral perspective view of the bottom region of the antenna module, and (b) of FIG. 5B is a rear view of the bottom region of the antenna module.

Figure 8:
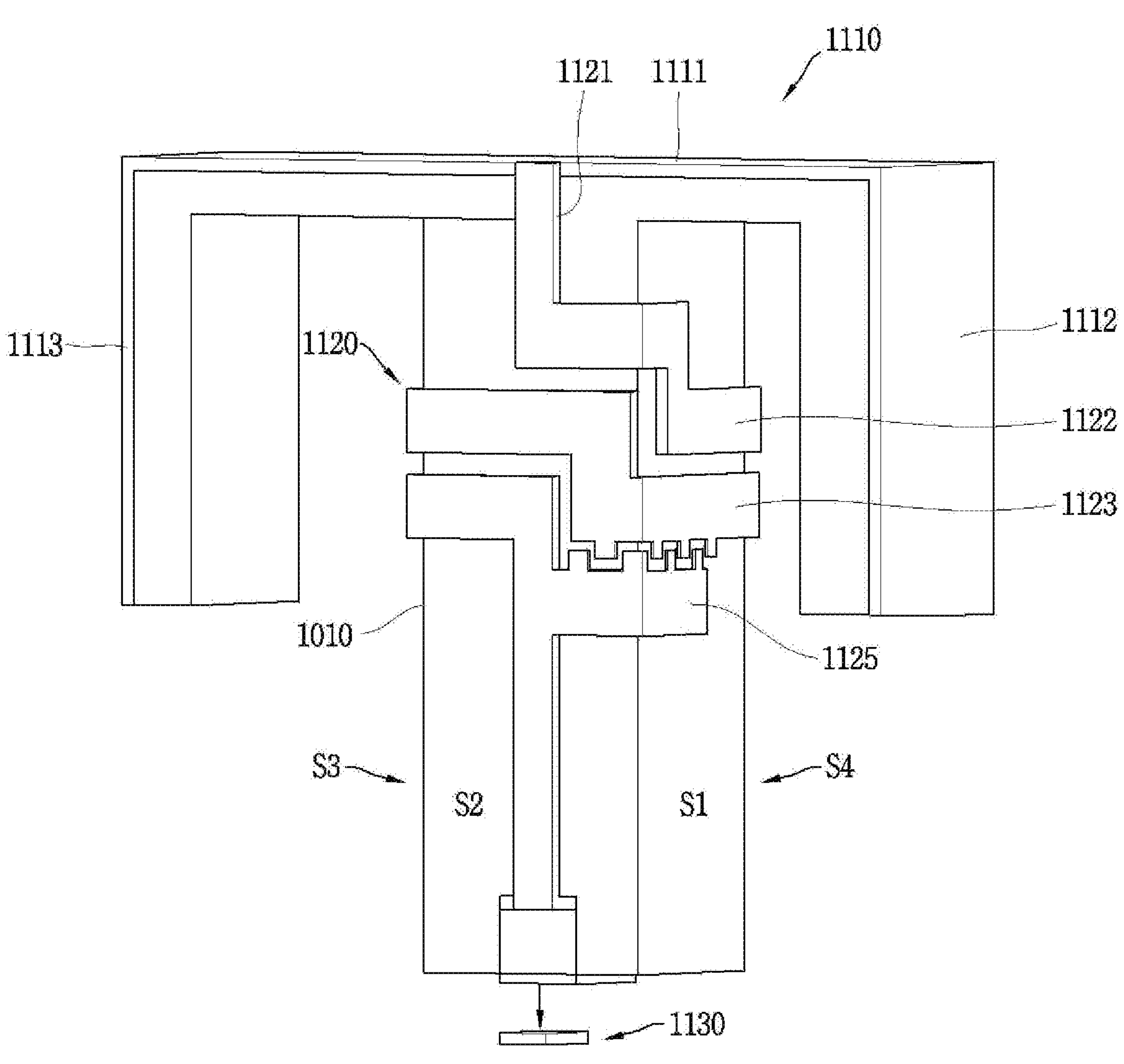
FIG. 8 is a diagram illustrating that the conductive patterns of the antenna module of FIG. 5A are disposed on a dielectric structure.

Referring to FIG. 5A, the antenna module 1100 includes a first radiator structure 1110, a second radiator structure 1120, and a third radiator structure 1130 (see also FIGS. 8 and 9). Referring to FIGS. 5A and 5B, an end portion SP3 of a lower branch 1124 of the second radiator structure 1120 is configured to receive a signal transmitted from a first feed line 1151 of a feeder 1150. The first feed line 1151 may be disposed on a first dielectric substrate 1011.

As shown in FIG. 5B, the lines of the feeder 1150 may include a first feed line 1151 and a second feed line 1152. The first feed line 1151 feeds a first signal to the end portion of the lower branch 1124 of the second radiator structure 1120, and the second feed line 1152 feeds a second signal to a conductive pattern of the third radiator structure 1130.

The first feed line 1151 and the end portion SP3 of the lower branch 1124 of the second radiator structure 1120 may be coupled-fed or may be connected by a vertical via structure. The first feed line 1151 may be connected to the feed line 1150 disposed on the second dielectric substrate 1012 through the via hole VH. The first feed line 1151 may be connected to a first conductive pattern 1131 disposed on the second dielectric substrate 1012 through the via hole VH. An impedance matching part MC may be disposed between the via hole VH and the first conductive pattern 1131. The impedance matching part MC may be configured to include a resistor, an inductor, a capacitor, or a combination thereof.

Figure 5B:
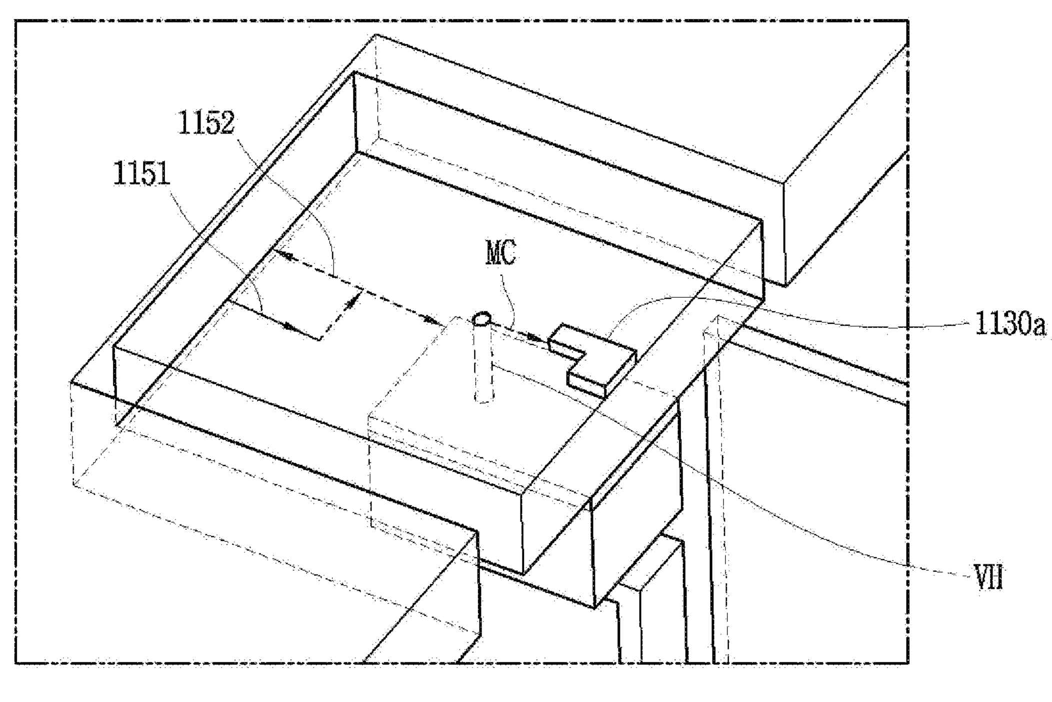
Figure 6:
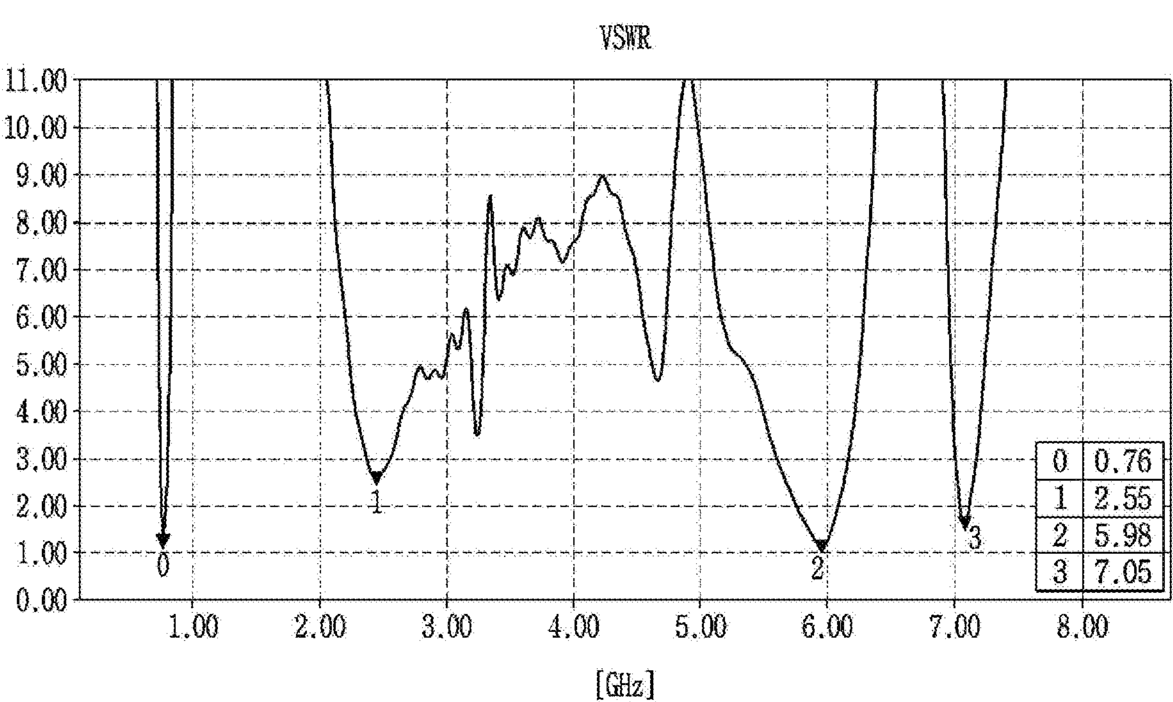
FIG. 6 is a diagram illustrating VSWR characteristics according to frequencies in the antenna module of FIG. 5A.

Meanwhile, FIG. 6 is a diagram illustrating VSWR characteristics according to frequencies in the antenna module of FIG. 5A. Referring to FIGS. 5A to 6, the antenna module 1100 resonates in first to fourth frequency bands and operates as a radiator. The first frequency band may be a 760 MHz band, the second frequency band may be a 2.3 GHz band, the third frequency band may be a 5.9 GHz band, and the fourth frequency band may be a 7 GHz band. Referring to FIG. 6, a target voltage standing wave ratio (VSWR) is satisfied in the full band of the first to fourth frequency bands. Therefore, the antenna structure of FIG. 5A may be referred to as an all-in-one V2X antenna.

Referring to FIG. 5A, radiation efficiency can be secured in a metal loop structure in which a non-metal region is formed in a vehicle through the first radiator structure 1110 formed in the top region and both side regions of the antenna module 1100. An antenna structure of an ultra-small band of 760 MHz can be provided through the first radiator structure 1110 and the second radiator structure 1120. Accordingly, an antenna operating in the 760 MHz band, which is the first frequency band, can be implemented through the first radiator structure 1110 and the second radiator structure 1120.

In addition, an antenna size can be reduced through the second radiator structure 1120 having a helical structure. An antenna operating in the second frequency band and the third frequency band can be implemented through the second radiator structure 1120 having this helical structure. The second and third frequency bands may be 2.6 GHz band and 5.9 GHz band, which are n38 band and n47 band, respectively.

Further, the second radiator structure 1120 can resonate in the second frequency band by an interdigital structure 1120*a*. The interdigital structure 1120*a* allows resonance to occur in the second frequency band by adjusting an inductance component and a capacitance component without additional conductive patterns or electrical elements. Meanwhile, the second radiator structure 1120 can resonate in the third frequency band by a lower conductive pattern of the interdigital structure 1120*a*.

In addition, the third radiator structure 1130, which is a printed antenna in the form of a PCB through a via structure, can be hybridized with the first and second radiator structures 1110 to create a radiator in the 7 GHz band, which is the fourth frequency band.

Figure 7:
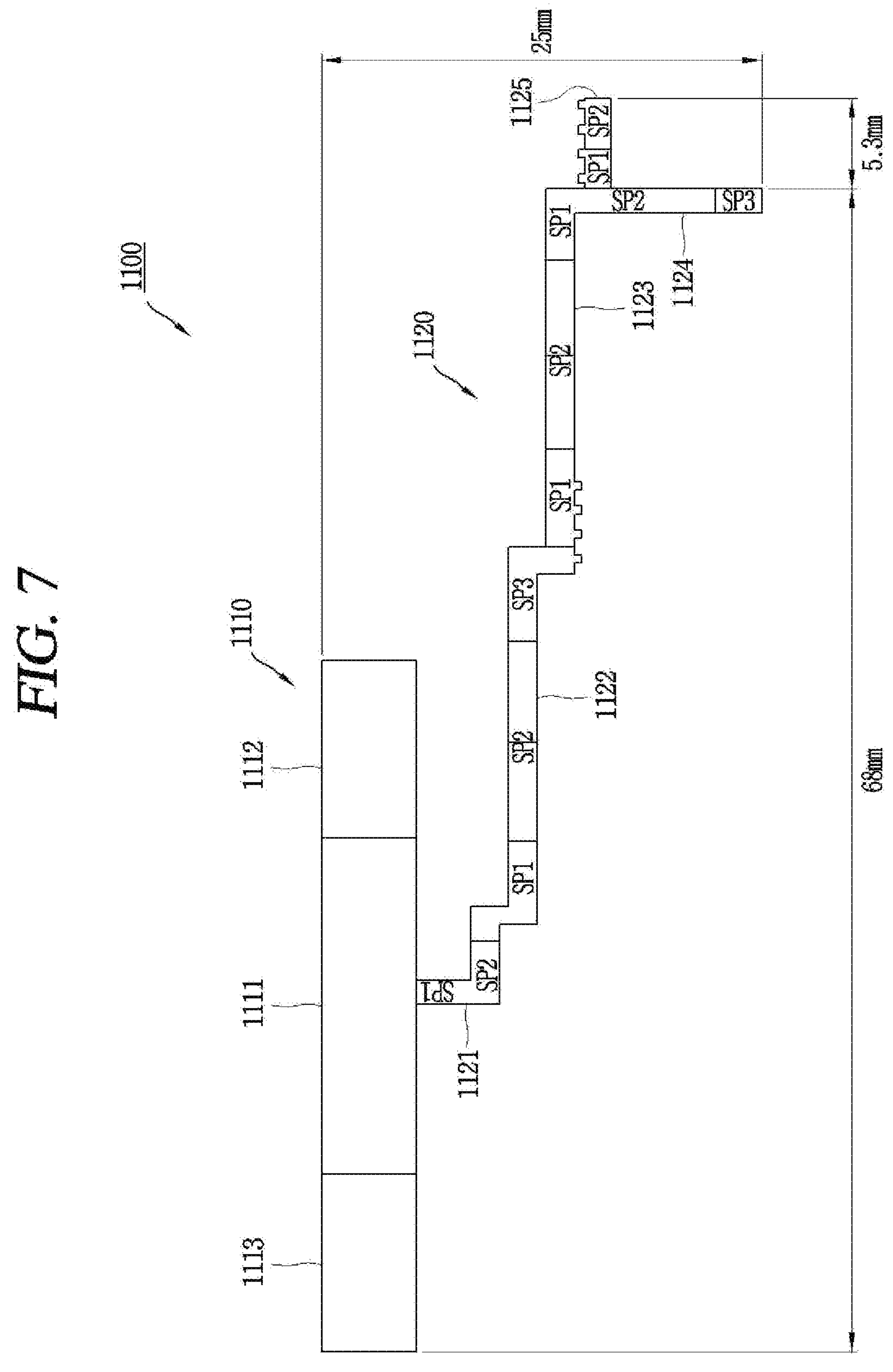
FIG. 7 is an exploded view illustrating conductive patterns of the antenna module of FIG. 5A.

Hereinafter, the configuration of the all-in-one V2X antenna module 1100 according to the present disclosure will be described in detail. In this regard, FIG. 7 is an exploded view illustrating conductive patterns of the antenna module of FIG. 5A. Also, FIG. 8 is a diagram illustrating that the conductive patterns of the antenna module of FIG. 5A are disposed on a dielectric structure.

Figure 9A:
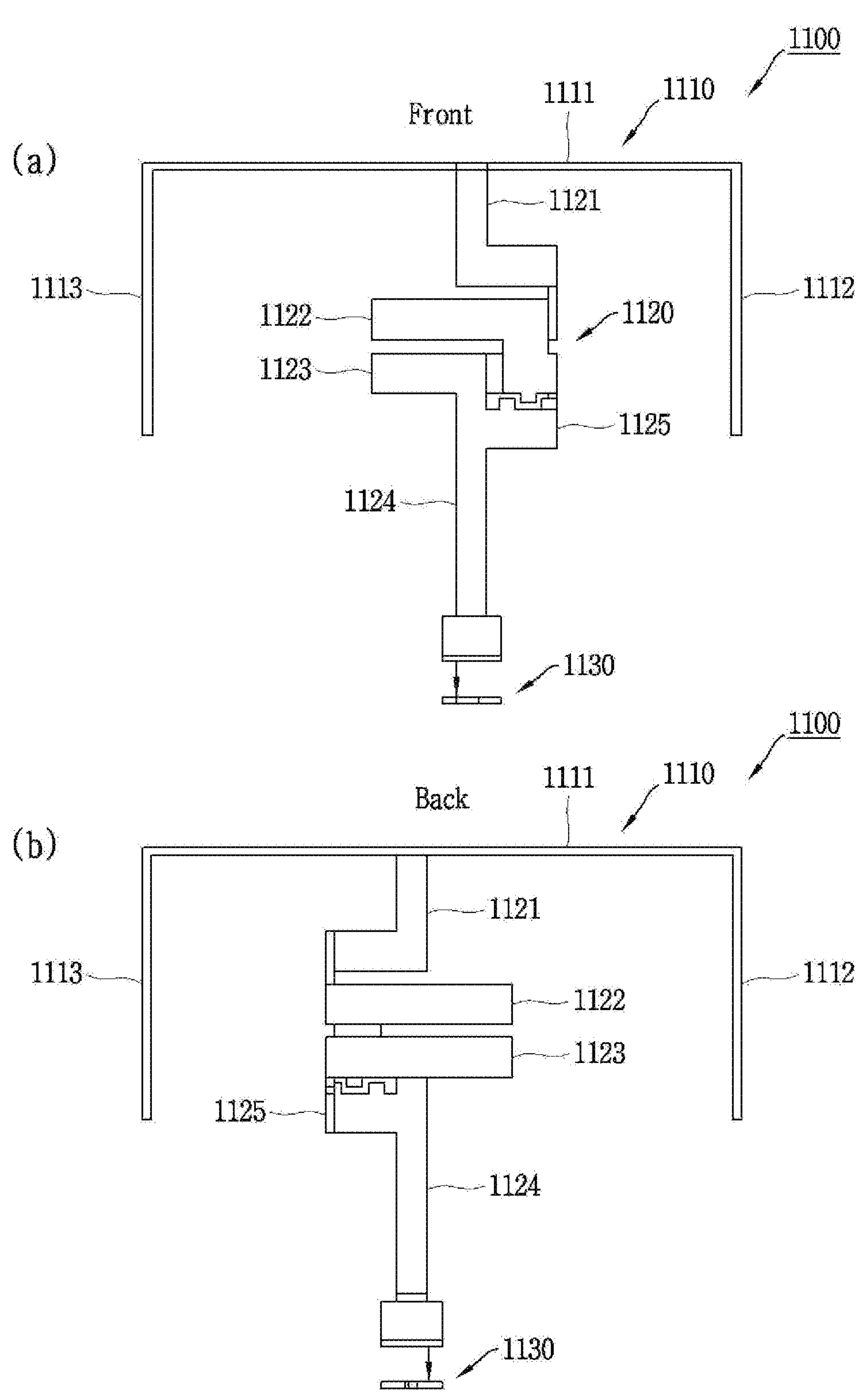
FIGS. 9A to 9C are diagrams illustrating front, rear, right, left, top, and bottom surfaces of the antenna module of FIG. 5A.
Figure 9B:
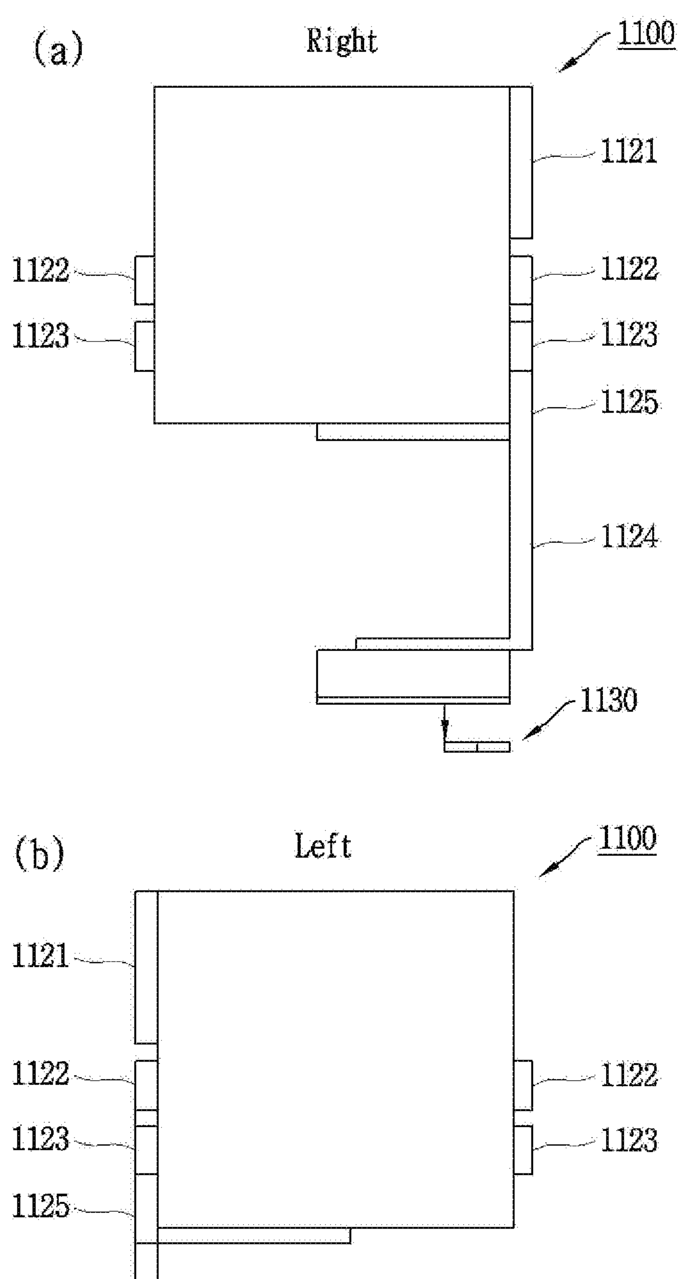
Figure 9C:
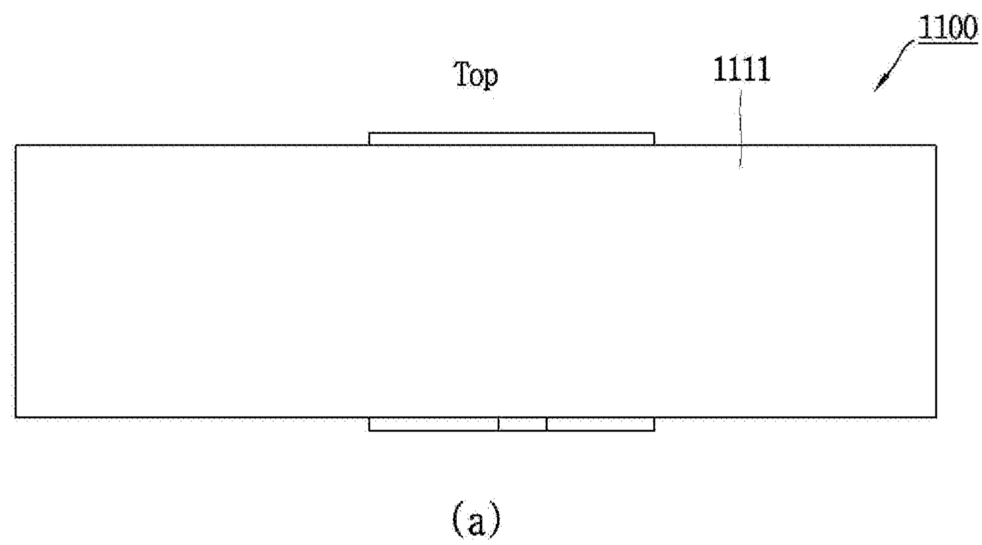
Figure 9C:
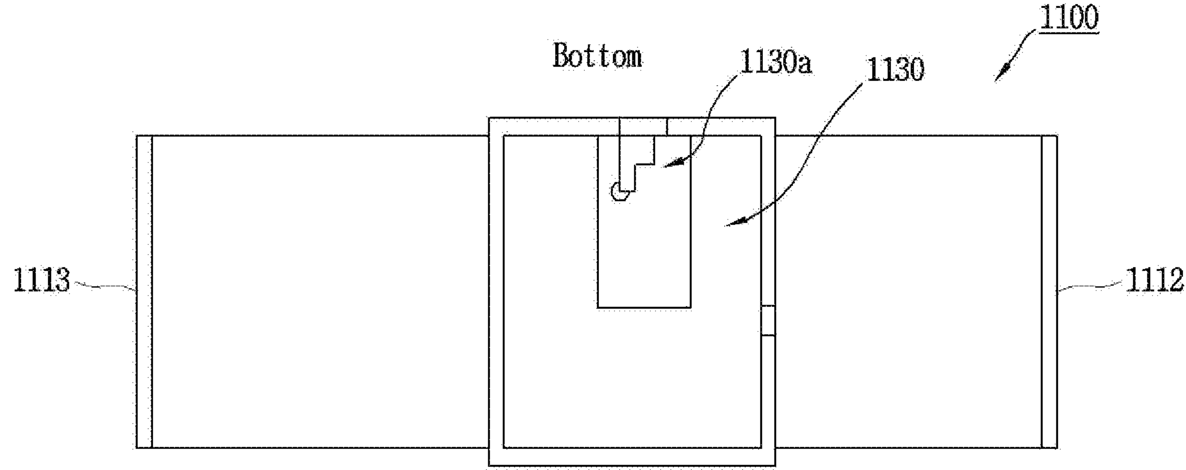

FIGS. 9A to 9C are diagrams illustrating front, rear, right, left, top, and bottom surfaces of the antenna module of FIG. 5A. (a) and (b) of FIG. 9A are front and rear views of the antenna module of FIG. 5A. (a) and (b) of FIG. 9A are front and rear views of the antenna module of FIG. 5A. (a) and (b) of FIG. 9B are right and left views of the antenna module of FIG. 5A. (a) and (b) of FIG. 9C are top and bottom views of the antenna module of FIG. 5A.

Referring to FIGS. 5A, and 7 to 9C, the antenna module 1100 includes a first radiator structure 1110, a second radiator structure 1120, and a third radiator structure 1130. The first radiator structure 1110 includes a top conductive pattern 1111 and first and second side conductive patterns 1112 and 1113. The first and second side conductive patterns 1112 and 1113 are formed to extend from both end portions of the top conductive pattern 1111.

In addition, the second radiator structure 1120 is connected to the top conductive pattern 1111. As shown, the second radiator structure 1120 includes a plurality of conductive patterns 1121 to 1125 connected together to form first to fourth side surfaces S1 to S4. Further, the second radiator structure 1120 is provided with helical lines disposed on the first to fourth side surfaces S1 to S4 of the dielectric structure 1010. The second radiator structure 1120 is configured to operate in the second frequency band and the third frequency band that are higher than the first frequency band. Meanwhile, the first radiator structure 1110 and the second radiator structure 1120 can be configured to operate in the first frequency band by the helical lines.

In addition, the second radiator structure 1120 includes an upper branch 1121 and a lower branch 1124. The upper branch 1121 is connected to one end portion of the top conductive pattern 1111 of the first radiator structure 1110, and the lower branch 1124 is connected to the feeder 1150. The lower branch 1124 is also connected to the conductive pattern of the third radiator structure 1130 through the feeder 1150 and the via hole VH.

Further, the second radiator structure 1120 operates as a helical radiator that is configured with the helical lines on the first to fourth side surfaces S1 to S4 by the upper branch 1121, the conductive patterns 1122, 1123, and 1125, and the lower branch 1124. The conductive patterns 1122, 1123, and 1125 are disposed between the upper branch 1121 and the lower branch 1124.

In addition, the third radiator structure 1130 includes a conductive pattern 1130*a* connected to the feeder 1150 through the via hole VH. The third radiator structure 1130 also operates in the fourth frequency band that is higher than the third frequency band. The first frequency band may be a 760 MHz band, the second frequency band may be a 2.6 GHz band, which is an n38 band, the third frequency band may be a 5.9 GHz band, which is an n47 band, and the fourth frequency band may be a 7 GHz band.

Further, the conductive pattern 1130*a* of the third radiator structure 1130 includes a first conductive pattern 1131 and a second conductive pattern 1132. The first conductive pattern 1131 has a first width W1 and a first length L1, and the second conductive pattern 1132 is formed perpendicular to the first conductive pattern 1131. Also, the second conductive pattern 1132 has a second width W2 and a second length L2. The conductive pattern 1130*a* including the first conductive pattern 1131 and the second conductive pattern 1132 can operate as a radiator in the 7 GHz band, which is the fourth frequency band.

Figure 10A:
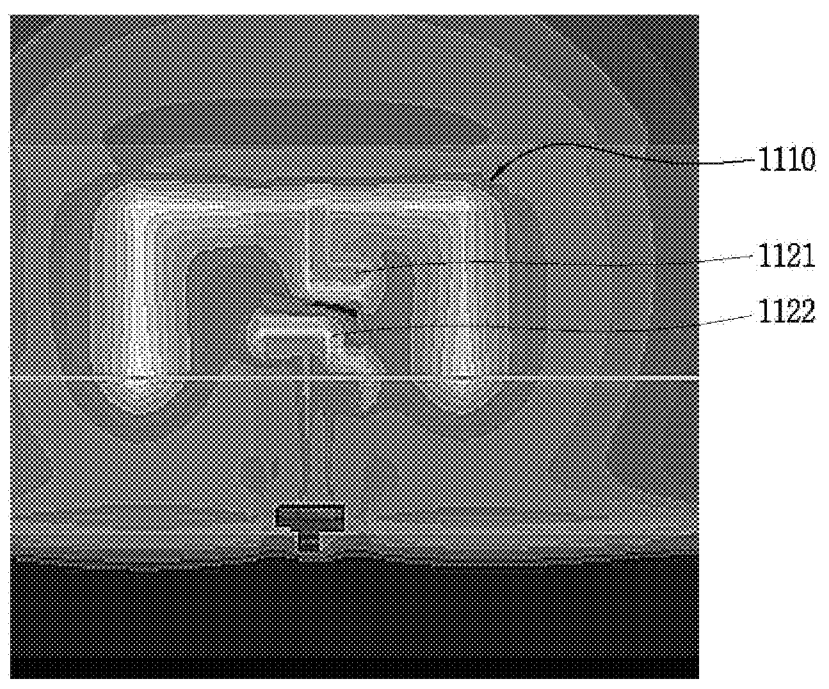
FIGS. 10A and 10B are diagrams illustrating electric field distribution formed in the antenna module for each frequency band.
Figure 10A:
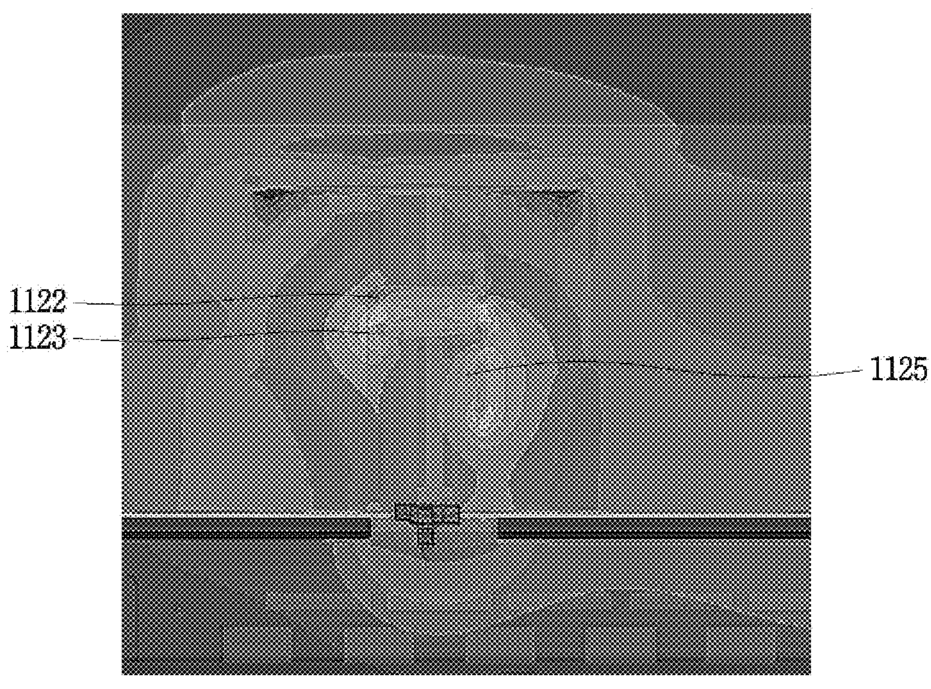
Figure 10B:
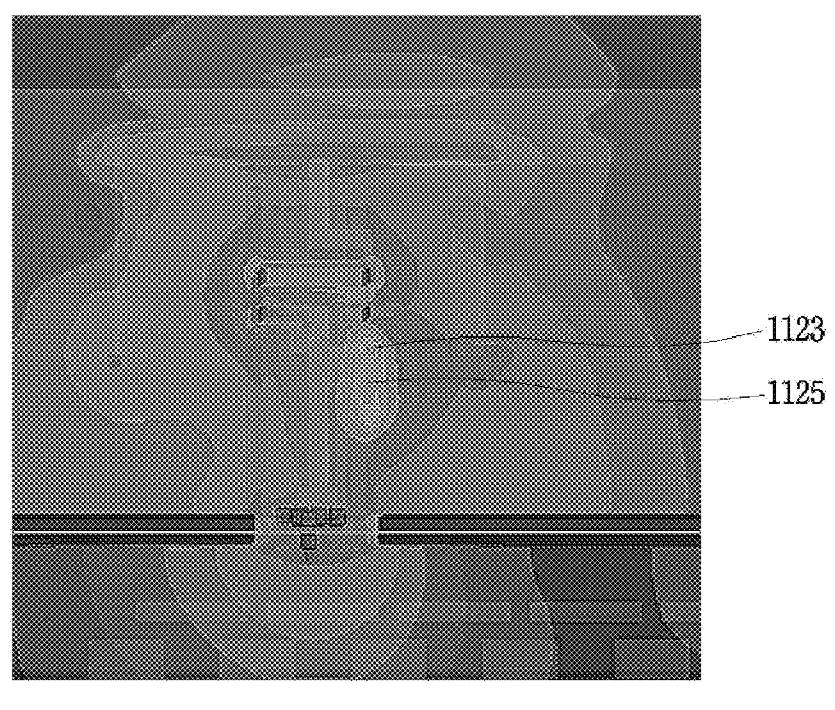
Figure 10B:
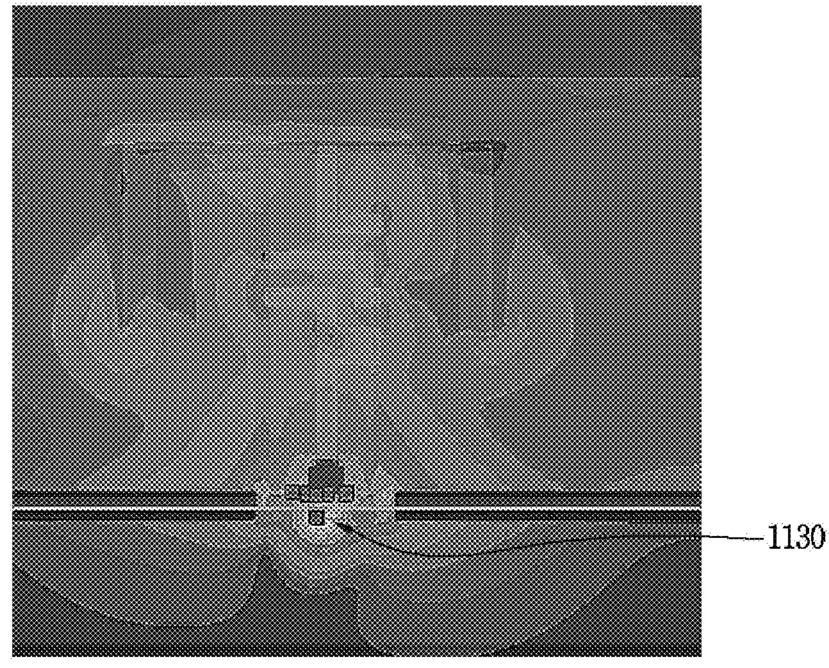

Next, FIGS. 10A and 10B are diagrams illustrating electric field distribution formed in the antenna module for each frequency band. (a) and (b) of FIG. 10A illustrate electric field distributions formed in the antenna module in the first and second frequency bands, and (a) and (b) of FIG. 10B illustrate electric field distributions formed in the antenna module in the third and fourth frequency bands.

Referring to FIG. 5A, FIG. 8, and (a) of FIG. 10A, in the 760 MHz band, an electric field distribution which is higher than those in other regions is formed in the first radiator structure 1110 and the second radiator structure 1120. Specifically, the electric field distribution of the first radiator structure 1110 is the highest, followed by the electric field distribution of the first and second conductive patterns 1121 and 1122 on the second side surface S2 of the second radiator structure 1120.

Referring to FIG. 5A, FIG. 8, and (b) of FIG. 10A, in the 2550 MHz band, an electric field distribution which is higher than those in other regions is formed in the second radiator structure 1120. The second radiator structure 1120 operates as a radiator by the electric field distribution formed on the first side surface S1 and the third side surface S3. Specifically, the second radiator structure 1120 operates as a radiator by the electric field distribution that is formed on the second and third conductive patterns 1122 and 1123 and the third and fifth conductive patterns 1123 and 1125 on the first side surface S1. Additionally, the second radiator structure 1120 operates as a radiator by the electric field distribution formed on the second and third conductive patterns 1122 and 1123 on the third side surface S3.

Referring to FIG. 5A, FIG. 8, and (a) of FIG. 10B, in 5920 MHz band, an electric field distribution which is higher than those in other regions is formed in the second radiator structure 1120. The second radiator structure 1120 operates as a radiator by the electric field distribution which is the highest on the first side surface S1. Specifically, the second radiator structure 1120 operates as a radiator by the electric field distribution formed on the third and fifth conductive patterns 1123 and 1125 on the first side surface S1.

Referring to FIG. 5A, FIG. 8, and (b) of FIG. 10B, in 7050 MHz band, an electric field distribution which is higher than those in other regions is formed in the third radiator structure 1130. Thus, the third radiator structure 1130 can operate as a radiator due to the highest electric field distribution formed on the conductive pattern 1130*a*. The second highest electric field distribution may be formed on one end portion of the fourth conductive pattern 1124 of the second radiator structure 1120 that can be electrically coupled to the conductive pattern 1130*a*. However, compared to the electric field distribution formed on the third radiator structure 1130, the electric field distributions on the first and second radiator structures 1110 and 1120 have values lower than a threshold level.

Meanwhile, referring to FIGS. 5A and 6 to 9, the antenna module 1100 can be configured to further include a dielectric structure 1010. The dielectric structure 1010 may be configured to support the top conductive pattern 1111 and the first and second side patterns 1112 and 1113 of the first radiator structure 1110. The dielectric structure 1010 can also be configured to support the conductive patterns 1121 to 1125 of the second radiator structure 1120.

The second radiator structure 1120 may include the first conductive pattern 1121 to the fifth conductive pattern 1125. In this regard, the second radiator structure 1120 may change in various ways depending on applications. Referring to FIG. 7, the first conductive pattern 1121 corresponding to the upper branch and the fourth conductive pattern 1124 corresponding to the lower branch may be connected as one conductive pattern. Accordingly, the second radiator structure 1120 may include the first conductive pattern 1121, the second conductive pattern 1122, the fourth conductive pattern 1124, and the fifth conductive pattern 1125. Accordingly, the second radiator structure 1120 may include the first conductive pattern 1121, the third conductive pattern 1123, the fourth conductive pattern 1124, and the fifth conductive pattern 1125.

Meanwhile, the second radiator structure 1120 may include the first conductive pattern 1121 to the fourth conductive pattern 1124. As another example, the second radiator structure 1120 may include the first conductive pattern 1121, the second conductive pattern 1123, and the fourth conductive pattern 1122. As still another example, the second radiator structure 1120 may include the first conductive pattern 1121, the third conductive pattern 1123, and the fourth conductive pattern 1124.

The first conductive pattern 1121 may be connected to one end portion of the top conductive pattern 1111 and form the upper branch. The second conductive pattern 1122 may have one end portion connected to the first conductive pattern 1121 and may be bent to form another end portion. The third conductive pattern 1123 may have one end portion connected to the another end portion of the second conductive pattern 1122 and another end portion connected to one end portion of the lower branch 1124.

The fourth conductive pattern 1124 may have one end portion connected to the another end portion of the third conductive pattern 1123 and another end portion bent to be disposed on the dielectric substrate 1011. The fifth conductive pattern 1125 may extent from a point on one side of the fourth conductive pattern 1124.

One portion SP1 of the second conductive pattern 1122, one portion SP1 of the third conductive pattern 1123, and one portion SP1 of the fifth conductive pattern 1125 may be disposed on the first side surface S1 to face the first side conductive pattern 1122.

A lower portion of the third conductive pattern 1123 and an upper portion of the fifth conductive pattern 1125 disposed on the first side surface S1 may form an interdigital structure 1120*a* in which concave structures and convex structures are complementarily disposed. Accordingly, the second radiator structure 1120 can operate in the second frequency band according to the interdigital structure 1120*a*.

The interdigital structure 1120*a* may be formed on the first side surface S1. The interdigital structure 1120*a* may also be formed on the second side surface S2. The lower portion of the second conductive pattern 1122 and the upper portion of the fifth conductive pattern 1125 disposed on the second side surface S2 adjacent to the first side surface S1 may form an interdigital structure 1120*a*. In this regard, the lower portion of the second conductive pattern 1122 and the upper portion of the fifth conductive pattern 1125 may have complementary concave and convex structures. Accordingly, the second radiator structure 1120 can operate in the second frequency band according to the interdigital structure 1120*a*.

Hereinafter, a conductive pattern disposition structure on the second side surface S2 will be described. A first sub-pattern SP1 of the first conductive pattern 1110 and a second sub-pattern SP2 of the fourth conductive pattern 1140 may form the upper branch and the lower branch on the second side surface S2 adjacent to the first side surface S1. A second sub-pattern SP2 of the first conductive pattern 1110, a second sub-pattern SP2 of the second conductive pattern 1120, and a first sub-pattern SP1 of the fourth conductive pattern 1140 may be disposed in parallel on the second side surface S2. A third sub-pattern SP3 of the second conductive pattern 1120 and a first sub-pattern SP1 of the fifth conductive pattern 1150 may be disposed in parallel on the second side surface S2 and form the interdigital structure 1120*a*, which has the complementary concave and convex structures.

The antenna module 1100 according to the present disclosure may further include a first dielectric substrate 1011 and a second dielectric substrate 1012. The first dielectric substrate 1011 may be configured such that a third sub-pattern SP3, which is an end portion constituting the lower branch of the second radiator structure, is disposed. The second dielectric substrate 1012 may be disposed below the first dielectric substrate 1011. The second dielectric substrate 1012 may be configured to be connected to the feeder 1150 through the via hole VH. In this regard, the feeder 1150 may be disposed on the front surface of the second dielectric substrate 1012. A conductive pattern 1030*p* may be disposed on the rear surface of the second dielectric substrate 1012, but is not limited thereto.

The antenna module 1100 according to the present disclosure may further include an impedance matching part MC. The impedance matching part MC may be disposed between one end portion of the first conductive pattern 1031 and a via pad VP connected to the via hole VH. The impedance matching part MC may include a resistor, an inductor, a capacitor, or a combination thereof.

Feed lines of the feeder 1150 may include a first feed line 1151 and a second feed line 1152. The first feed line 1151 feeds a first signal to the end portion of the lower branch 1124 of the second radiator structure 1120, and the second feed line 1152 feeds a second signal to a conductive pattern of the third radiator structure 1130.

Figure 11A:
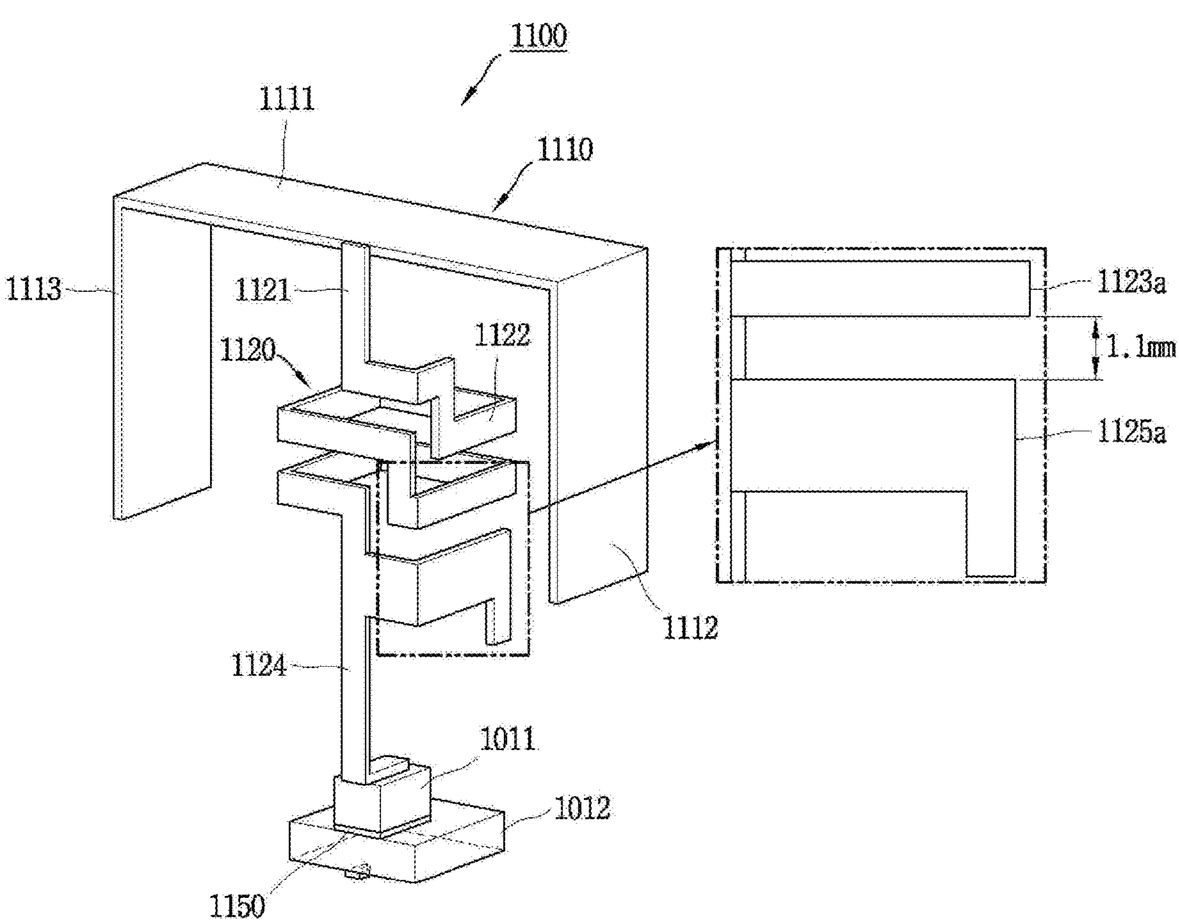
FIGS. 11A and 11B are perspective views illustrating first and second antenna structures configured to perform V2X communications according to embodiments.
Figure 11B:
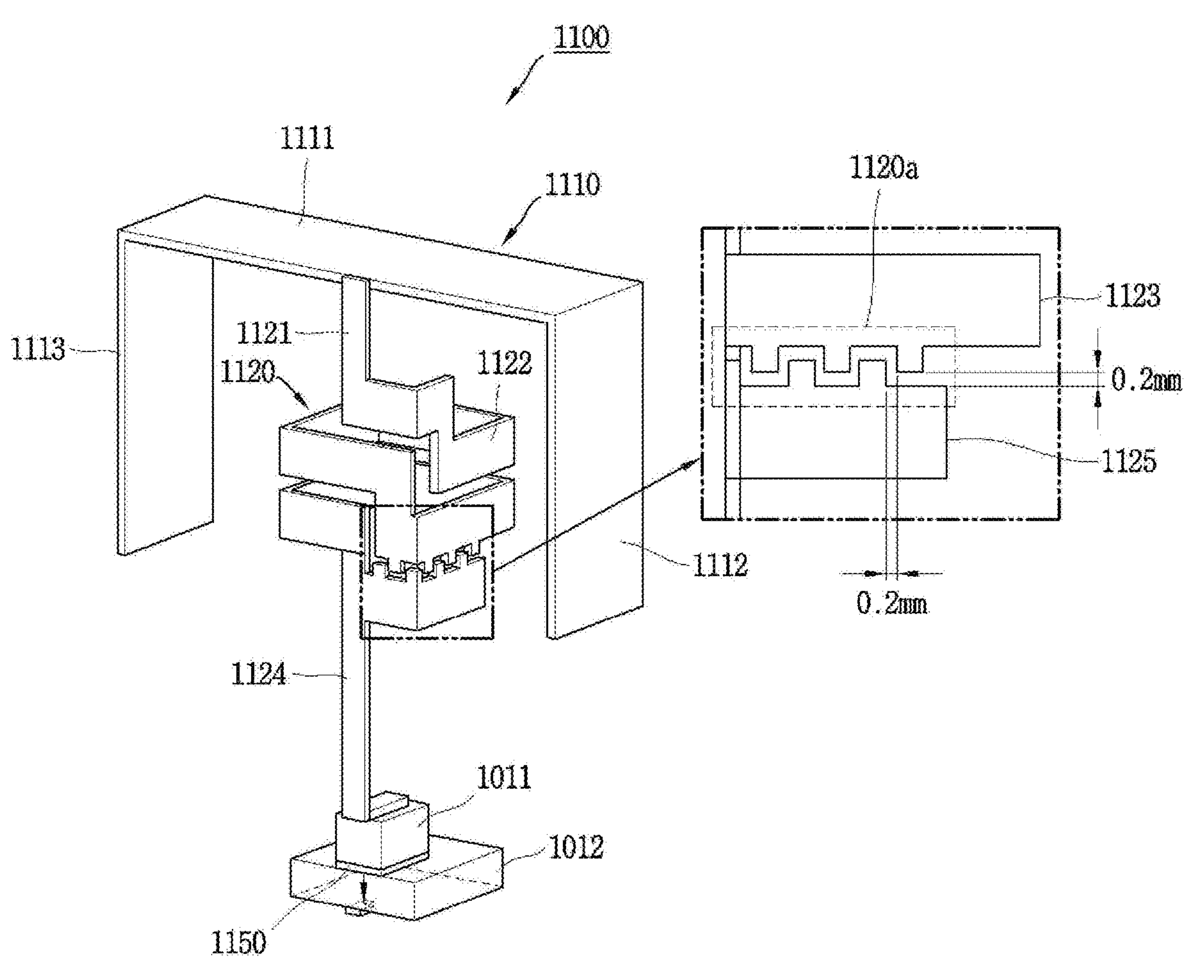

In addition, a broadband antenna structure according to the present disclosure can be designed in various shapes. For example, FIGS. 11A and 11B are perspective views illustrating first and second antenna structures configured to perform V2X communications according to embodiments. Also, FIGS. 12A and 12B are diagrams of comparing VSWR and antenna efficiency for the first and second antenna structures.

FIG. 11A illustrates an antenna structure in which conductive patterns are spaced apart at a first gap (spacing), for example, 1.1 m, without an interdigital structure. FIG. 11B illustrates an antenna structure in which conductive patterns of an interdigital structure are spaced apart at a second gap narrower than the first gap, for example, 0.2 mm.

Figure 12A:
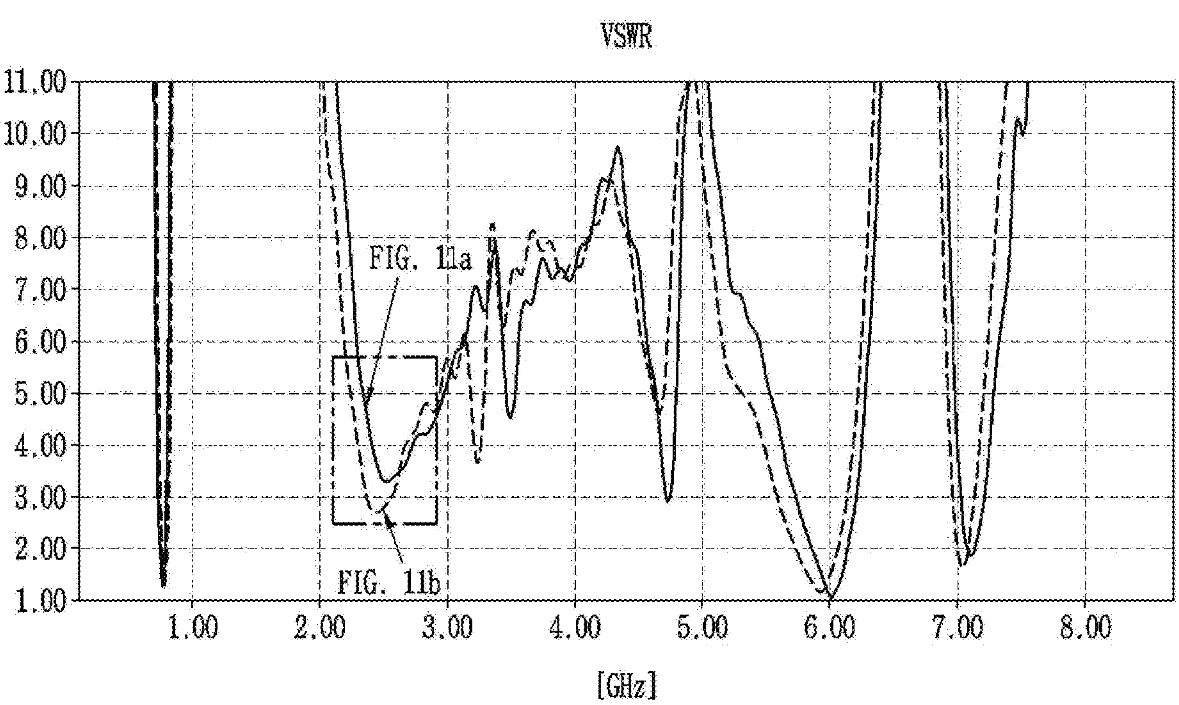
FIGS. 12A and 12B are diagrams of comparing VSWR and antenna efficiency for the first and second antenna structures.

Referring to FIGS. 11A and 12A, when the first gap between the third and fifth conductive patterns 1123*a* and 1125*a* of the second radiator structure 1120 is 1.1 mm, VSWR has a value of 3 or more. On the other hand, referring to FIGS. 11B and 12A, when the second gap between the third and fifth conductive patterns 1123 and 1125, forming the interdigital structure, of the second radiator structure 1120 is 0.2 mm, VSWR has a value of 3 or less. Therefore, VSWR can be improved by about 1.5 dB or more in N38 band by setting the second gap between the third and fifth conductive patterns 1123 and 1125, forming the interdigital structure, of the second radiator structure 1120 to 0.2 mm. In relation to this, a horizontal gap between the concave and convex structures of the third and fifth conductive patterns 1123 and 1125 may also be set to 0.2 mm, but is not limited thereto.

Figure 12B:
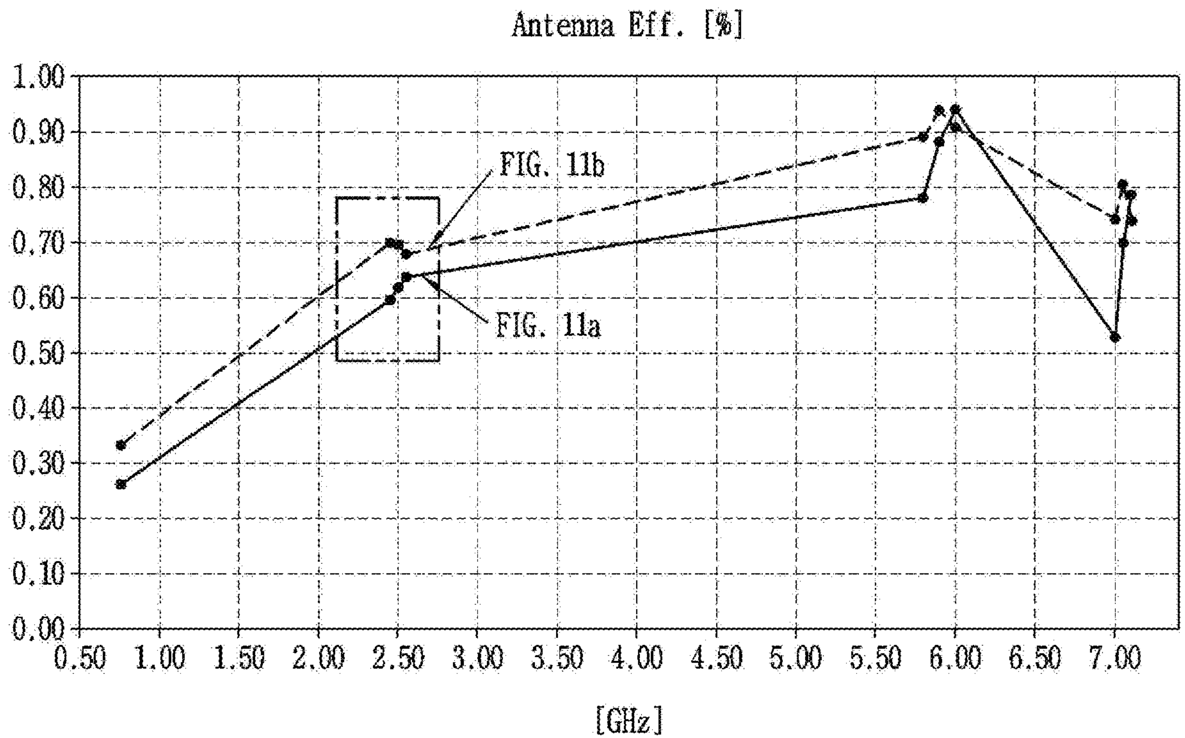

Referring to FIGS. 11A and 12B, when the first gap between the third and fifth conductive patterns 1123*a* and 1125*a* of the second radiator structure 1120 is 1.1 mm, antenna efficiency has a value of about 60%. On the other hand, referring to FIGS. 11B and 12A, when the second gap between the third and fifth conductive patterns 1123 and 1125, forming the interdigital structure, of the second radiator structure 1120 is 0.2 mm, antenna efficiency has a value of about 70%. Therefore, the antenna efficiency can be improved by about 1 dB or more in N38 band by setting the second gap between the third and fifth conductive patterns 1123 and 1125, forming of the interdigital structure, of the second radiator structure 1120 to 0.2 mm. In relation to this, a horizontal gap between the concave and convex structures of the third and fifth conductive patterns 1123 and 1125 may also be set to 0.2 mm, but is not limited thereto.

Referring to FIGS. 11A to 12B, the gap between the third and fifth conductive patterns 1123 and 1125, forming the interdigital structure, of the second radiator structure 1120 may be set to be equal to or less than a threshold gap to increase an amount of mutual coupling between the third and fifth conductive patterns 1123 and 1125. Accordingly, antenna performance can be improved by increasing the amount of coupling between the third and fifth conductive patterns 1123 and 1125. Meanwhile, antenna performance may be improved by adjusting the gap between the third and fifth conductive patterns 1123 and 1125 or by adjusting the gap between the second and third conductive patterns 1122 and 1123.

Regarding antenna performance, VSWR characteristics and antenna efficiency of FIGS. 12A and 12B can be improved. In this regard, radiation resistance may be improved by adjusting the gap between the third and fifth conductive patterns 1123 and 1125 or by adjusting the gap between the second and third conductive patterns 1122 and 1123.

Figure 13:
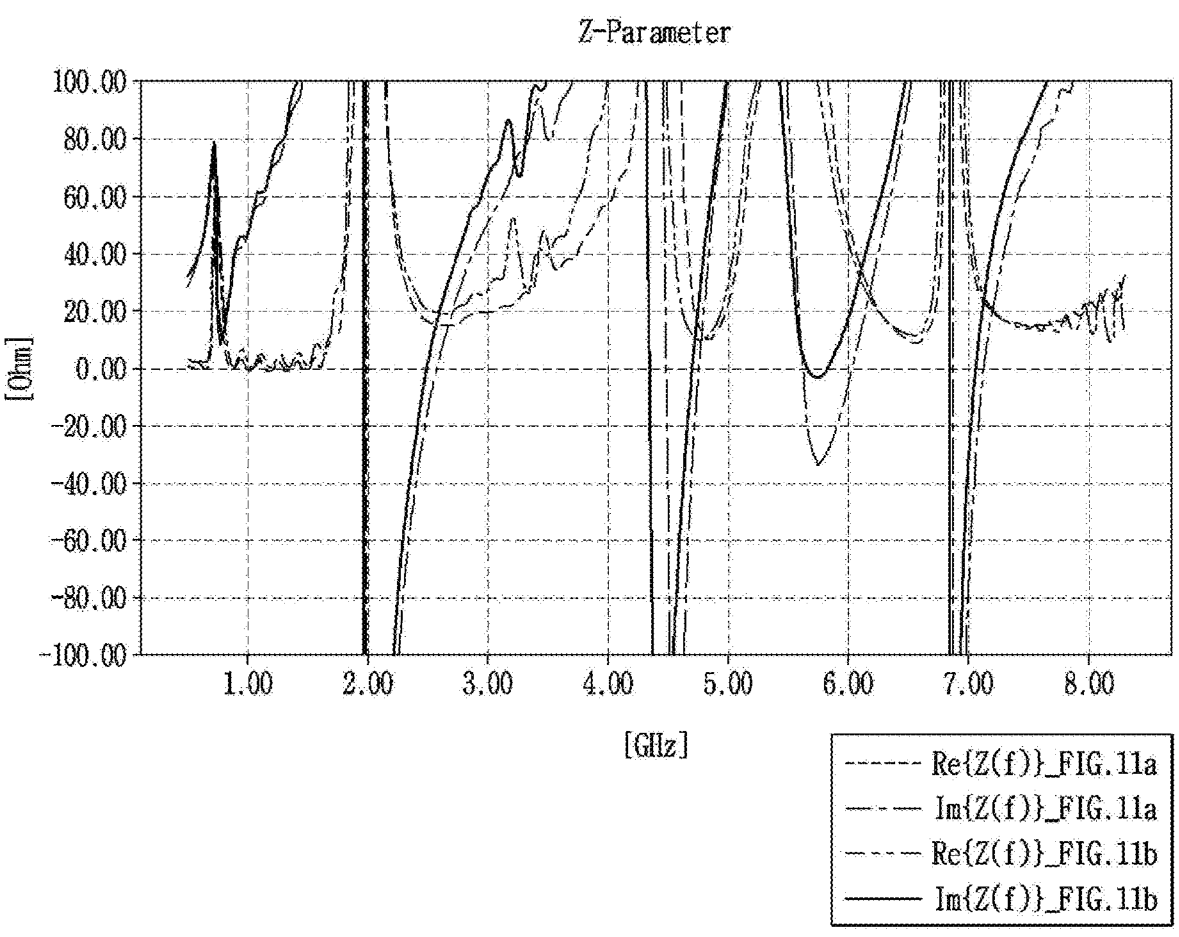
FIG. 13 is a view illustrating a real number part and an imaginary number part of radiation resistance in the first and second antenna structures of FIGS. 11A and 11B.

In this regard, FIG. 13 is a view illustrating a real number part and an imaginary number part of radiation resistance in the first and second antenna structures of FIGS. 11A and 11B. Referring to FIGS. 11A and 13, first radiation resistance of the first antenna structure in n38 band has a value of 20 ohm or less. On the other hand, referring to FIGS. 11B and 13, second radiation resistance of the second antenna structure in n38 band has a value of 20 ohm or more, which is higher than the first radiation resistance. Therefore, the radiation resistance can increase to a threshold resistance or more by adjusting the gap between the third and fifth conductive patterns 1123 and 1125 or the gap between the second and third conductive patterns 1122 and 1123 to a threshold value or less, thereby improving antenna performance.

Figure 14A:
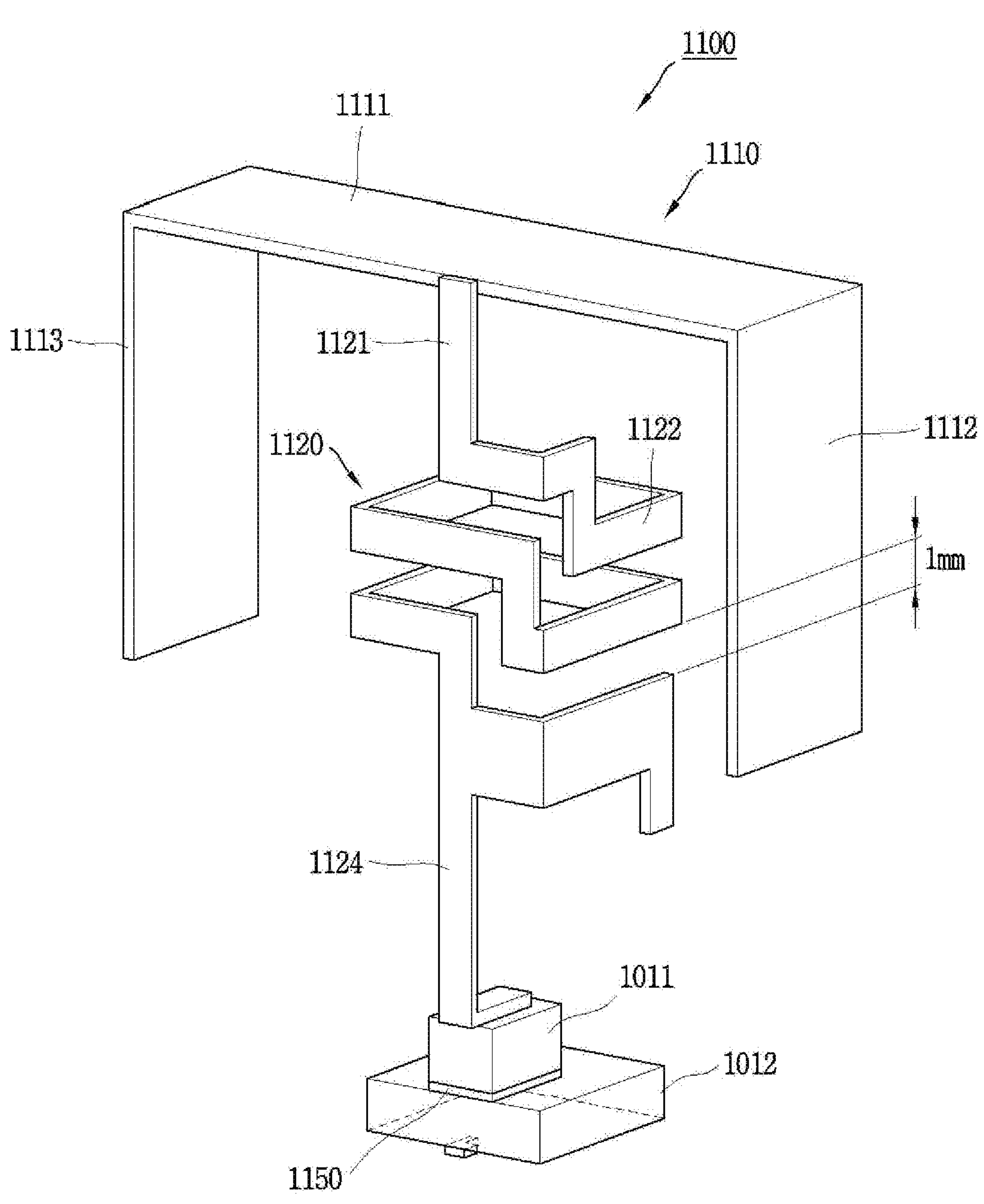
FIGS. 14A to 14C are diagrams illustrating first to third antenna structures in which a spacing between conductive patterns is changed to a first spacing to a third spacing.
Figure 14B:
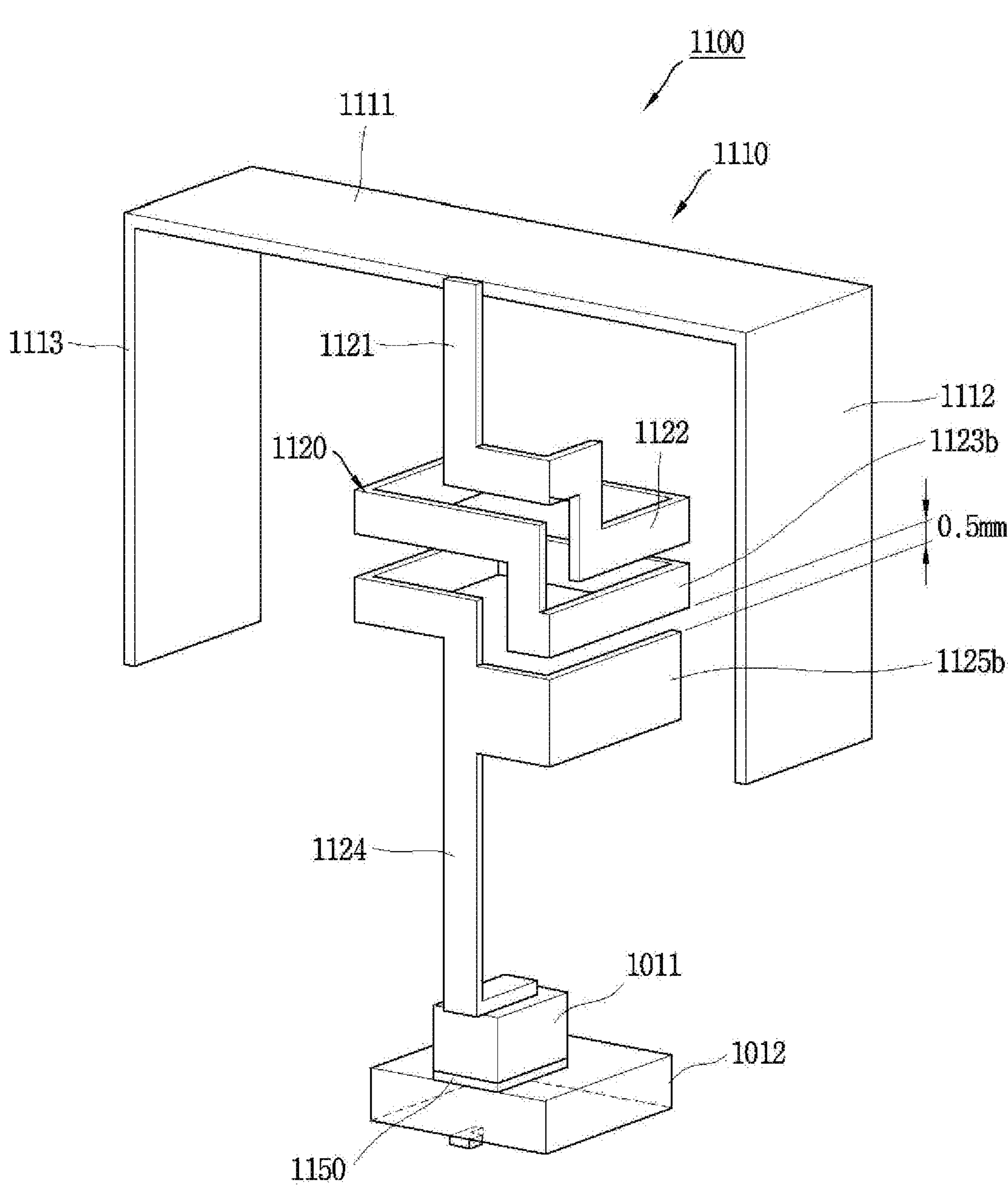
Figure 14C:
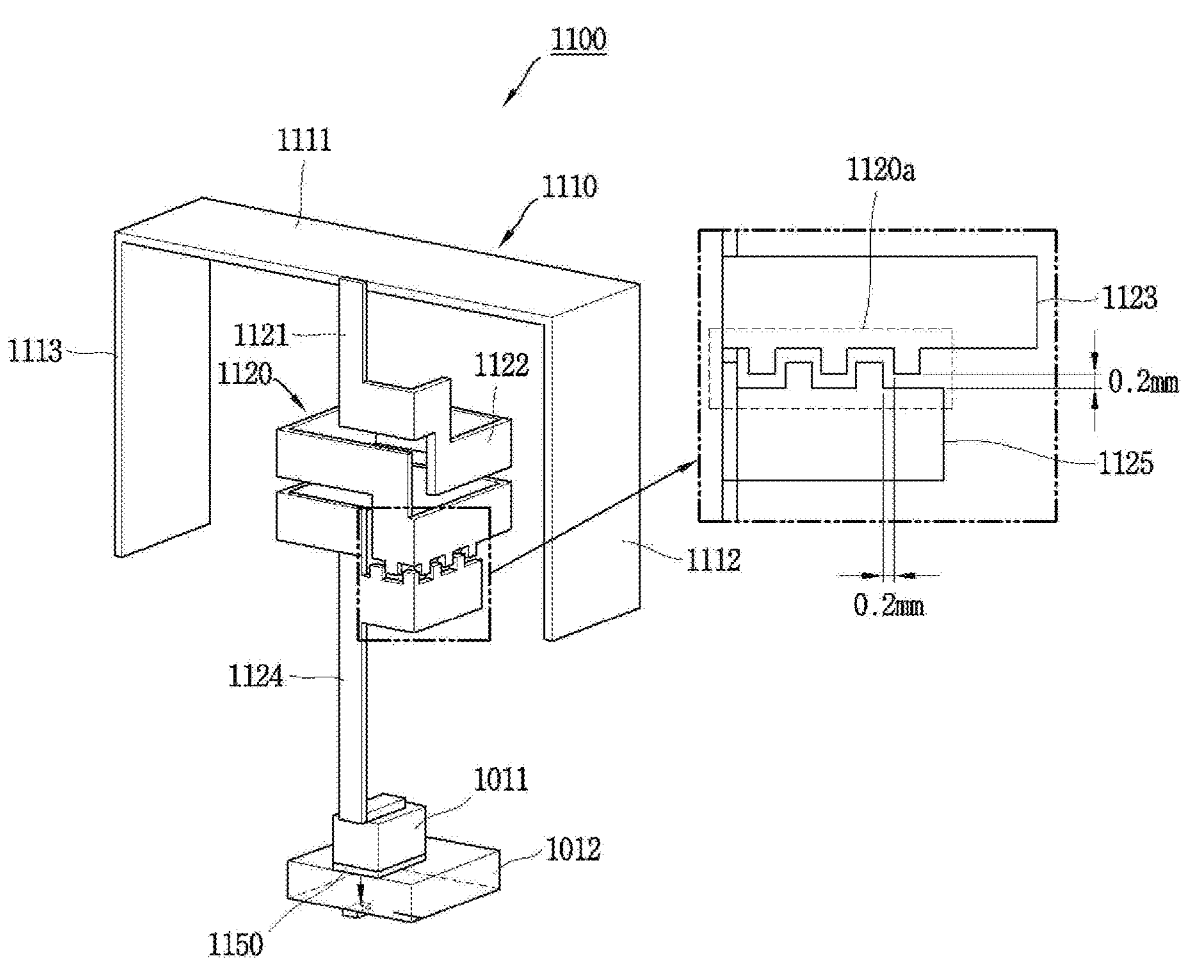

Hereinafter, changes in performance of antenna structures through a gap adjustment between conductive patterns according to various embodiments of the present disclosure will be described. In this regard, FIGS. 14A to 14C are diagrams illustrating first to third antenna structures in which gaps between conductive patterns are changed to a first gap to a third gap. Meanwhile, FIG. 15 is a diagram of comparing VSWR according to the first to third antenna structures of FIGS. 14A to 14C.

Figure 15:
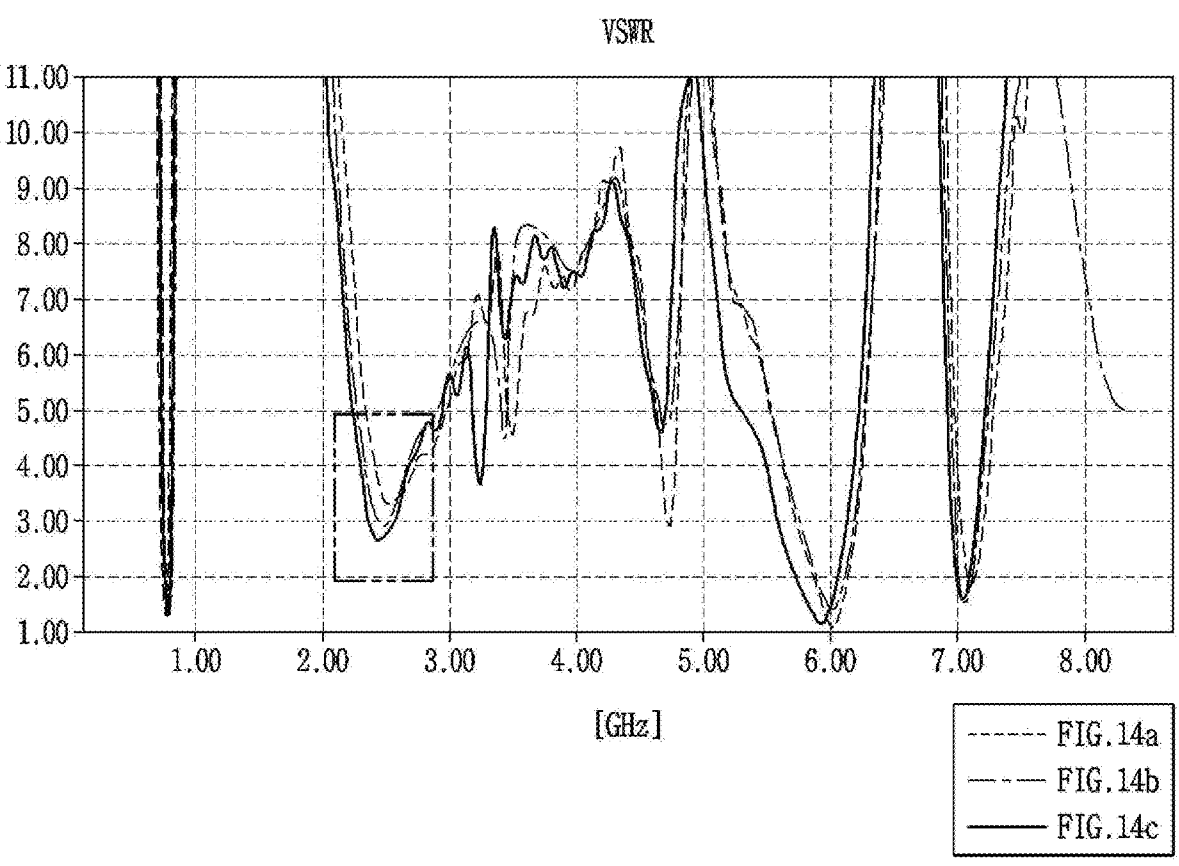
FIG. 15 is a diagram of comparing VSWR according to the first to third antenna structures of FIGS. 14A to 14C.

Referring to FIGS. 14A and 15, when a first gap between third and fifth conductive patterns 1123*a* and 1125*a* is set to 1 mm, VSWR has a value of 3 dB or more. Referring to FIGS. 14B and 15, VSWR can be improved by reducing a second gap between the third and fifth conductive patterns 1123*a* and 1125*a* to be shorter than the first gap. When the second gap between the third and fifth conductive patterns 1123*b* and 1125*b* is set to 0.5 mm, VSWR has a value of about 3 dB.

Referring to FIGS. 14C and 15, VSWR can be improved by reducing a third gap between the third and fifth conductive patterns 1123 and 1125 to be shorter than the second gap. When the third gap between the third and fifth conductive patterns 1123 and 1125 is set to 0.2 mm, VSWR has a value of 3 dB or less. The third and fifth conductive patterns 1123 and 1125 may form an interdigital structure, which has concave and convex structures on end portions thereof.

Referring to FIGS. 14A to 15, an amount of mutual coupling between conductive patterns can increase by reducing the gap between the third and fifth conductive patterns of the second radiator structure 1120. Additionally, an amount of mutual coupling between conductive patterns can increase by reducing the gap between the second and third conductive patterns of the second radiator structure 1120. Accordingly, an amount of coupling between adjacent conductive patterns in the second radiator structure 1120 can increase, thereby improving return loss characteristics in n38 band.

Referring to FIGS. 5A to 15, a gap between the bottom of the third conductive pattern 1123 and the top of the fifth conductive pattern 1225 disposed on the first side surface S1 may be set to 1.0 mm or less. Accordingly, the second radiator structure 1120 may be configured to operate in the second frequency band, which is n38 band. As another example, the gap between the bottom of the third conductive pattern 1123 and the top of the fifth conductive pattern 1225 disposed on the first side surface S1 may be set to 0.5 mm or less. The bottom of the third conductive pattern 1123 and the top of the fifth conductive pattern 1225 may form the interdigital structure with the concave and convex structures.

Figure 16:
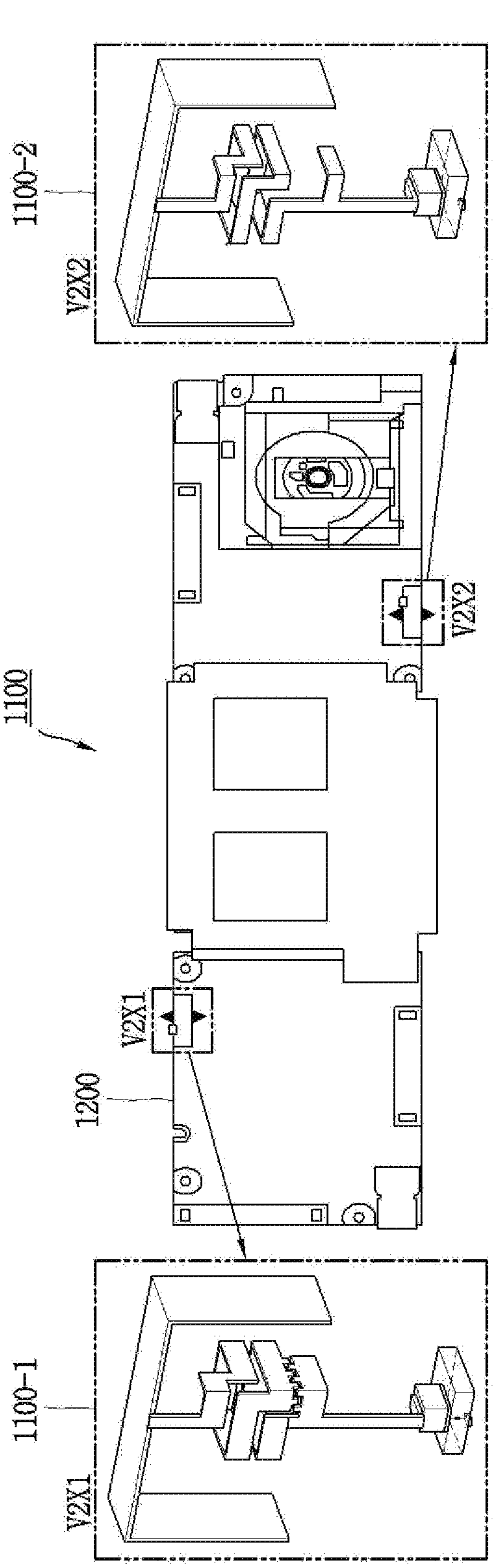
FIG. 16 is a diagram illustrating a configuration in which V2X antennas according to the present disclosure are disposed on a PCB mounted on a vehicle.
Figure 17A:
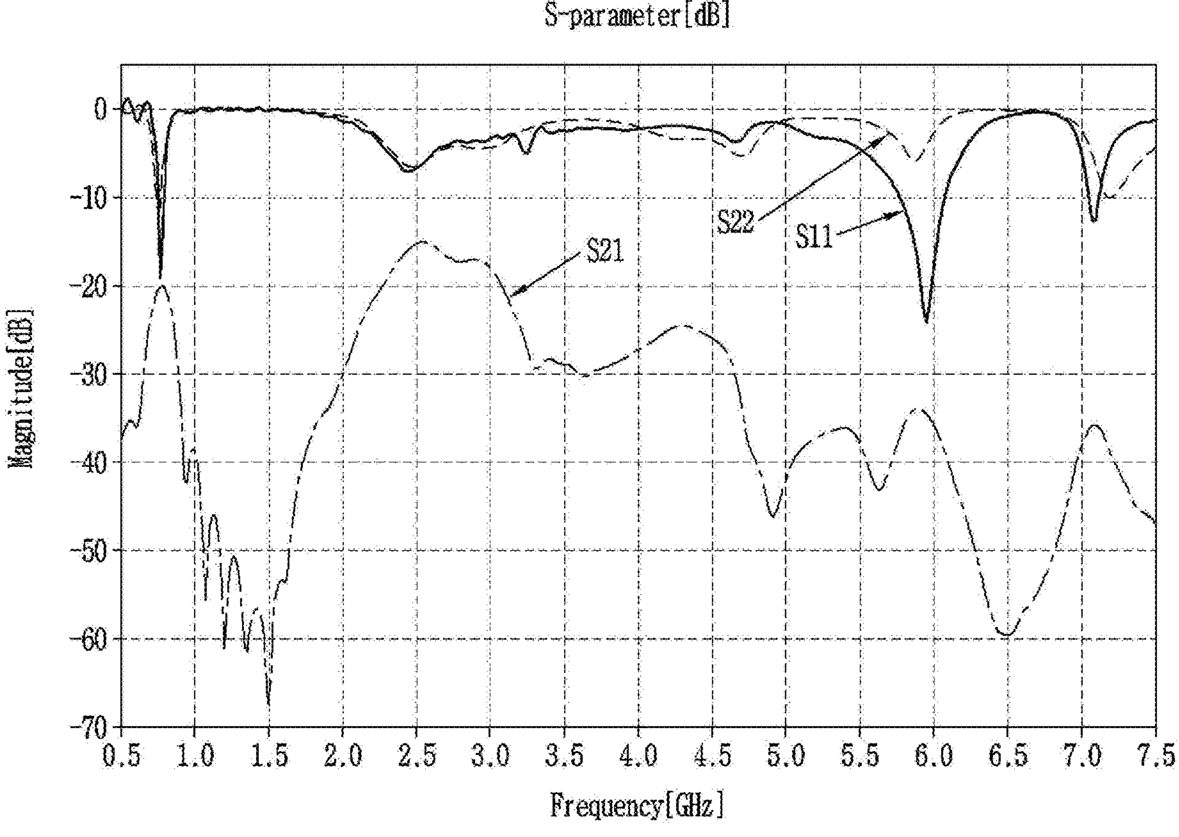
FIGS. 17A and 17B are diagrams illustrating scattering coefficient characteristics and antenna efficiency of first and second V2X antennas.
Figure 17B:
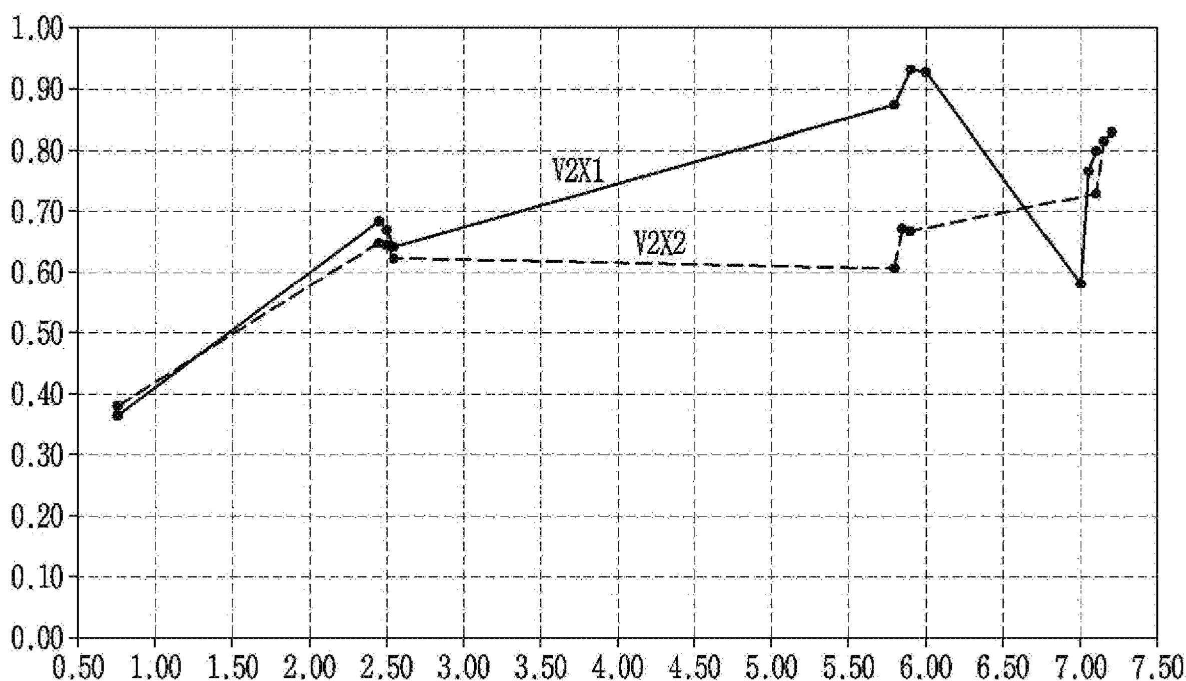

Meanwhile, a V2X antenna structure according to the present disclosure may be disposed at a different position on a main substrate mounted on a vehicle. In this regard, FIG. 16 is a diagram illustrating a configuration in which V2X antennas according to the present disclosure are disposed on a PCB mounted on a vehicle. Meanwhile, FIGS. 17A and 17B are diagrams illustrating scattering coefficient characteristics and antenna efficiency of first and second V2X antennas. In addition, FIGS. 18A and 18B are diagrams illustrating radiation patterns of first and second V2X antennas on a horizontal surface for each of first to fourth frequency bands.

Referring to FIGS. 16 and 17A, reflection coefficients S11 and S22 of first and second V2X antennas 1100-1 and 1100-2 resonate in first to fourth frequency bands. Accordingly, the first and second V2X antennas 1100-1 and 1100-2 may operate as radiators in the first to fourth frequency bands. In addition, an isolation degree S21 between the first and second V2X antennas 1100-1 and 1100-2 may have a value of 15 dB or more in a full band, thereby suppressing interference between the first and second V2X antennas 1100-1 and 1100-2. Therefore, the first and second V2X antennas 1100-1 and 1100-2 can operate simultaneously in a diversity mode or MIMO mode.

Referring to FIGS. 16 and 17B, antenna efficiencies of the first and second V2X antennas 1100-1 and 1100-2 have values of −4 dB or more in the full band. Accordingly, the first and second V2X antennas 1100-1 and 1100-2 may operate as radiators in the first to fourth frequency bands.

Figure 18A:
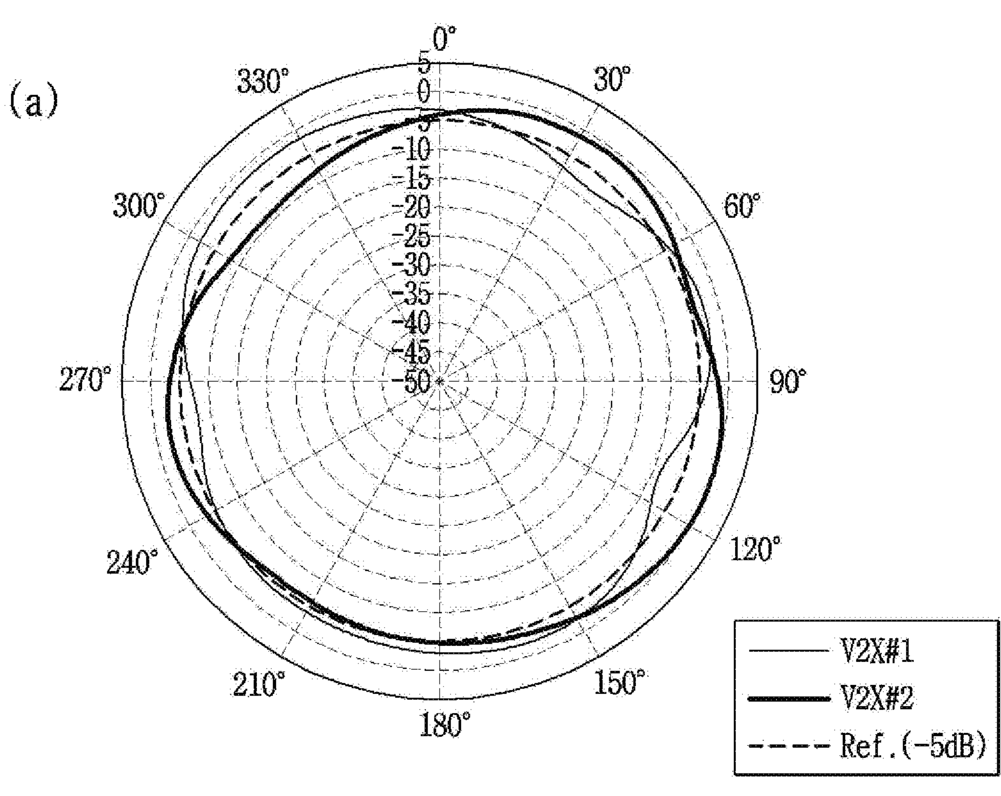
FIGS. 18A and 18B are diagrams illustrating radiation patterns of first and second V2X antennas on a horizontal surface for each of first to fourth frequency bands.
Figure 18A:
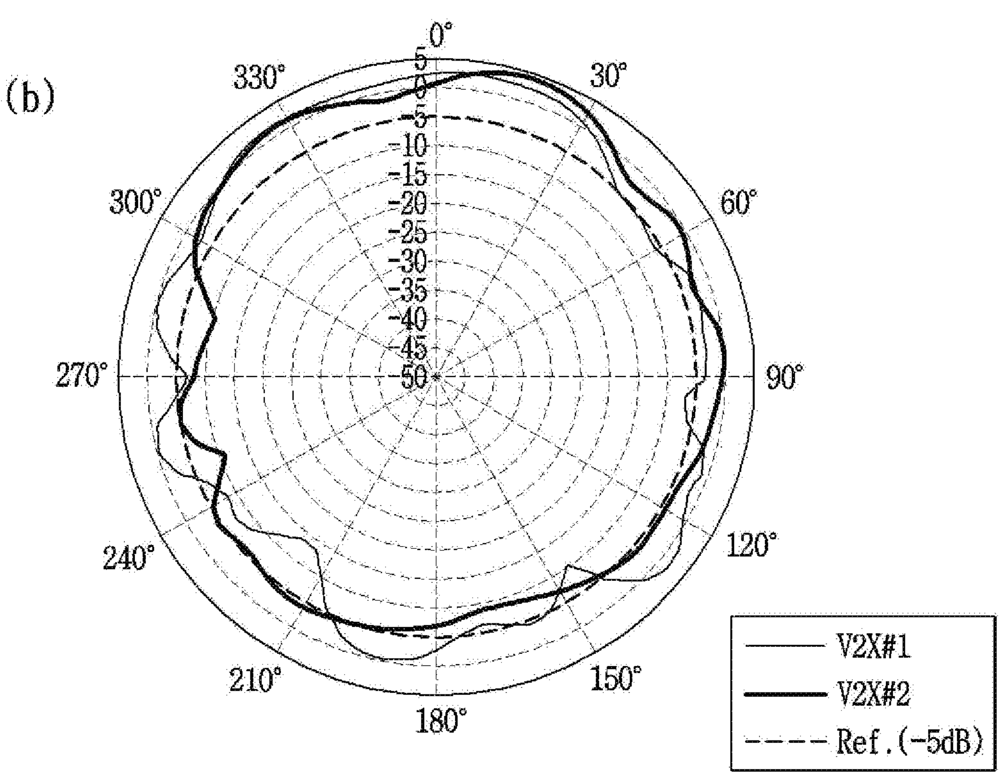
Figure 18B:
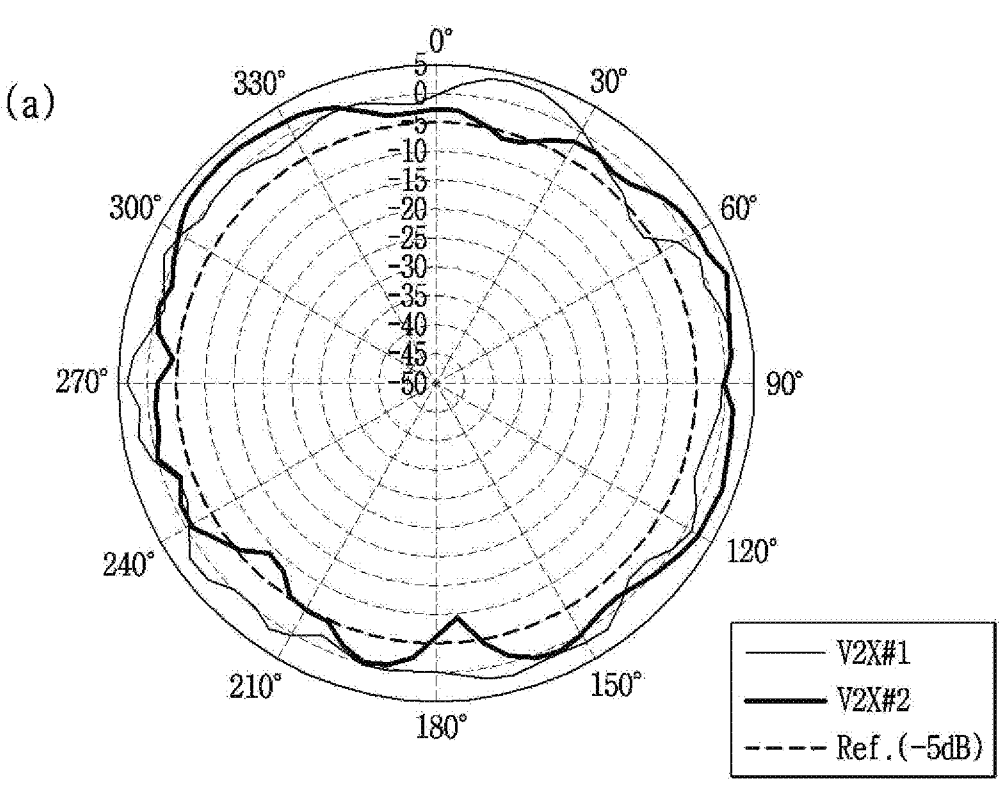
Figure 18B:
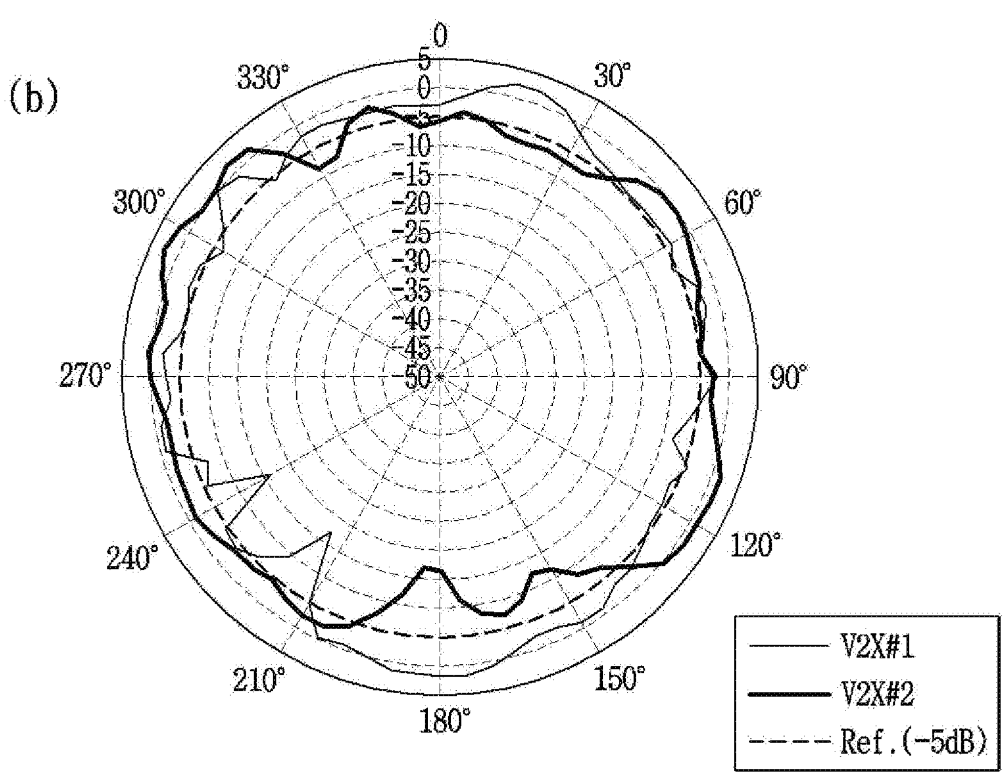

Referring to FIG. 16 and (a) of FIG. 18A, the first frequency band is 760 MHz band, and beam peaks of the first and second V2X antennas 1100-1 and 1100-2 are −30 degrees and 30 degrees, respectively. Therefore, an isotropic beam pattern can be implemented on a horizontal plane when the first and second V2X antennas 1100-1 and 1100-2 are controlled to operate simultaneously and operate in the diversity mode.

Referring to FIG. 16 and (b) of FIG. 18A, the second frequency band is 2.6 GHz band, which is n38 band, and radiation patterns of the first and second V2X antennas 1100-1 and 1100-2 may be formed as isotropic beam patterns in all directions. Referring to FIG. 16 and (a) of FIG. 18B, the third frequency band is 5.9 GHz band, which is n47 band, and beam peaks of the first and second V2X antennas 1100-1 and 1100-2 are symmetrical to each other based on 0 degree. Therefore, the isotropic beam pattern can be implemented on the horizontal plane when the first and second V2X antennas 1100-1 and 1100-2 are controlled to operate simultaneously and operate in the diversity mode.

Referring to FIG. 16 and (b) of FIG. 18B, the fourth frequency band is 7 GHz band, and beam peaks of the first and second V2X antennas 1100-1 and 1100-2 are symmetrical to each other based on 0 degree. Therefore, the isotropic beam pattern can be implemented on the horizontal plane when the first and second V2X antennas 1100-1 and 1100-2 are controlled to operate simultaneously and operate in the diversity mode.

Referring to FIGS. 16, 18A, and 18B, an omni-directional radiation pattern can be secured when combining the first and second V2X antennas 1100-1 and 1100-2 to operate simultaneously. Null points of the first and second V2X antennas 1100-1 and 1100-2 are formed at different positions. Accordingly, the radiation pattern is improved at each null point when combining the first and second V2X antennas 1100-1 and 1100-2 to operate simultaneously. Therefore, when combining the first and second V2X antennas 1100-1 and 1100-2, the radiation pattern value can be implemented to have a value of −5 dB or more in all directions.

Referring to FIGS. 5A, and 7 to 9C, and 16, the first antenna module 1100-1 by the first radiator structure 1110 to the third radiator structure 1130 may operate as a first antenna for V2X communication. The first antenna 1100-1 may be configured to receive and transmit signals of the first to fourth frequency bands.

The antenna module 1100 may include a first antenna module 1100-1 and a second antenna module 1110-2. The second antenna module 1100-2 by the first radiator structure 1110 to the third radiator structure 1130 may operate as a second antenna for V2X communication. The second antenna 1100-2 may be configured to receive and transmit signals of the first to fourth frequency bands. The first antenna module 1100-1 may be disposed in a top region of one side of the PCB 1200. The second antenna module 1100-2 may be disposed in a bottom region of another side of the PCB 1200.

The antenna system 1000 disposed on the vehicle may be implemented on the PCB 1200. The antenna system 1000 may be controlled to simultaneously transmit and receive signals through the first antenna 1100-1 and the second antenna 1100-2 for the V2X communication, such that the first antenna 1100-1 and the second antenna 1100-2 can operate in the diversity mode.

The broadband V2X antennas according to the present disclosure may be disposed as a first antenna 1100-1 and a second antenna 1100-2 in different regions of the PCB mounted on the vehicle. The first antenna 1100-1 and the second antenna 1100-2 may form a low elevation beam pattern at a certain angle in a vertical direction with respect to a horizontal surface, as illustrated in FIGS. 3A and 3B. The first antenna 1100-1 and the second antenna 1100-2 may form low elevation beam patterns in the first to fourth frequency bands. A low elevation beam pattern means that a beam peak is formed at a certain angle toward the top of a vehicle relative to a horizontal plane. Additionally, the low elevation beam pattern means that the beam pattern is formed in the range of 90−a to 90+a degrees in a vertical direction relative to a vertical axis of the vehicle.

When both the first antenna 1100-1 and the second antenna 1100-2 operate, omni-directional beam patterns may be formed in the horizontal direction, as illustrated in FIGS. 18A and 18B.

Figure 19A:
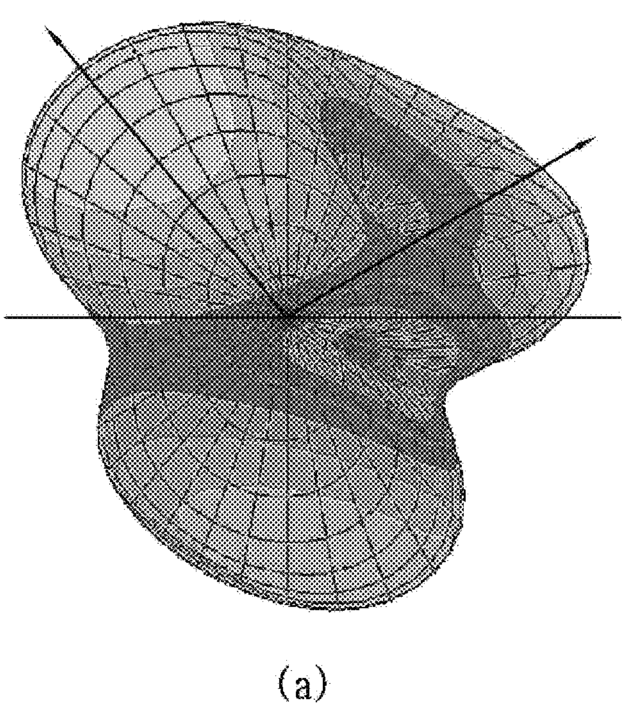
FIGS. 19A and 19B are diagrams illustrating 3D radiation patterns in the first to fourth frequency bands of the broadband V2X antennas of FIG. 5A.
Figure 19A:
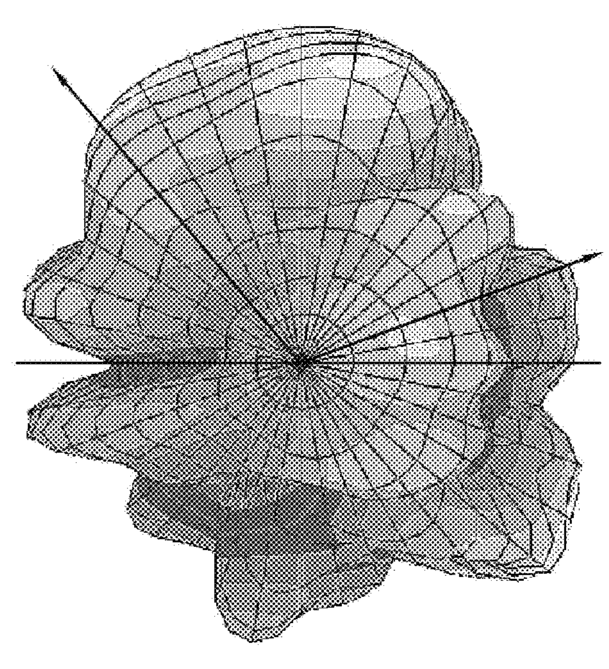
Figure 19B:
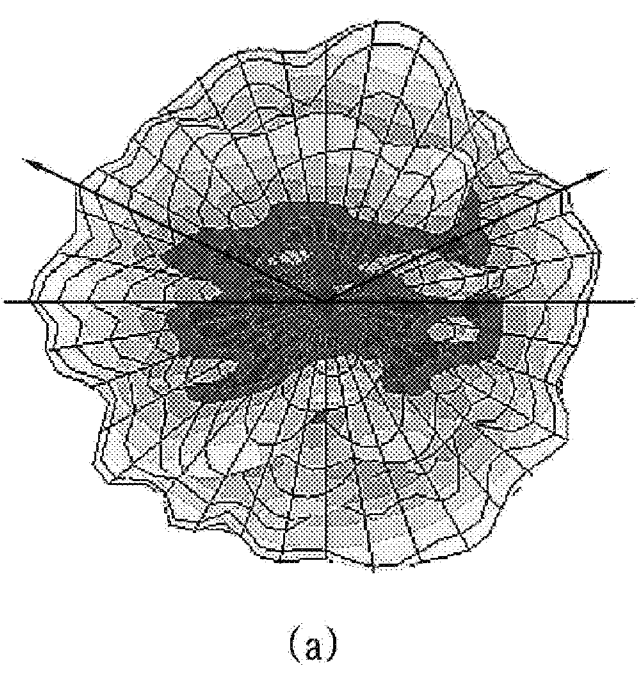
Figure 19B:
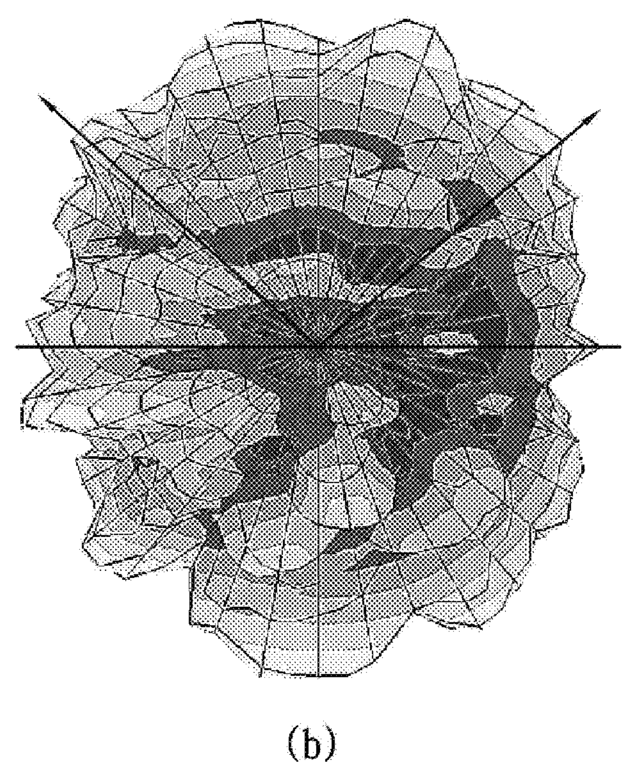

Meanwhile, FIGS. 19A and 19B are diagrams illustrating 3D radiation patterns in the first to fourth frequency bands of the broadband V2X antennas of FIG. 5A. Referring to (a) of FIG. 19A, a low elevation beam pattern is formed at a certain angle in the vertical direction relative to the horizontal plane in the first frequency band of 760 MHz. Referring to (b) of FIG. 19A, a low elevation beam pattern is formed at a certain angle in the vertical direction relative to the horizontal plane in the second frequency band of 2550 MHz. On the other hand, a second beam pattern in the second frequency band has more enhanced directivity than a first beam pattern in the first frequency band, thereby increasing antenna gain.

Referring to (a) of FIG. 19B, a low elevation beam pattern is formed at a certain angle in the vertical direction relative to the horizontal plane in the third frequency band of 5980 MHz. On the other hand, a third beam pattern in the third frequency band has more enhanced directivity than the second beam pattern in the second frequency band, thereby increasing antenna gain. The third beam pattern has more fluctuation than the first and second beam patterns, but overall has a low elevation beam pattern in the vertical direction and an omni-directional pattern in the horizontal direction.

Referring to (b) of FIG. 19B, a low elevation beam pattern is formed at a certain angle in the vertical direction relative to the horizontal plane in the fourth frequency band of 7050 MHz. A fourth beam pattern in the fourth frequency band has more fluctuation than the first and second beam patterns, but overall has a low elevation beam pattern in the vertical direction and an omni-directional pattern in the horizontal direction.

Referring to (b) of FIG. 19B, a low elevation beam pattern is formed at a certain angle in the vertical direction relative to the horizontal plane in the fourth frequency band of 7050 MHz. On the other hand, a beam pattern in the second frequency band has more enhanced directivity than a beam pattern in the first frequency band, thereby increasing antenna gain.

Hereinafter, an average gain in each zone will be described below when the V2X antennas operating as broadband antennas in the first to fourth frequency bands through the first to third radiator structures according to the present disclosure are mounted on the roof of a vehicle. In this regard, FIG. 20 is a diagram illustrating definition of front, rear, and side surface regions (zones) of a vehicle and an average gain of V2X antennas operating in first to fourth frequency bands according to the present disclosure.

Figure 20:
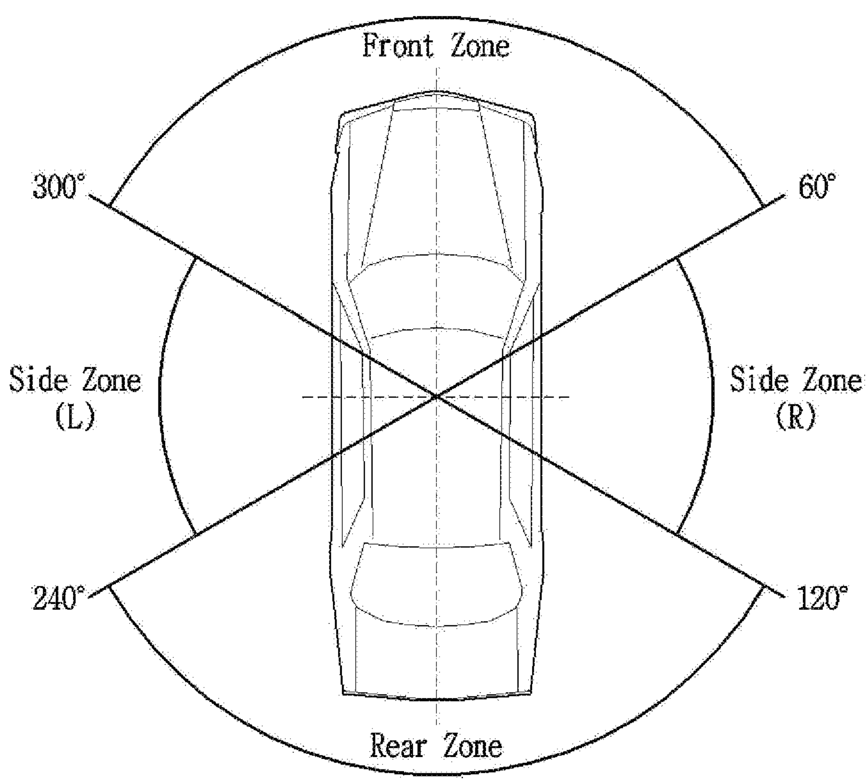
FIG. 20 is a diagram illustrating definition of front, rear, and side surface regions of a vehicle and an average gain of V2X antennas operating in first to fourth frequency bands according to the present disclosure.

Referring to FIG. 20, an average gain in a low elevation range of 84 degrees to 96 degrees in the vertical direction relative to the vertical axis of the vehicle is illustrated. Although the average gain in the front and rear regions is slightly higher than the average gain in the side regions, a target gain is also satisfied in the side regions. The target gain in the side regions is −9 dBi, which is lower than a target gain of −6 dBi in the front and rear regions. This difference between the target gains is caused because V2X antennas mainly communicate with base stations, RSUs, or other vehicles in the front and rear regions.

In the first to third frequency bands in which the first and second radiator structures 1110 and 1120 of FIG. 5A operate as main radiators, the average gain generally tends to increase as the frequency band increases. This is because, as mentioned above, the beam pattern of the antenna has more enhanced directivity at a higher frequency band.

Meanwhile, the average gain in 7.05 GHz band, which is the fourth frequency band, is slightly lower than the average gain in the third frequency band. This decrease in gain results from that the third radiator structure 1120 of FIG. 5A, unlike the first and second radiator structures 1110 and 1120, is disposed on one plane of the dielectric substrate below the antenna module 1000. On the other hand, the first and second radiator structures 1110 and 1120 are formed in a three-dimensional structure, so a space occupied by the antenna structure is larger than that of the third radiator structure 1120.

The foregoing description has been given of the broadband V2X antenna module provided with a plurality of radiator structures according to the present disclosure. It will be clearly understood by those skilled in the art that various changes and modifications to the aforementioned embodiments related to the antenna module are made without departing from the idea and scope of the present disclosure. Therefore, it should be understood that such various changes and modifications to the implementations fall within the scope of the appended claims.

Hereinafter, a vehicle having a broadband V2X antenna module having a plurality of radiator structures according to another aspect of the present disclosure will be described. In this regard, the vehicle on which the broadband V2X antenna module is disposed may be combined with all of the above-described technical features for the broadband V2X antenna module having the plurality of radiator structures.

Figure 21:
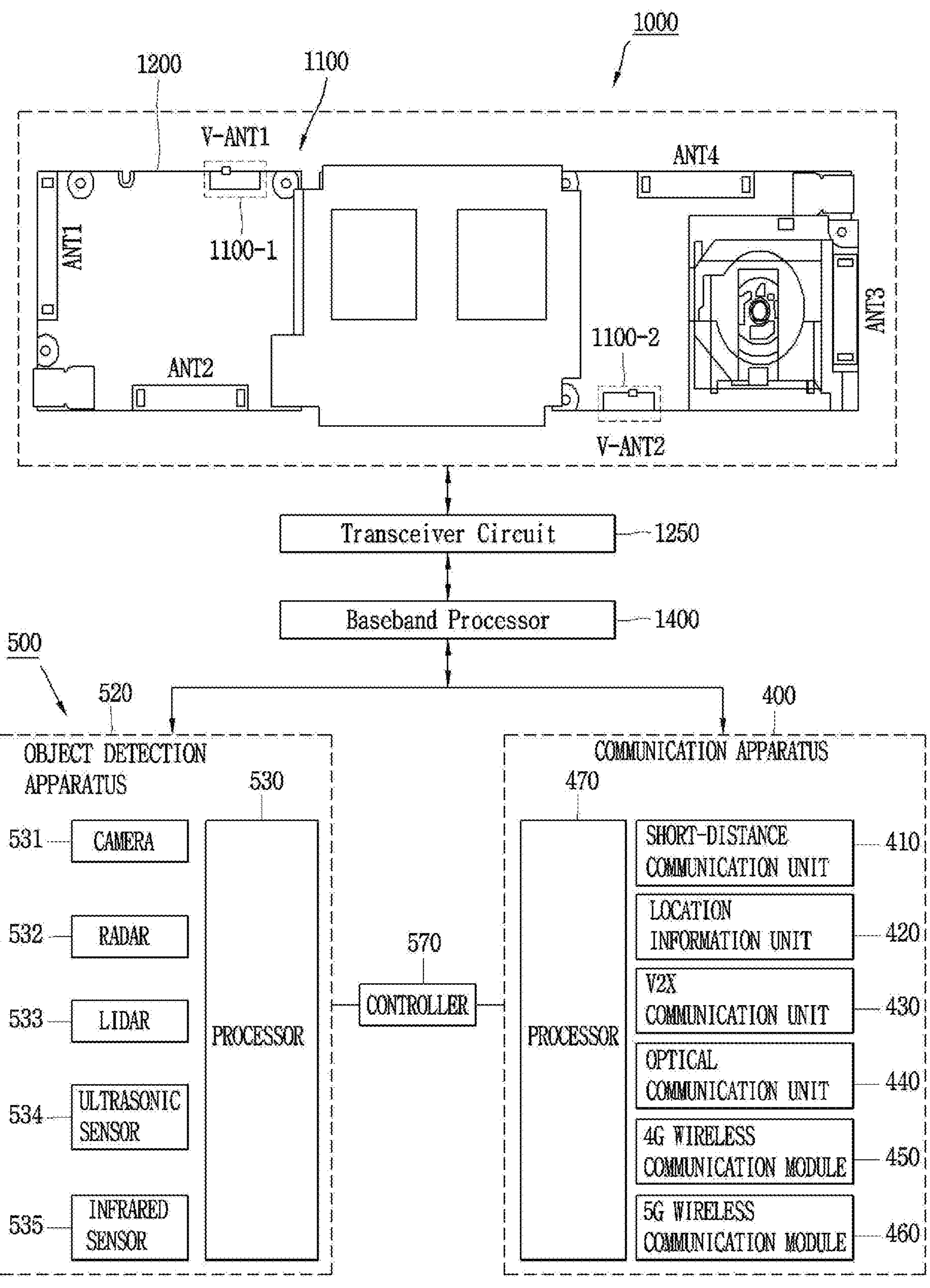
FIG. 21 is a block diagram illustrating an antenna module and a vehicle on which the antenna module is mounted according to the present disclosure.

Meanwhile, FIG. 21 is a block diagram illustrating an antenna module and a vehicle on which the antenna module is mounted according to the present disclosure. Specifically, FIG. 20 is a block diagram of a vehicle illustrating that an antenna module corresponding to an antenna system is mounted inside a roof of the vehicle to perform communications with adjacent electronic devices, vehicles, infrastructures.

Referring to FIG. 21, the broadband antenna module 1000 may be mounted on the vehicle. The antenna module 1000 may perform short-range communication, wireless communication, V2X communication, and the like by itself or through the communication apparatus 400. To this end, the baseband processor 1400 may perform control such that a signal is received from or transmitted to the adjacent vehicle, the RSU, and the base station through the antenna module 1000.

Alternatively, the baseband processor 1400 may perform control such that a signal is received from or transmitted to the adjacent vehicle, the RSU, the adjacent object, and the base station through the communication apparatus 400. Here, the information related to adjacent objects may be acquired through the object detecting apparatus such as the camera 531, the radar 532, the LiDAR 533, and the sensors 534 and 535 of the vehicle 300. Alternatively, the baseband processor 1400 may control the communication device 400 and the antenna module 1000 such that a signal is received from or transmitted to the adjacent vehicle, the RSU, the adjacent object, and the base station.

Referring to FIGS. 1A to 21, the vehicle 500 having the antenna module 1000 may include the antenna module 1100, the transceiver circuit 1250, and the baseband processor 1400. The vehicle 500 may further include the object detecting apparatus 520. The vehicle 500 may further include the communication apparatus 400. Here, the communication apparatus 400 may be configured to perform wireless communication through the antenna unit.

Referring to FIGS. 1A to 21, the vehicle 500 may include the antenna module 1000. The antenna module 1000 may be disposed on the bottom of the roof of the vehicle, and perform communication with at least one of an adjacent vehicle, a Road Side Unit (RSU), and a base station through the processor. Since the antenna module 1000 performs telematics operations through wireless communication in the vehicle, it may also be referred to as a telematics module. In this regard, the antenna PCB 1200 in the antenna module 1000 may be coupled with the telematics module that performs a telematics function. In this regard, an antenna PCB 1200 and a telematics module may be coupled to interface with each other on the same plane, or the telematics module may be disposed below the antenna PCB 1200.

Hereinafter, a vehicle 500 having an antenna module 1000 according to another aspect of the present disclosure will be described, with reference to FIGS. 1A to 21. The vehicle 500 may include an antenna module 1000 disposed below the roof of the vehicle. The vehicle 500 may further include a processor 1400 disposed inside or outside the antenna module 1000 and configured to communicate with at least one of an adjacent vehicle, a road side unit (RSU), and a base station.

The antenna module 1000 may include a first radiator structure 1110 including a top conductive pattern 1111 and first and second side conductive patterns 1112 and 1113 extending from both end portions of the top conductive pattern. The antenna module 1000 may include a second radiator structure 1120 that is connected to the top conductive pattern 1111 and in which a plurality of conductive patterns are interconnected to form first to fourth side surfaces.

The second radiator structure 1120 may be configured to operate in the second frequency band and the third frequency band that are higher than the first frequency band. The second radiator structure 1120 may be provided with helical lines disposed on the first to fourth side surfaces. The first radiator structure 1110 may be configured to operate in the first frequency band by the helical lines of the second radiator structure 1120. The first frequency band may be a 760 MHz band, the second frequency band may be a 2.6 GHz band, which is n38 band, the third frequency band may be a 5.9 GHz band, which is n47 band, and all of the first to third frequency bands may be bands allocated for V2X communication, but are not limited thereto.

The antenna module 1000 may include a third radiator structure 1130 that has a conductive pattern 1130*a* connected to a feeder 1150 through a via hole VH, and operates in the fourth frequency band higher than the third frequency band.

The second radiator structure 1120 may include a first conductive pattern 1121 that is connected to one end portion of the top conductive pattern 1111 and forms an upper branch. The second radiator structure 1120 may include a second conductive pattern 1122 which has one end portion connected to the first conductive pattern 1121 and another end portion bent. The second radiator structure 1120 may include a third conductive pattern 1123 that has one end portion connected to the another end portion of the second conductive pattern 1122 and another end portion connected to one end portion of the lower branch 1124. The second radiator structure 1120 may further include a fourth conductive pattern 1124 that has one end portion connected to the another end portion of the third conductive pattern 1123 and another end portion bent and disposed on the dielectric substrate 1011. The second radiator structure 1120 may include a fifth conductive pattern 1125 that extends from a point on one side of the fourth conductive pattern 1124.

One portion SP1 of the second conductive pattern 1122, one portion SP1 of the third conductive pattern 1123, and one portion SP1 of the fifth conductive pattern 1125 may be disposed on the first side surface S1 to face the first side conductive pattern 1122.

A lower portion of the third conductive pattern 1123 and an upper portion of the fifth conductive pattern 1125 disposed on the first side surface S1 may form an interdigital structure 1120*a* in which concave structures and convex structures are complementarily disposed. Accordingly, the second radiator structure 1120 can operate in the second frequency band according to the interdigital structure 1120*a*.

The antenna module 1100 may include a first antenna (V-ANT1) 1100-1 that is disposed in an upper region of one side of the PCB 1200 mounted on the vehicle, and is provided with a first radiator structure 1110 to a third radiator structure 1120. The antenna module 1100 may further include a second antenna (V-ANT1) 1100-2 that is disposed in a lower region of another side of the PCB 1200, and is provided with the first radiator structure 1110 to the third radiator structure 1120.

Various types of antenna elements may be disposed in the antenna module 1000. Each type of antenna elements may also be implemented with multiple antenna elements to implement MIMO. A plurality of antennas may be disposed for 4G/5G communications. The plurality of antennas may include a first antenna ANT1 and a second antenna ANT2. The plurality of antennas may include a third antenna ANT3 and a fourth antenna ANT4. In this regard, the positions and shapes of the first to fourth antennas ANT1 to ANT4 may vary depending on the application.

The processor 1400 may perform a diversity operation for V2X communication in the first frequency band through the first antenna (V-ANT1) 1110-1 and the second antenna (V-ANT2) 1100-2. The processor 1400 may perform a diversity operation for V2X communication in the second frequency band or the third frequency band higher than the first frequency band through the first antenna (V-ANT1) 1110-1 and the second antenna (V-ANT2) 1100-2. The processor 1400 may perform a diversity operation for V2X communication in the fourth frequency band higher than the third frequency band through the first antenna (V-ANT1) 1110-1 and the second antenna (V-ANT2) 1100-2.

The processor 1400 may perform MIMO in the first frequency band through the first antenna (V-ANT1) 1110-1 and the second antenna (V-ANT2) 1100-2. The processor 1400 may perform diversity or single mode transmission/reception in the first frequency band through the first antenna (V-ANT1) 1100-1 and/or the second antenna (V-ANT2) 1100-2. Accordingly, the processor 1400 can perform switching between a multi-transmission mode such as a MIMO mode and a single transmission mode such as a diversity mode in the first band depending on a communication environment.

The processor 1400 may perform MIMO in the second frequency band and/or the third frequency band higher than the first frequency band through the first antenna (V-ANT1) 1110-1 and the second antenna (V-ANT2) 1100-2. The processor 1400 may perform diversity or single mode transmission/reception in the second frequency band and/or the third frequency band through the first antenna (V-ANT1) 1100-1 and/or the second antenna (V-ANT2) 1100-2. Accordingly, the processor 1400 can perform switching between a multi-transmission mode such as a MIMO mode and a single transmission mode such as a diversity mode in the second band and/or the third band depending on a communication environment.

The transceiver circuit 1250 may be operably coupled to respective antenna elements. The processor 1400 may be operably coupled to the transceiver circuit 1250. The processor 1400 may be a baseband processor corresponding to a modem, but is not limited thereto and may be any processor that controls the transceiver circuit 1250. The processor 1400 of the vehicle may be implemented as a network access device (NAD).

The transceiver circuit 1250 may be operably coupled to the MIMO antennas ANT1 to ANT4. The transceiver circuit 1250 may include a front end module (FEM) such as a power amplifier or a receiving amplifier. As another example, the front end module (FEM) may be disposed between the transceiver circuit 1250 and the antenna, separately from the transceiver circuit 1250. The transceiver circuit 1250 may control the amplitude and/or phase of signals transmitted to the MIMO antennas ANT1 to ANT4 or control only some antenna modules to operate by adjusting the gain or input or output power of the power amplifier or the receiving amplifier.

The processor 1400 may be operably coupled to the transceiver circuit 1250 and may be configured to control the transceiver circuit 1250. The processor 1400 may control the transceiver circuit 1250 to control the amplitude and/or phase of the signals transmitted to the MIMO antennas ANT1 to ANT4 or to operate only some antenna modules. The processor 1400 may perform communication with at least one of the adjacent vehicle, the RSU, and the base station through the transceiver circuit 1250.

In a case where there is a need to simultaneously receive information from various entities such as the adjacent vehicle, the RSU, and the base station for autonomous driving, etc., information may be received and transmitted through MIMO. Accordingly, the vehicle can receive different information from various entities at the same time and thus can improve its communication capacity. Therefore, the communication capacity of the vehicle can be improved through V2X-based diversity or MIMO without increasing a bandwidth.

Alternatively, the vehicle may simultaneously receive the same information from various entities, so as to improve reliability of surrounding information and decrease latency. Accordingly, Ultra Reliable Low Latency Communication (URLLC) can be performed in the vehicle and the vehicle can operate as a URLLC UE. To this end, a base station that performs scheduling may preferentially allocate a time slot for the vehicle operating as the URLLC UE. For this, some of specific time-frequency resources already allocated to other UEs may be punctured.

As described above, the plurality of antennas ANT1 to ANT4 for 4G/5G communication within the antenna module 1000 may operate in the full band including the low band (LB), the mid band (MB), and the high band (HB). Here, the low band (LB) may be referred to as the first (frequency) band and the mid band (MB) and the high band (HB) may be referred to as the second (frequency) band. As another example, when the antenna system 1000 operates in the mid band (MB) and the high band (HB), the middle band (MB) is referred to as a first (frequency) band and the high band (HB) is referred to as a second (frequency) band. The 5G SUB6 band may be the same band as the LTE band in case of LTE re-farming. When 5G NR operates in a band separate from LTE, it may operate in the high band (HB) or a higher band. The 5G SUB6 band operating in the high band (HB) or higher band may also be referred to as a second (frequency) band.

The baseband processor 1400 can perform MIMO through some of the plurality of antenna elements ANT1 to ANT4 in the first frequency band. Also, the baseband processor 1400 can perform MIMO through some of the plurality of antenna elements ANT1 to ANT4 in the second frequency band. In this regard, the baseband processor 1400 can perform MIMO by using antenna elements that are sufficiently spaced apart from each other and disposed by being rotated at a predetermined angle. This can improve isolation between the first and second signals within the same band.

The baseband processor 1400 may control the transceiver circuit 1250 to receive the second signal of the second frequency band while receiving the first signal of the first frequency band through one of the first to fourth antennas ANT1 to ANT4. In this case, there may be provided an advantage that the baseband processor 1400 can advantageously perform carrier aggregation (CA) through one antenna.

Alternatively, the baseband processor 1400 may control the transceiver circuit 1250 to receive the second signal of the second frequency band through one of the third antenna ANT3 and the fourth antenna ANT4 while receiving the first signal of the first frequency band through one of the first antenna ANT1 and the second antenna ANT2. In this case, there may be provided an advantage that each antenna can be designed to optimally operate in a corresponding band.

Therefore, the baseband processor 1400 can perform carrier aggregation (CA) through a combination of the first frequency band and the second frequency band. When it is necessary to receive a large amount of data for autonomous driving or the like, reception in a broad band can be allowed through the CA.

Accordingly, eMBB (Enhanced Mobile Broad Band) communication can be performed in the vehicle and the vehicle can operate as an eMBB UE. To this end, the base station that performs scheduling may allocate a broadband frequency resource to the vehicle that operates as the eMBB UE. To this end, the CA may be performed on frequency bands that are available, except for frequency resources already allocated to other UEs.

Regard the frequency band, the low band (LB), the mid band (MB), and the high band (HB) may be referred to as the first band, the second band, and the third band, respectively. The antenna system 1000 may operate as a single antenna in the first band, the second band, and the third band corresponding to the low band (LB), the middle band (MB), and the high band (HB). In this regard, the processor 1400 may determine a resource region allocated through a physical downlink control channel (PDCCH). The processor 1400 may control the transceiver circuit 1250 to perform carrier aggregation in two or more of the first to third bands based on the allocated resource region.

The processor 1400 may perform MIMO in an EN-DC state through the first to fourth antennas ANT1 to ANT4. For example, the processor 1400 may perform an EN-DC operation through the first antenna ANT1 and the second antenna ANT2, and MIMO through the third antenna ANT3 and the fourth antenna ANT4.

In this regard, when the EN-DC operation is performed between a 4G/5G communication system and a WiFi communication system using different bands, the processor 1400 may perform the EN-DC operation through a plurality of antennas in one antenna system. Accordingly, an interference level between MIMO streams using the same band can be reduced. On the other hand, when the EN-DC operation is performed between the 4G and 5G communication systems using the same band, the processor 1400 may perform the EN-DC operation through a plurality of antennas in different antenna systems. In this case, in order to reduce the interference level in the low band (LB), the MIMO operation through the plurality of antennas in the same antenna system may be performed in the mid band (MB) or higher.

It will be clearly understood by those skilled in the art that various modifications and alternations for the aforementioned implementations related to the antenna system having the plurality of antennas, the vehicle having the antenna system, and the control operations thereof are made without departing from the idea and scope of the present disclosure. Therefore, it should be understood that such various modifications and alternations for the implementations fall within the scope of the appended claims.

So far, an antenna module having a broadband antenna element mounted on a vehicle and a vehicle including the antenna module according to the present disclosure have been described. The technical effects of such antenna module having the broadband antenna element mounted on the vehicle and the vehicle equipped with the antenna module will be described as follows.

According to the present disclosure, a broadband antenna structure having a plurality of radiator structures in top, side, and bottom regions can be provided which is mounted on a vehicle and can operate as a broadband antenna. According to the present disclosure, a broadband antenna structure having helical lines disposed in a vehicle can be proposed to provide a broadband V2X communication service in the vehicle.

According to the present disclosure, an antenna module for a vehicle can be provided, which supports NR V2X supporting n38 and n47 having a high data transmission rate with a wide bandwidth in 3GPP Release 16. According to the present disclosure, an antenna module for a vehicle can be provided that supports NR V2X with a frequency coverage up to a 7 GHz band that can be considered in 3GPP Release 17.

According to the present disclosure, an antenna structure for a vehicle can be provided, in which a ground pattern is disposed in a bottom region of an antenna pattern to implement a low elevation beam pattern. According to the present disclosure, a broadband antenna element can be provided that has a high antenna gain while operating as a broadband antenna, by implementing antenna elements on a PCB and a separate antenna substrate, which is capable of optimizing antenna performance.

According to the present disclosure, a low elevation beam pattern can be maintained while securing a certain level of antenna performance even in the case where the exterior of a vehicle body or roof is made of a metallic material. According to the present disclosure, a diversity operation can be implemented and simultaneously isolation between antennas can be improved through broadband V2X antennas for a vehicle for suppressing accidents, improving driving convenience, and improving fuel efficiency. According to the present disclosure, a structure for mounting an antenna system capable of operating in a wide band on a vehicle to support various communication systems can be provided.

Further scope of applicability of the present disclosure will become apparent from the foregoing detailed description. It should be understood, however, that the detailed description and specific examples, such as the preferred embodiment of the present disclosure, are given by way of illustration only, since various modifications and alternations within the spirit and scope of the disclosure will be apparent to those skilled in the art.

In relation to the foregoing description, the antenna module mounted on the vehicle and the operation of controlling the same may be implemented by software, firmware, or a combination thereof. Meanwhile, the design of the antenna system mounted in the vehicle and the configuration of controlling the antenna system can be implemented as computer-readable codes in a program-recorded medium. The computer-readable medium may include all types of recording devices each storing data readable by a computer system. Examples of such computer-readable media may include hard disk drive (HDD), solid status disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may also include a controller of a terminal or vehicle, namely, a processor. Therefore, the detailed description should not be limitedly construed in all of the aspects, and should be understood to be illustrative. The scope of the invention should be determined by reasonable interpretation of the appended claims and all changes that come within the equivalent scope of the invention are included in the scope of the invention.

The invention claimed is:

1. An antenna module for mounting on a vehicle, the antenna module comprising:

a first radiator structure including a top conductive pattern and first and second side conductive patterns extending from both end portions of the top conductive pattern;

a second radiator structure connected to the top conductive pattern, including a plurality of connected conductive patterns and forming a helical structure having first to fourth side surfaces, and operating in a second frequency band and a third frequency band that are higher than a first frequency band; and a third radiator structure including a conductive pattern spaced from the second radiator structure with a dielectric substrate disposed between the second radiator structure and the third radiator structure and operating in a fourth frequency band higher than the third frequency band; and a feeder including a first feed line feeding a first signal to the first and second radiator structures, and including a second feed line feeding a second signal to the third radiator structure, wherein in the first frequency band, the first radiator structure generates a first electric field distribution from the top conductive pattern and the first and second side conductive patterns, and the second radiator structure generates a second electric field distribution from the connected conductive patterns of the helical structure formed on the second side surface of the second radiator structure to generate the first frequency band, wherein in the second frequency band, the second radiator structure generates third electric field distributions of the connected conductive patterns of the helical structure formed on the first side surface and the third side surface of the second radiator structure to generate the second frequency band, and wherein the plurality of connected conductive patterns of the second radiator structure comprise:

a first conductive pattern on the second side surface and connected to the top conductive pattern and forming an upper branch;

a second conductive pattern connected to the first conductive pattern and having a bent portion on the second side surface;

a third conductive pattern connected to the second conductive pattern;

a fourth conductive pattern on the second side surface and connected to the third conductive pattern, and having a bent portion disposed on the dielectric substrate and forming a lower branch; and a fifth conductive pattern extending from one side of the fourth conductive pattern on the second side surface and bent onto the first side surface.

2. The antenna module of claim 1, wherein a portion of the second conductive pattern, a portion of the third conductive pattern, and a portion of the fifth conductive pattern are disposed on the first side surface.

3. The antenna module of claim 2, wherein a gap between a bottom of the third conductive pattern and a top of the fifth conductive pattern disposed on the first side surface is set to 1.0 mm or less, such that the second radiator structure operates in the second frequency band.

4. The antenna module of claim 2, wherein a bottom of the third conductive pattern and a top of the fifth conductive pattern disposed on the first side surface form an interdigital structure including a complementary concave and convex structure, such that the second radiator structure operates in the second frequency band.

5. The antenna module of claim 4, wherein a bottom of the second conductive pattern and a top of the fifth conductive pattern disposed on the second side surface adjacent to the first side surface form the interdigital structure, such that the second radiator structure operates in the second frequency band.

6. The antenna module of claim 2, wherein a first sub-pattern of the first conductive pattern and a second sub-pattern of the fourth conductive pattern form the upper branch and the lower branch, respectively, on the second side surface adjacent to the first side surface, wherein a second sub-pattern of the first conductive pattern, a second sub-pattern of the second conductive pattern, and a first sub-pattern of the fourth conductive pattern are disposed in parallel on the second side surface, and wherein a third sub-pattern of the second conductive pattern and a first sub-pattern of the fifth conductive pattern are disposed in parallel in an interdigital structure in which a concave structure and a convex structure are complementarily disposed on the second side surface.

7. The antenna module of claim 1, wherein the first frequency band is a 760 MHz band, the second frequency band is a 2.6 GHz band, which is an n38 band, the third frequency band is a 5.9 GHz band, which is an n47 band, and the fourth frequency band is a 7 GHz band, wherein the first radiator structure to the third radiator structure operates as a first antenna for V2X communication, and wherein the first antenna receives and transmits signals of the first to fourth frequency bands.

8. The antenna module of claim 7, wherein the first radiator structure to the third radiator structure further operates as a second antenna for the V2X communication, and wherein the first antenna is disposed on a top region of one side of a PCB mounted on the vehicle, and the second antenna is disposed on a bottom region of another side of the PCB.

9. The antenna module of claim 8, wherein the first antenna and the second antenna form low elevation beam patterns at a certain angle in a vertical direction relative to a horizontal plane in the first to fourth frequency bands, and wherein the first antenna and the second antenna form omni-directional beam patterns in a horizontal direction when both the first antenna and the second antenna operate.

10. A vehicle comprising:

the antenna module of claim 1 disposed on a bottom of a roof of the vehicle; and a processor communicating with at least one of an adjacent vehicle, a road side unit (RSU) and a base station.

* * * * *